United States Patent
Yuan et al.

(10) Patent No.: US 11,742,865 B2
(45) Date of Patent: Aug. 29, 2023

(54) METHODS AND APPARATUS OF CHARGE-SHARING LOCKING WITH DIGITAL CONTROLLED OSCILLATORS

(71) Applicant: TAIWAN SEMICONDUCTOR MANUFACTURING COMPANY, LTD., Hsinchu (TW)

(72) Inventors: Min-Shueh Yuan, Hsinchu (TW); Chao-Chieh Li, Hsinchu (TW); Chia-Chun Liao, Hsinchu (TW); Yu-Tso Lin, Hsinchu (TW); Wen-Yuan Tsai, Hsinchu (TW); Chih-Hsien Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/589,678

(22) Filed: Jan. 31, 2022

(65) Prior Publication Data
US 2023/0052899 A1 Feb. 16, 2023

Related U.S. Application Data

(60) Provisional application No. 63/232,484, filed on Aug. 12, 2021, provisional application No. 63/252,324, filed on Oct. 5, 2021.

(51) Int. Cl.
*H03K 3/03* (2006.01)
*H03L 7/099* (2006.01)
(Continued)

(52) U.S. Cl.
CPC ....... *H03L 7/0991* (2013.01); *H03H 17/0294* (2013.01); *H03K 3/0322* (2013.01); *H03L 7/0995* (2013.01); *H03L 7/107* (2013.01)

(58) Field of Classification Search
CPC .. H03K 3/0315; H03K 3/0322; H03L 7/0991; H03L 7/0995
(Continued)

(56) References Cited

U.S. PATENT DOCUMENTS 6,452,430 B1 * 9/2002 Tung ............... H03L 7/0995
327/158
7,132,903 B1 * 11/2006 Johnson ............ H03K 5/133
327/272
(Continued)

FOREIGN PATENT DOCUMENTS

CN 103166631 6/2013
CN 111183587 5/2020
(Continued)

*Primary Examiner* — Levi Gannon
(74) *Attorney, Agent, or Firm* — Hauptman Ham, LLP

(57) ABSTRACT

An integrated circuit device includes a digitally controlled oscillator (DCO), two charge-sharing capacitors, two charge-sharing switches, two pre-charge switches, and two DACs. The DCO has a first inverter and a second inverter. A first charge-sharing capacitor has a first terminal coupled to an input terminal of the first inverter through a first charge-sharing switch. A first DAC has an output terminal coupled to the first terminal of the first charge-sharing capacitor through a first pre-charge switch. A second charge-sharing capacitor has a first terminal coupled to an input terminal or an output terminal of the second inverter through a second charge-sharing switch. A second DAC has an output terminal coupled to the first terminal of the second charge-sharing capacitor through a second pre-charge switch.

20 Claims, 46 Drawing Sheets

(51) Int. Cl.
*H03H 17/02* (2006.01)
*H03L 7/107* (2006.01)

(58) Field of Classification Search
USPC .......................................................... 331/57
See application file for complete search history.

(56) References Cited

U.S. PATENT DOCUMENTS

| 9,401,699 | B2 | 7/2016 | Katyal |
| 9,742,419 | B2 | 8/2017 | Okamoto et al. |
| 2020/0028515 | A1* | 1/2020 | Nagam ................... H03L 7/091 |

FOREIGN PATENT DOCUMENTS

| CN | 113055001 | 6/2021 |
| TW | I448083 | 8/2014 |

* cited by examiner

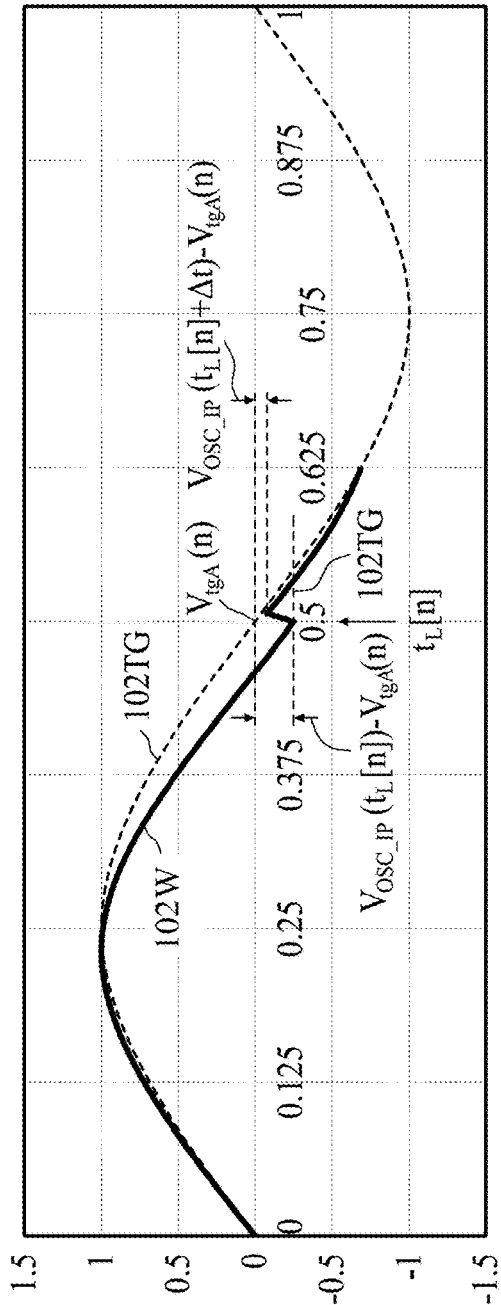
FIG. 1D1
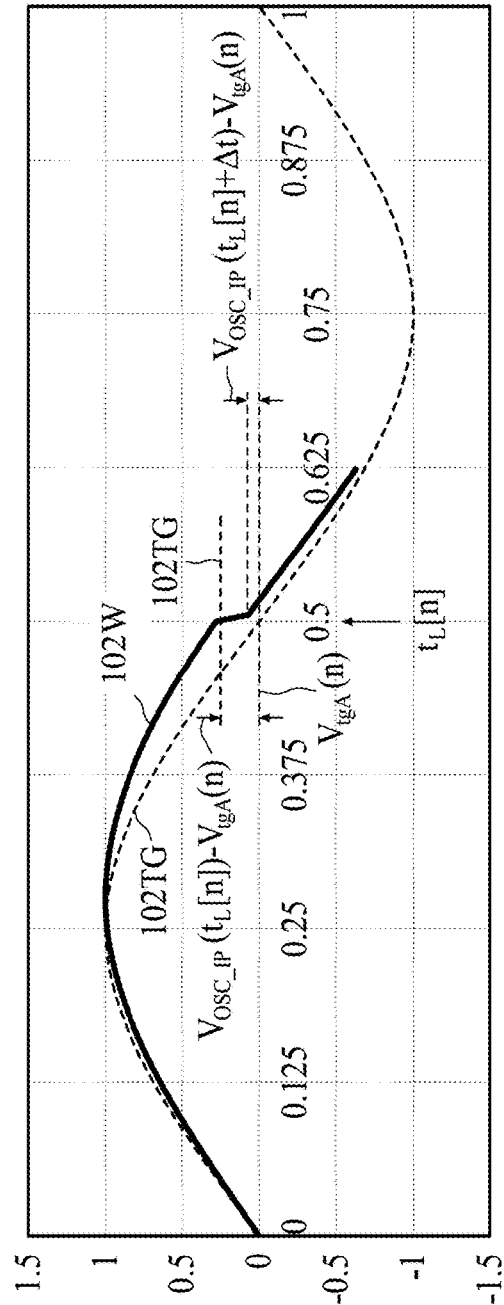
FIG. 1D2

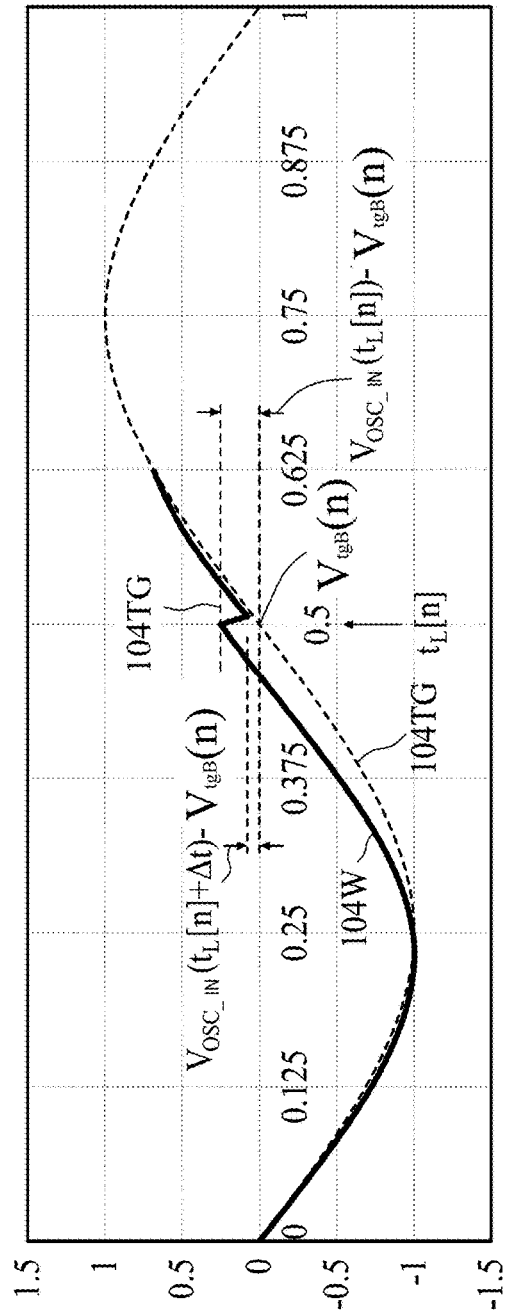
FIG. 1E1
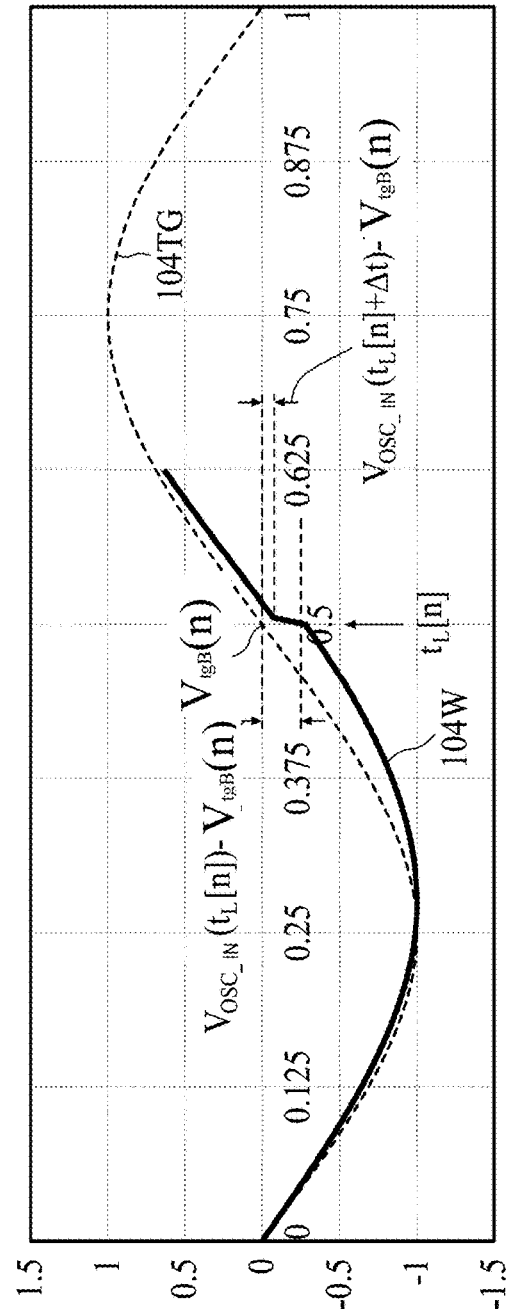
FIG. 1E2

METHODS AND APPARATUS OF CHARGE-SHARING LOCKING WITH DIGITAL CONTROLLED OSCILLATORS

PRIORITY CLAIM AND CROSS-REFERENCE

The present application claims the priority of U.S. Provisional Application No. 63/252,324, filed Oct. 5, 2021, and U.S. Provisional Application No. 63/232,484, filed Aug. 12, 2021, the disclosures of which are incorporated herein by reference in their entireties.

BACKGROUND

Phase locked loops (PLL) are commonly used in circuits that generate a high-frequency signal with a frequency being a multiple of the frequency of a reference signal. PLLs are found in applications where the phase of the output signal tracks the phase of the reference signal. A frequency signal that is synthesized with a PLL based on a stable, low-noise and often temperature-compensated reference signal has a variety of applications. For example, PLLs are used in frequency synthesizers for radio receivers or transmitters. PLLs are also used for clock recovery applications in digital communication systems or disk-drive read-channels.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1D1-1D2 are example waveforms of the voltage signal $V_{osc\_IP}$ at the connection node corrected at the CS locking point $V_{osc\_IP}[n]$ in FIG. 1D by the charge-sharing correction.

FIGS. 1E1-1E2 are example waveforms of the voltage signal $V_{osc\_IN}$ of the connection node corrected at the CS locking point $V_{osc\_IN}[n]$ in FIG. 1E by the charge-sharing correction.

DETAILED DESCRIPTION

Figure 1A:
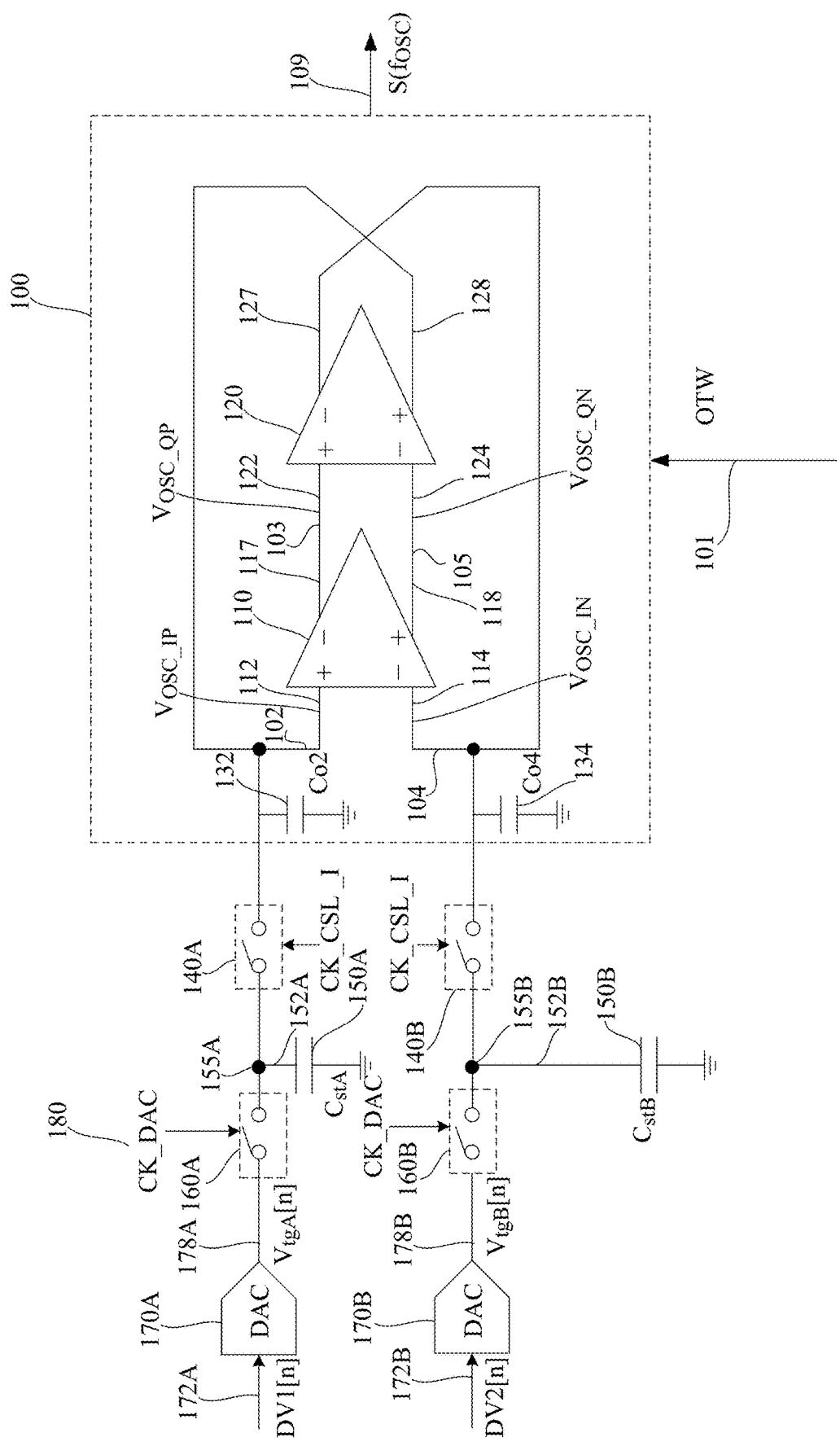
FIG. 1A is a schematic diagram of a ring based digitally controlled oscillator (DCO) coupled with a charge-sharing circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a ring based digitally controlled oscillator (DCO) is coupled to a charge-sharing circuit that includes a charge-sharing capacitor, a charge-sharing switch, and a pre-charge switch, and a digital to analog converter (DAC). The ring based DCO includes at least two inverters. The input terminal of an inverter in the ring based DCO is selected as a connection node for a charge-sharing correction. The connection node in the ring based DCO is connected to a first terminal of the charge-sharing capacitor through the charge-sharing switch in the charge-sharing circuit. The first terminal of the charge-sharing capacitor is also coupled to an output terminal of the DAC through the pre-charge switch. During operation, the charge on the charge-sharing capacitor is shared with the charge on the node-to-ground capacitor of the connection node at each time selected for the charge-sharing process, whereby phase jitters of an oscillating signal in the DCO are reduced.

In some embodiments, a phase locked loop (PLL) is implemented with a DCO coupled to a charge-sharing circuit, and a method of operating the DCO in the phase locked loop includes changing the closed loop transfer function of the PLL. The PLL starts to operate with a first closed loop transfer function (e.g., as a type-II PLL) before the phase of an oscillating signal in the DCO is subject to the charge-sharing correction, but the PLL is operating with a second closed loop transfer function (e.g., as a type-I PLL) when the phase of an oscillating signal in the DCO is undergoing the charge-sharing correction. In some embodiments, due to the changing of the closed loop transfer function, the phase errors of the output oscillating signal from the DCO are further reduced by the charge-sharing circuit, after the frequency errors and the phase errors from the output oscillating signal are reduced by the PLL without the charge-sharing correction.

FIG. 1A is a schematic diagram of a ring based digitally controlled oscillator (DCO) 100 coupled with a charge-sharing circuit 180, in accordance with some embodiments. In FIG. 1A, the DCO 100 includes inverters 110 and 120 coupled with each other. Each of the inverters 110 and 120 is a differential inverter. The differential input of the inverter 110 is coupled to the differential output of the inverter 120, while the differential input of the inverter 120 is coupled to the differential output of the inverter 110. Specifically, the non-inverting input 112 of the inverter 110 is connected to the non-inverting output 128 of the inverter 120, and the inverting input 114 of the inverter 110 is connected to the inverting output 127 of the inverter 120. The inverting output 117 of the inverter 110 is connected to the non-inverting input 122 of the inverter 120. The non-inverting output 118 of the inverter 110 is connected to the inverting input 124 of the inverter 120. In the DCO 100 of FIG. 1A, the connection node 102 is modeled for the charge-sharing process with a node-to-ground capacitor 132, while the connection node 104 is modeled for the charge-sharing process with a node-to-ground capacitor 134.

At the oscillation condition, the DCO 100 has a phase shift of 2π and a unity gain at the oscillation frequency traced along one complete loop. In some embodiments, each of the inverters 110 and 120 has a same time delay. When the DCO 100 has an oscillation frequency $f_{osc}$, the time delay induced by each of the inverters 110 and 120 is $1/(4f_{osc})$, which corresponds to a phase shift of $\pi/2$ for each of the inverters 110 and 120.

Figure 4:
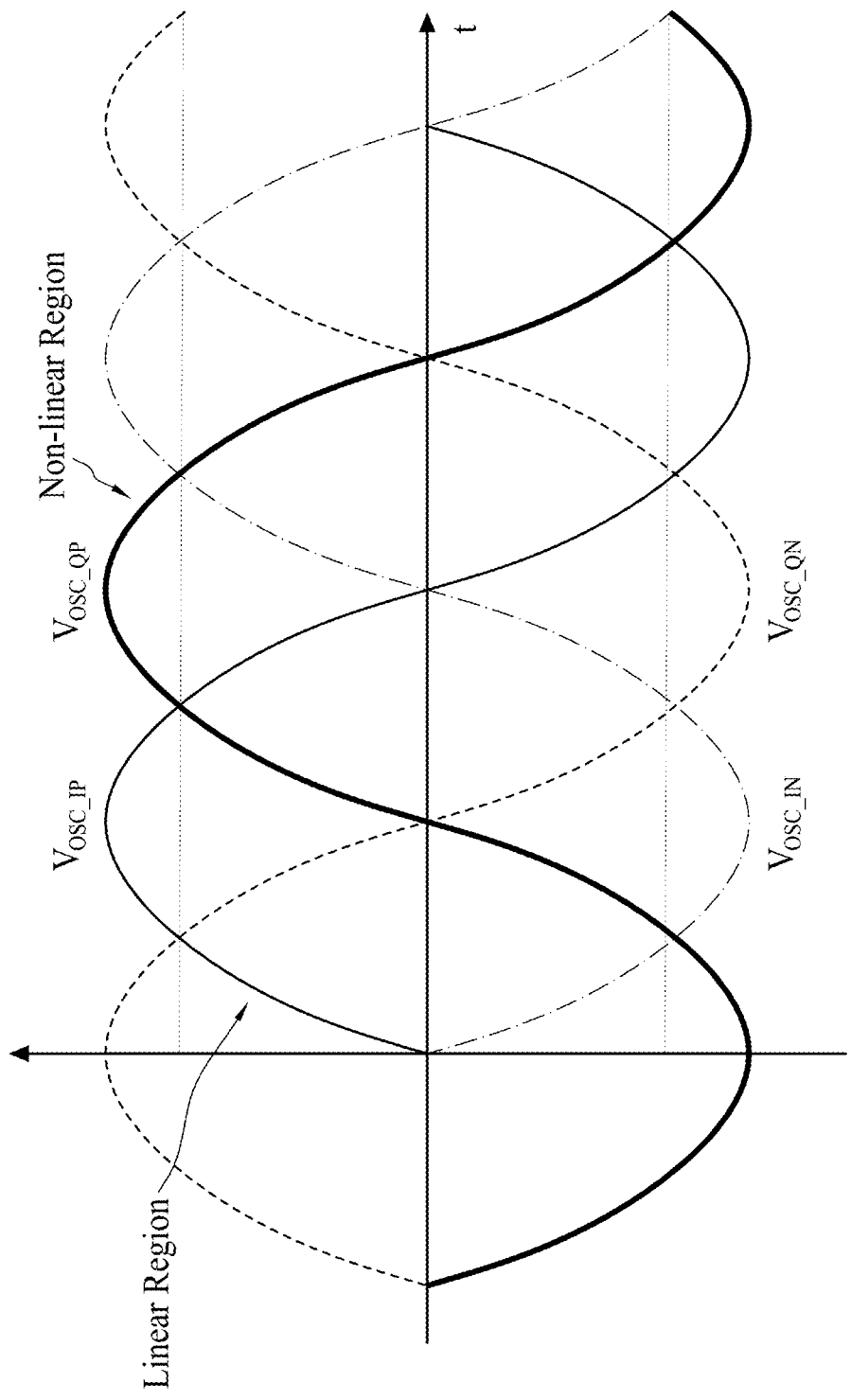
FIG. 4 are waveforms of the oscillating voltage signals at various connection nodes of the DCO, in accordance with some embodiments.

FIG. 4 are waveforms of the oscillating voltage signals at various connection nodes of the DCO 100, in accordance with some embodiments. The voltage signals $V_{osc\_IP}$, $V_{osc\_QP}$, $V_{osc\_IN}$, and $V_{osc\_QN}$ in FIG. 4 are correspondingly the voltage signals at the connection nodes 102, 103, 104, and 105. In some embodiments, each of the connection nodes 102, 103, 104, and 105 is a circuit node interpreted within the context of a netlist in a SPICE file. Each of the voltage signals $V_{osc\_IP}$, $V_{osc\_QP}$, $V_{osc\_IN}$, and $V_{osc\_QN}$ is a sinusoidal wave. The voltage signal $V_{osc\_QP}$ at the connection node 103 is delayed from the voltage signal $V_{osc\_IP}$ at the connection node 102 by a phase shift of $\pi/2$. The voltage signal $V_{osc\_IN}$ at the connection node 104 is delayed from the voltage signal $V_{osc\_QP}$ at the connection node 103 by a phase shift of π/2. The voltage signal $V_{osc\_QN}$ at the connection node 105 is delayed from the voltage signal $V_{osc\_IN}$ at the connection node 104 by a phase shift of π/2. The connection nodes 102 and 104 in the DCO 100 are in-phase nodes, while the connection nodes 103 and 105 in the DCO 100 are quadrature nodes.

In some embodiments, one of the voltage signals $V_{osc\_IP}$, $V_{osc\_QP}$, $V_{osc\_IN}$, and $V_{osc\_QN}$ is selected as the output oscillating signal $S(f_{osc})$ at the output terminal 109 of the DCO 100. In some embodiments, the output oscillating signal $S(f_{osc})$ has a predetermined phase shift relative to each one of the voltage signals $V_{osc\_IP}$, $V_{osc\_QP}$, $V_{osc\_IN}$, and $V_{osc\_QN}$.

In some embodiments, as shown in FIG. 1A, the oscillation frequency $f_{osc}$ of the DCO 100 is controlled by the oscillator tuning word OTW at the input terminal 101 of the DCO 100. In some embodiments, the delay time of the inverter 110 and/or the delay time of the inverter 120 are adjusted based on the oscillator tuning word OTW received at the input terminal 101 of the DCO 100. An increase in the delay time of the inverter 110 and/or the delay time of the inverter 120 corresponds to a decrease in the oscillation frequency $f_{osc}$. Conversely, a decrease in the delay time of the inverter 110 and/or the delay time of the inverter 120 corresponds to an increase in the oscillation frequency $f_{osc}$. In some embodiments, the delay time of the inverter 110 is the same as the delay time of the inverter 120 for any oscillator tuning word OTW received at the input terminal 101. Consequently, the voltage signal $V_{osc\_IP}$ at the connection node 102 and the voltage signal $V_{osc\_IN}$ at the connection node 104 are maintained as in-phase signals, while the voltage signal $V_{osc\_QP}$ at the connection node 103 and the voltage signal $V_{osc\_QN}$ at the connection node 105 are maintained as quadrature signals. In addition, the voltage signal $V_{osc\_IP}$ at the connection node 102 and the voltage signal $V_{osc\_IN}$ at the connection node 104 are opposite in polarity, and the voltage signal $V_{osc\_QP}$ at the connection node 103 and the voltage signal $V_{osc\_QN}$ at the connection node 105 are opposite in polarity.

In FIG. 1A, the charge-sharing circuit 180 includes a charge-sharing switch 140A, a charge-sharing capacitor 150A, a pre-charge switch 160A, and a digital to analog converter 170A (i.e., a DAC 170A). In FIG. 1A, a charge-sharing node 155A include the connections to the charge-sharing switch 140A, the charge-sharing capacitor 150A, and the pre-charge switch 160A. In some embodiments the charge-sharing node 155A is a circuit node interpreted within the context of a netlist in a SPICE file. A first terminal of the charge-sharing capacitor 150A is connected to the charge-sharing node 155A and a second terminal of the charge-sharing capacitor 150A is connected to the ground. The first terminal 152A of the charge-sharing capacitor 150A is connected to the connection node 102 through the charge-sharing switch 140A. The connection state of the charge-sharing switch 140A is controlled by an in-phase CSL control signal CK_CSL_I. An output terminal 178A of the DAC 170A is connected to the first terminal 152A of the charge-sharing capacitor 150A through the pre-charge switch 160A. The connection state of the pre-charge switch 160A is controlled by a DAC control signal CK_DAC. The DAC 170A has an input terminal 172A that is configured to receive a voltage digital word DV1[n]. In some embodiments, the analog voltage generated by the DAC 170A from the voltage digital word DV1[n] is a target voltage $V_{tgA}[n]$.

In FIG. 1A, the charge-sharing circuit 180 includes a charge-sharing switch 140B, a charge-sharing capacitor 150B, a pre-charge switch 160B, and a digital to analog converter such as a DAC 170B. In FIG. 1A, a charge-sharing node 155B include the connections to the charge-sharing switch 140B, the charge-sharing capacitor 150B, and the pre-charge switch 160B. In some embodiments the charge-sharing node 155B is a circuit node interpreted within the context of a netlist in a SPICE file. A first terminal of the charge-sharing capacitor 150B is connected to the charge-sharing node 155B and a second terminal of the charge-sharing capacitor 150B is connected to the ground. The first terminal 152B of the charge-sharing capacitor 150B is connected to the connection node 104 through the charge-sharing switch 140B. The connection state of the charge-sharing switch 140B is controlled by an in-phase CSL control signal CK_CSL_I. An output terminal 178B of the DAC 170B is connected to the first terminal 152B of the charge-sharing capacitor 150B through the pre-charge switch 160B. The connection state of the pre-charge switch 160B is controlled by a DAC control signal CK_DAC. The DAC 170B has an input terminal 172B that is configured to receive a voltage digital word DV2[n]. In some embodiments, the analog voltage generated by the DAC 170B from the voltage digital word DV2[n] is a target voltage $V_{tgB}[n]$.

Figure 1B:
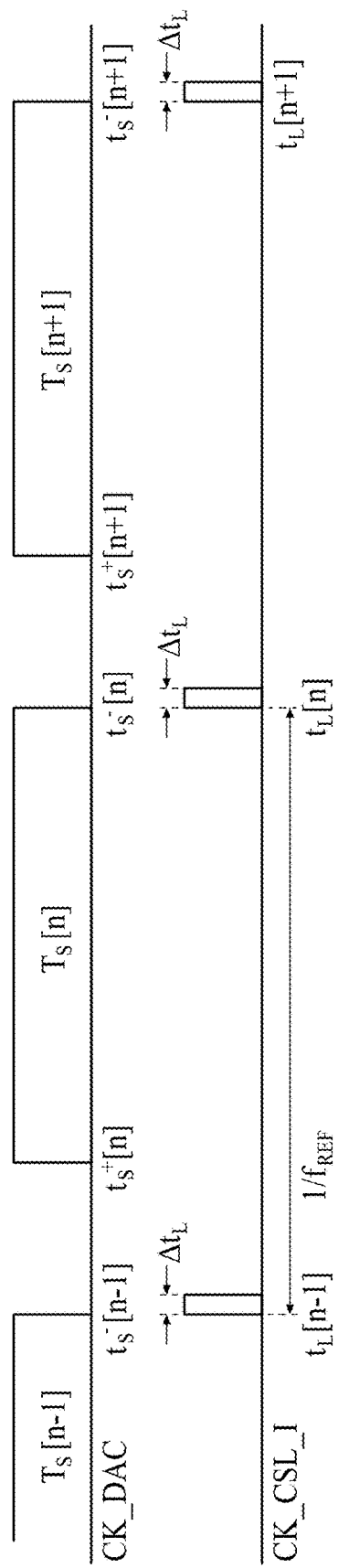
FIG. 1B are waveforms of the DAC control signal CK_DAC and the in-phase CSL control signal CK_CSL_I, in accordance with some embodiments.

FIG. 1B are waveforms of the DAC control signal CK_DAC and the in-phase CSL control signal CK_CSL_I, in accordance with some embodiments. The DAC control signal CK_DAC changes from the logic HIGH to the logic LOW at time $t_s^-[n-1]$, time $t_s^-[n]$, and time $t_s^-[n+1]$. The DAC control signal CK_DAC changes from the logic LOW to the logic HIGH at time $t_s^+[n]$ and time $t_s^+[n+1]$. The DAC control signal CK_DAC stays at the logic HIGH during the pre-charge time periods $T_s[n-1]$, $T_s[n]$, and $T_s[n+1]$. The rising edge $t_s^+[n-1]$ of the pre-charge time period $T_s[n-1]$ is not shown in the figure. The in-phase CSL control signal CK_CSL_I changes from the logic LOW to the logic HIGH at each Charge-Share Locking time ("CSL time"). For example, the in-phase CSL control signal CK_CSL_I changes from the logic LOW to the logic HIGH at the CSL time $t_L[n-1]$, the CSL time $t_L[n]$, and the CSL time $t_L[n+1]$. The in-phase CSL control signal CK_CSL_I remains at the logic HIGH for a time duration $\Delta t_L$ after each CSL time.

In operation, as shown in FIG. 1A and FIG. 1B, during the pre-charge time period (e.g., $T_s[n]$), the DAC control signal CK_DAC is at the logic HIGH, which drives each of the pre-charge switches 160A and 160B into the connected state, and the in-phase CSL control signal CK_CSL_I is at the logic LOW, which drives each of the charge-sharing switches 140A and 140B into the disconnected state. During the pre-charge time period (e.g., $T_s[n]$), the first terminal 152A of the charge-sharing capacitor 150A is electrically isolated from the connection node 102 of the DCO 100, while the first terminal 152A of the charge-sharing capacitor 150A is conductively connected to the output terminal 178A of the DAC 170A. Also during the pre-charge time period (e.g., $T_s[n]$), the first terminal 152B of the charge-sharing capacitor 150B is electrically isolated from the connection nodes 104 of the DCO 100, while the first terminal 152B of the charge-sharing capacitor 150B is conductively connected to the output terminal 178B of the DAC 170B. At the end of the pre-charge time period (e.g., $t_s^-[n]$), the charge-sharing capacitor 150A is charged to a voltage level that is equal to the target voltage $V_{tgA}[n]$ at the output terminal 178A of the DAC 170A, and the charge-sharing capacitor 150B is charged to a voltage level that is equal to the target voltage $V_{tgB}[n]$ at the output terminal 178B of the DAC 170B.

Figure 1C:
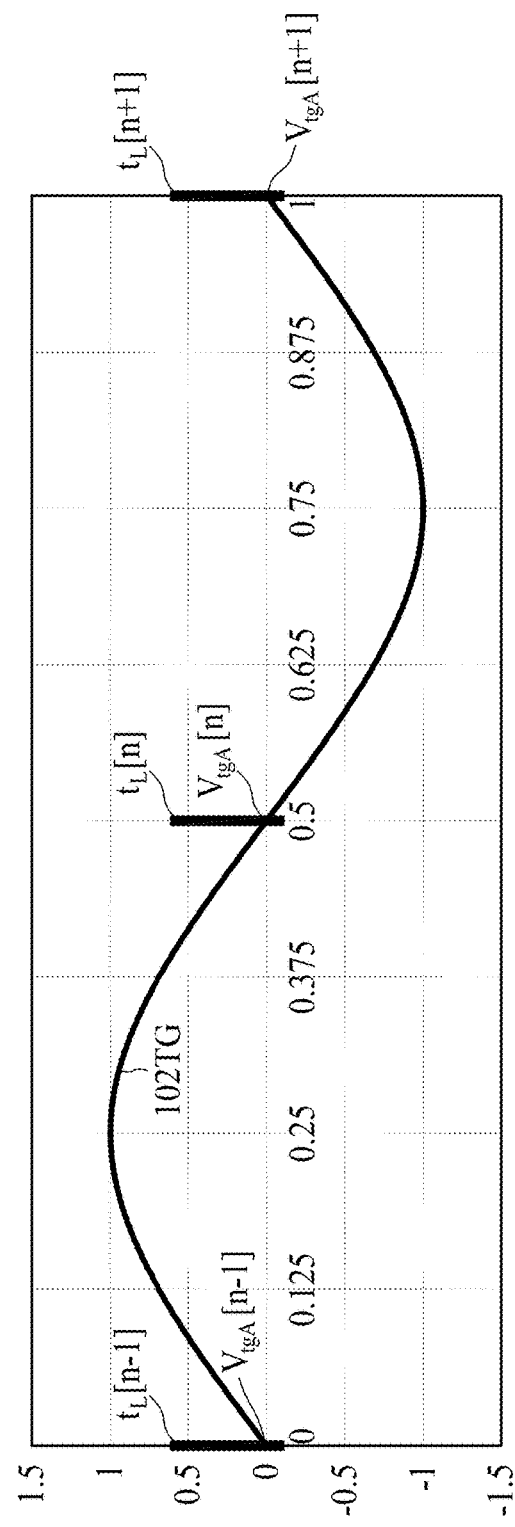
FIG. 1C is an ideal oscillation waveform of the DCO in FIG. 1B, in accordance with some embodiments.

The target voltages $V_{tgA}[n]$ and $V_{tgB}[n]$ are correspondingly generated by the DAC 170A and the DAC 170B from the voltage digital words DV1[n] and DV2[n]. The value of the target voltage $V_{tgA}[n]$ is selected from the ideal oscillation waveform 102TG of the DCO 100 as shown in FIG. 1C. The ideal oscillation waveform 102TG of the DCO 100 in FIG. 1C is a sine wave having a time period $T_0$ that is the inverse of the ideal oscillation frequency $f_{osc}$ of the DCO 100. The horizontal axis in FIG. 1C is the time which is measured in the unit of a time period $T_0$, and the vertical axis in FIG. 1C is the amplitude of the oscillation at the connection node 102 of the DCO 100. The value of each target voltage is sampled on the ideal oscillation waveform 102TG at a CSL time. For example, the values of target voltages $V_{tgA}[n-1]$, $V_{tgA}[n]$, and $V_{tgA}[n+1]$ in FIG. 1C are sampled on the ideal oscillation waveform 102TG correspondingly at the CSL time $t_L[n-1]$, the CSL time $t_L[n]$, and the CSL time $t_L[n+1]$. In some embodiments, for each integer value n, the voltage digital word DV1[n] for generating the target voltage $V_{tgA}[n]$ and the voltage digital word DV2[n] for generating the target voltage $V_{tgB}[n]$ are both created based on a stored digital word from a memory.

In FIG. 1B, after the pre-charge time period (e.g., $T_s[n]$), the in-phase CSL control signal CK_CSL_I changes from the logic LOW to the logic HIGH at the CSL time (e.g., $t_L[n]$). In FIG. 1A and FIG. 1B, during the time duration $\Delta t_L$ after the CSL time (e.g., $t_L[n]$), the DAC control signal CK_DAC is at the logic LOW, which drives each of the pre-charge switches 160A and 160B into the disconnected state, and the in-phase CSL control signal CK_CSL_I is at the logic HIGH which drives each of the charge-sharing switches 140A and 140B into the connected state.

Figure 1D:
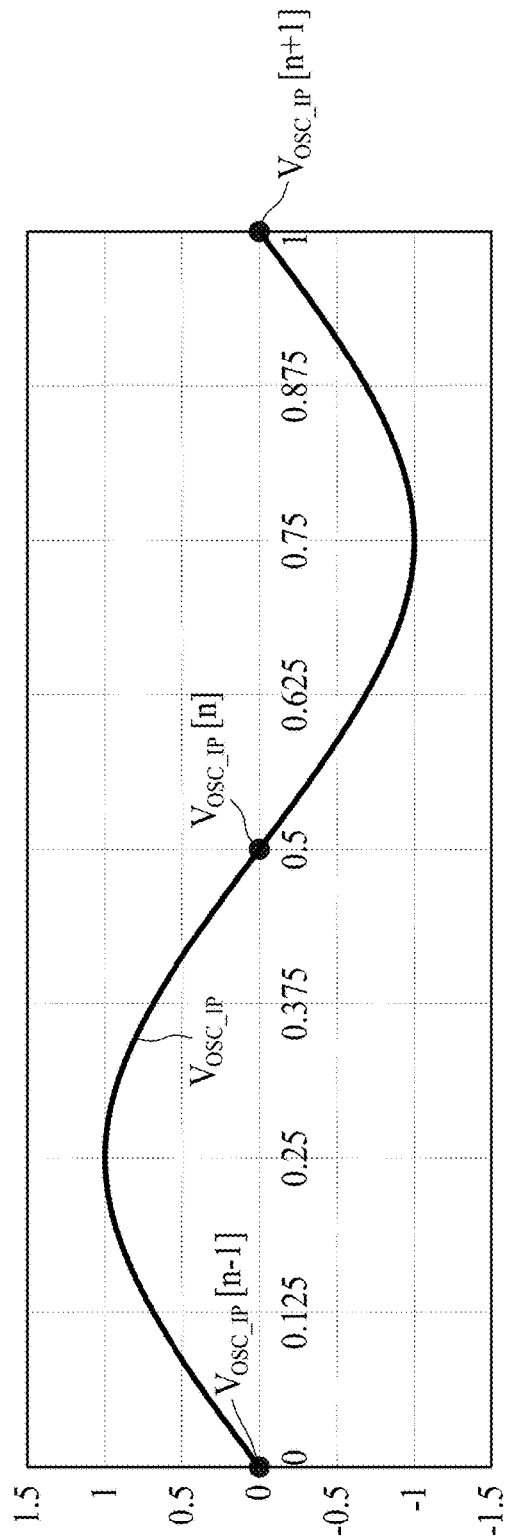
FIG. 1D is a waveform of the voltage signal $V_{osc\_IP}$ at a connection node with CS locking points identified on the waveform, in accordance with some embodiments.

During the time duration $\Delta t_L$ after the CSL time (e.g., $t_L[n]$), the first terminal 152A of the charge-sharing capacitor 150A is electrically isolated from the output terminal 178A of the DAC 170A, while the first terminal 152A of the charge-sharing capacitor 150A is conductively connected to the connection node 102 of the DCO 100. Because of the conductive connection between the charge-sharing node 155A and the connection node 102, the voltage signal $V_{osc\_IP}$ at the connection node 102 is modified towards the target voltage (e.g., $V_{tgA}[n]$) on the charge-sharing node 155A at the CSL time (e.g., $t_L[n]$). At each CSL time, the voltage signal $V_{osc\_IP}$ is correspondingly corrected at a Charge-Sharing locking point (i.e., a CS locking point). FIG. 1D is a waveform of the voltage signal $V_{osc\_IP}$ at the connection node 102 with CS locking points identified on the waveform, in accordance with some embodiments. At each CS locking point, the waveform is corrected based on the voltage on the charge-sharing node 155A. For example, the voltage signal $V_{osc\_IP}$ of the connection node 102 at the CS locking points $V_{osc\_IP}[n-1]$, $V_{osc\_IP}[n]$, and $V_{osc\_IP}[n+1]$ is correspondingly corrected based on the voltages $V_{tgA}[n-1]$, $V_{tgA}[n]$, and $V_{tgA}[n+1]$ at the charge-sharing node 155A (corresponding to the CSL time $t_L[n-1]$, $t_L[n]$, or $t_L[n+1]$).

Figure 1E:
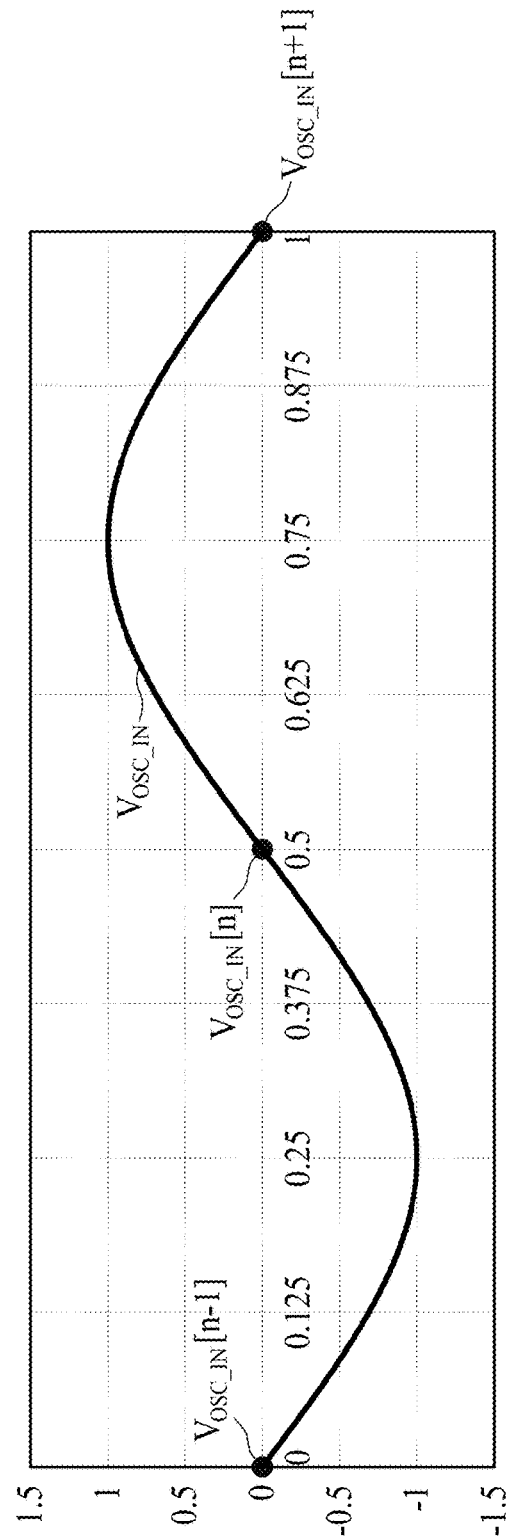
FIG. 1E is a waveform of the voltage signal $V_{osc\_IN}$ at a connection node with CS locking points identified, in accordance with some embodiments.

Also during the time duration $\Delta t_L$ after the CSL time (e.g., $t_L[n]$), the first terminal 152B of the charge-sharing capacitor 150B is electrically isolated from the output terminal 178B of the DAC 170B, while the first terminal 152B of the charge-sharing capacitor 150B is conductively connected to the connection node 104 of the DCO 100. Because of the conductive connection between the charge-sharing node 155B and the connection node 104, the voltage signal $V_{osc\_IN}$ at the connection node 104 is modified towards the voltage (e.g., $V_{tgB}[n]$) on the charge-sharing node 155B at the CSL time (e.g., $t_L[n]$). At each CSL time, the voltage signal $V_{osc\_IN}$ is correspondingly corrected at a CS locking point. FIG. 1E is a waveform of the voltage signal $V_{osc\_IN}$ at the connection node 104 which have CS locking points identified, in accordance with some embodiments. At each CS locking point, the waveform is corrected based on the voltage on the charge-sharing node 155B. For example, the voltage signal $V_{osc\_IN}$ of the connection node 104 at the CS locking points $V_{osc\_IN}[n-1]$, $V_{osc\_IN}[n]$, and $V_{osc\_IN}[n+1]$ is correspondingly corrected based on the voltages $V_{tgB}[n-1]$, $V_{tgB}[n]$, and $V_{tgB}[n+1]$ at the charge-sharing node 155B (corresponding to the CSL time $t_L[n-1]$, $t_L[n]$, or $t_L[n+1]$).

FIGS. 1D1-1D2 are example waveforms of the voltage signal $V_{osc\_IP}$ at the connection node 102 corrected at the CS locking point $V_{osc\_IP}[n]$ in FIG. 1D by the charge-sharing correction. In FIG. 1D1, at the CSL time $t_L[n]$ before the charge-sharing correction, the voltage signal $V_{osc\_IP}$ of the connection node 102 forms the oscillation waveform 102W, which has a phase that is ahead the phase of the ideal oscillation waveform 102TG. At time $t_L[n]+\Delta t$ after the charge-sharing correction, the phase difference between the oscillation waveform 102W and the ideal oscillation waveform 102TG is reduced. Specifically, in FIG. 1A, moment before the connection node 102 is connected to the charge-sharing node 155A through the charge-sharing switch 140A, the voltage signal $V_{osc\_IP}$ at the connection node 102 is $V_{osc\_IP}(t_L[n])$, while the voltage signal $V_{osc\_IP}$ at the charge-sharing node 155A is $V_{tgA}[n]$. During the time period from $t_L[n]$ to $t_L[n]+\Delta t$, the charge on the node-to-ground capacitor 132 of the connection node 102 is shared with the charge on the capacitor 150A through the charge-sharing switch 140A. The node-to-ground capacitor 132 of the connection node 102 has a capacitance value $C_{o2}$, and the capacitor 150A has a capacitance value $C_{stA}$. At time $t_L[n]+\Delta t$ and after the charge-sharing correction, the voltage signal $V_{osc\_IP}$ at the connection node 102 is $V_{osc\_IP}(t_L[n]+\Delta t)$, which is equal to $\{V_{tgA}[n]C_{stA}+V_{osc\_IP}(t_L[n])C_{o2}\}/(C_{o2}+C_{stA})$. The voltage difference $V_{osc\_IP}(t_L[n]+\Delta t)-V_{tgA}[n]$ after the correction is equal to $\{V_{osc\_IP}(t_L[n])-V_{tgA}[n]\}C_{o2}/(C_{o2}+C_{stA})$. That is, after the charge-sharing correction, the initial voltage difference $V_{osc\_IP}(t_L[n])-V_{tgA}[n]$ is reduced by a reduction factor of $C_{o2}/(C_{o2}+C_{stA})$. In most implementations, $C_{stA} \gg C_{o2}$, which makes the reduction factor $C_{o2}/(C_{o2}+C_{stA}) \ll 1$. In one example implementation, $C_{stA}=4C_{o2}$, which corresponds to $C_{o2}/(C_{o2}+C_{stA})=0.2$, and the post-correction voltage difference $V_{osc\_IP}(t_L[n]-\Delta t)-V_{tgA}[n]$ is only 20% of the initial voltage difference $V_{osc\_IP}(t_L[n])-V_{tgA}[n]$. In some implementations, the reduction factor $C_{o2}/(C_{o2}+C_{stA})$ is smaller than 20%, as the value of $C_{stA}/C_{o2}$ becomes larger than 4. In the example waveform of FIG. 1D1, both the initial voltage difference $V_{osc\_IP}(t_L[n])-V_{tgA}[n]$ and the post-correction voltage difference $V_{osc\_IP}(t_L[n]-\Delta t)-V_{tgA}[n]$ are identified in the figure.

In FIG. 1D2, at the CSL time $t_L[n]$ before the charge-sharing correction, the voltage signal $V_{osc\_IP}$ of the connection node 102 forms the oscillation waveform 102W, which has a phase that is behind the phase of the ideal oscillation waveform 102TG. At time $t_L[n]+\Delta t$ after the charge-sharing correction, the phase of the oscillation waveform 102W catches up the phase of the ideal oscillation waveform 102TG. Similar to the charge-sharing process as described with respect to FIG. 1D1, the voltage difference $V_{osc\_IP}(t_L[n]-\Delta t)-V_{tgA}[n]$ after the correction is equal to $\{V_{osc\_IP}(t_L[n])-V_{tgA}[n]\} C_{o2}/(C_{o2}+C_{stA})$. That is, is reduced by a reduction factor of $C_{o2}/(C_{o2}+C_{stA})$. In most implementations, $C_{stA} \gg C_{o2}$, which makes the reduction factor $C_{o2}/$ ($C_{o2}+C_{stA}$)<<1. In the example waveform of FIG. 1D2, both the initial voltage difference $V_{osc\_IP}$ ($t_L[n]$)−$V_{tgA}[n]$ and the post-correction voltage difference $V_{osc\_IP}$ ($t_L[n]$−Δt)−$V_{tgA}[n]$ are identified in the figure.

FIGS. 1E1-1E2 are example waveforms of the voltage signal $V_{osc\_IN}$ of the connection node 104 corrected at the CS locking point $V_{osc\_IN}[n]$ in FIG. 1E by the charge-sharing correction. In FIG. 1E1, at the CSL time $t_L[n]$ before the charge-sharing correction, the voltage signal $V_{osc\_IN}$ of the connection node 104 forms the oscillation waveform 104W, which has a phase that is ahead the phase of the ideal oscillation waveform 104TG. At time $t_L[n]$+Δt after the charge-sharing correction, the phase difference between the oscillation waveform 104W and the ideal oscillation waveform 104TG is reduced. During the time period from $t_L[n]$ to $t_L[n]$−Δt, the charge on the node-to-ground capacitor 134 of the connection node 104 is shared with the charge on the capacitor 150B through the charge-sharing switch 140B. The node-to-ground capacitor 134 of the connection node 104 has a capacitance value $C_{o4}$, and the capacitor 150B has a capacitance value $C_{stB}$. In FIG. 1E1, the voltage level of the ideal oscillation waveform 104TG at the CSL time $t_L[n]$ is $V_{tgB}[n]$=−$V_{tgA}[n]$. The voltage difference $V_{osc\_IN}$ ($t_L[n]$−Δt)−$V_{tgB}[n]$) after the correction is equal to {$V_{osc\_IN}$($t_L[n]$)−$V_{tgB}[n]$} $C_{o2}/(C_{o4}+C_{stB})$ That is, after the charge-sharing correction, the initial voltage difference $V_{osc\_IN}$($t_L[n]$)−$V_{tgB}[n]$) is reduced by a reduction factor of $C_{o4}/(C_{o4}+C_{stB})$. In most implementations, $C_{stB}$>>$C_{o4}$, which makes the reduction factor $C_{o4}/(C_{o4}+C_{stB})$<<1. In the example waveform of FIG. 1E1, both the initial voltage difference $V_{osc\_IN}$ ($t_L[n]$)−$V_{tgB}[n]$ and the post-correction voltage difference $V_{osc\_IN}$ ($t_L[n]$−Δt)−$V_{tgB}[n]$ are identified in the figure.

In FIG. 1E2, at the CSL time $t_L[n]$ before the charge-sharing correction, the voltage signal $V_{osc\_IP}$ of the connection node 104 forms the oscillation waveform 104W, which has a phase that is behind the phase of the ideal oscillation waveform 104TG. At time $t_L[n]$+Δt after the charge-sharing correction, the phase of the oscillation waveform 104W catches up the phase of the ideal oscillation waveform 104TG. Similar to the charge-sharing correction process as described with respect to FIG. 1E1, the voltage difference $V_{osc\_IN}$ ($t_L[n]$−Δt)−$V_{tgB}[n]$ after the correction is equal to {$V_{osc\_IN}$ ($t_L[n]$)−$V_{tgB}[n]$}$C_{o4}/(C_{o4}+C_{stB})$. That is, after the charge-sharing correction, the initial voltage difference $V_{osc\_IN}$ ($t_L[n]$)−$V_{tgB}[n]$ is reduced by a reduction factor of $C_{o4}/(C_{o4}+C_{stB})$ In most implementations, $C_{stB}$>>$C_{o4}$, which makes the reduction factor $C_{o4}/(C_{o4}+C_{stB})$<<1. In the example waveform of FIG. 1E2, both the initial voltage difference $V_{osc\_IN}$ ($t_L[n]$)−$V_{tgB}[n]$ and the post-correction voltage difference $V_{osc\_IN}$ ($t_L[n]$−Δt)−$V_{tgB}[n]$ are identified in the figure.

In the example waveforms of FIGS. 1D1-1D2 and FIGS. 1E1-1E2, the phase of each oscillation waveform is corrected at the CS locking point $V_{osc\_IN}[n]$. Because of the charge-sharing process, after an oscillation waveform is corrected at a CS locking point, the phase of the oscillation waveform becomes more closely matched with the phase of an ideal oscillation waveform. If the phase of the oscillation waveform is ahead of the phase of an ideal oscillation waveform, the phase of the oscillation waveform gets reduced at the CS locking point. If the phase of the oscillation waveform is behind of the phase of an ideal oscillation waveform, the phase of the oscillation waveform gets increased at the CS locking point. In the example waveforms of FIGS. 1D1-1D2, the phase correction at the CS locking point happens at a falling slope of the oscillation waveform.

In the example waveforms of FIGS. 1E1-1E2, the phase correction at the CS locking point happens at a rising slope of the oscillation waveform.

In the example embodiments of FIG. 1A, the oscillation waveforms at two in-phase nodes (such as the connection nodes 102 and 104) are corrected at various CS locking points, and the oscillation waveforms at the connection node 102 is the inverse of the oscillation waveforms at the connection node 104. In some alternative embodiments, the oscillation waveforms at one in-phase node and one quadrature node (such as the connection nodes 102 and 103 in FIG. 2A) are corrected at various CS locking points.

Figure 2A:
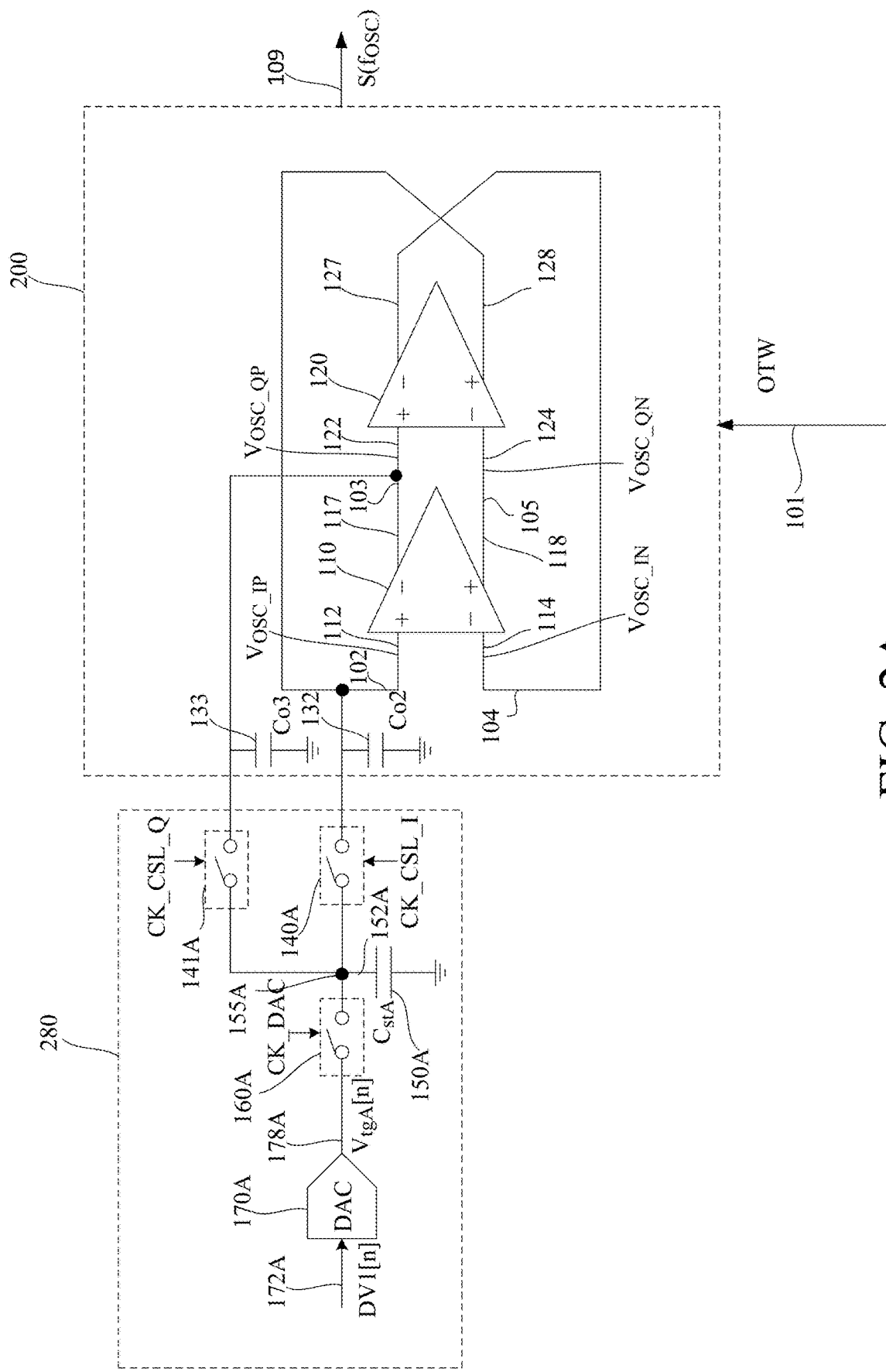
FIG. 2A is a schematic diagram of a ring based digitally controlled oscillator (DCO) coupled with a charge-sharing circuit, in accordance with some embodiments.

FIG. 2A is a schematic diagram of a ring based digitally controlled oscillator (DCO) 200 coupled with a charge-sharing circuit 280, in accordance with some embodiments. The DCO 200 in FIG. 2A has the same circuit structure as the DCO 100 in FIG. 1A, except for the difference in the modeling of the connection nodes by the node-to-ground capacitors. In the DCO 100 of FIG. 1A, the connection nodes 102 and 104 are modeled for the charge-sharing process correspondingly with the node-to-ground capacitors 132 and 134, while the node-to-ground capacitors associated with other connection nodes (such as the connection nodes 103 and 105) are not explicitly shown in the figure. In contrast, the connection nodes 102 and 103 in the DCO 200 of FIG. 2A are modeled for the charge-sharing process correspondingly with the node-to-ground capacitors 132 and 133, while the node-to-ground capacitors associated with other connection nodes (such as the connection nodes 104 and 105) are not explicitly shown in the figure. In the DCO 200 of FIG. 2A, the node-to-ground capacitor 132 has a capacitance value $C_{o2}$ and the node-to-ground capacitor 133 has a capacitance value $C_{o3}$.

Additionally, while the connection node 104 in the DCO 100 of FIG. 1A is subjected to charge-sharing corrections, the connection node 104 in the DCO 200 of FIG. 2A is not directly subjected to charge-sharing corrections. Specifically, the connection node 104 in FIG. 1A is connected to the charge-sharing node 155B through the charge-sharing switch 140B. The connection node 104 in FIG. 2A, however, is not directly coupled to the charge-sharing circuit 280.

Furthermore, while the connection node 103 in the DCO 100 of FIG. 1A is not directly subjected to charge-sharing corrections, the connection node 103 in the DCO 200 of FIG. 2A is directly subjected to charge-sharing corrections. Specifically, the connection node 103 in FIG. 1A is not directly coupled to the charge-sharing circuit 180. The connection node 103 in FIG. 2A, however, is connected to the charge-sharing node 155A through the charge-sharing switch 141A.

In the charge-sharing circuit 280 of FIG. 2A, the charge-sharing node 155A is connected to the connection node 102 through the charge-sharing switch 140A and connected to the connection node 103 through the charge-sharing switch 141A. The connection state of the charge-sharing switch 140A is controlled by an in-phase CSL control signal CK_CSL_I. The connection state of the charge-sharing switch 141A is controlled by a quadrature CSL control signal CK_CSL_Q. Depending on the connection states of the charge-sharing switches 140A and 141A, the charge on the charge-sharing capacitor 150A is shared with either the charge on the node-to-ground capacitor 132 or the charge on the node-to-ground capacitor 133. The output terminal 178A of the DAC 170A is connected to the first terminal 152A of the charge-sharing capacitor 150A through the pre-charge switch 160A. The connection state of the pre-charge switch 160A is controlled by a DAC control signal CK_DAC. The DAC 170A has an input terminal 172A that is configured to receive a voltage digital word DV1[n]. A target voltage $V_{tgA}$[n] at output terminal 178A of the DAC 170A is generated by the DAC 170A from the voltage digital word DV1[n].

Figure 2B:
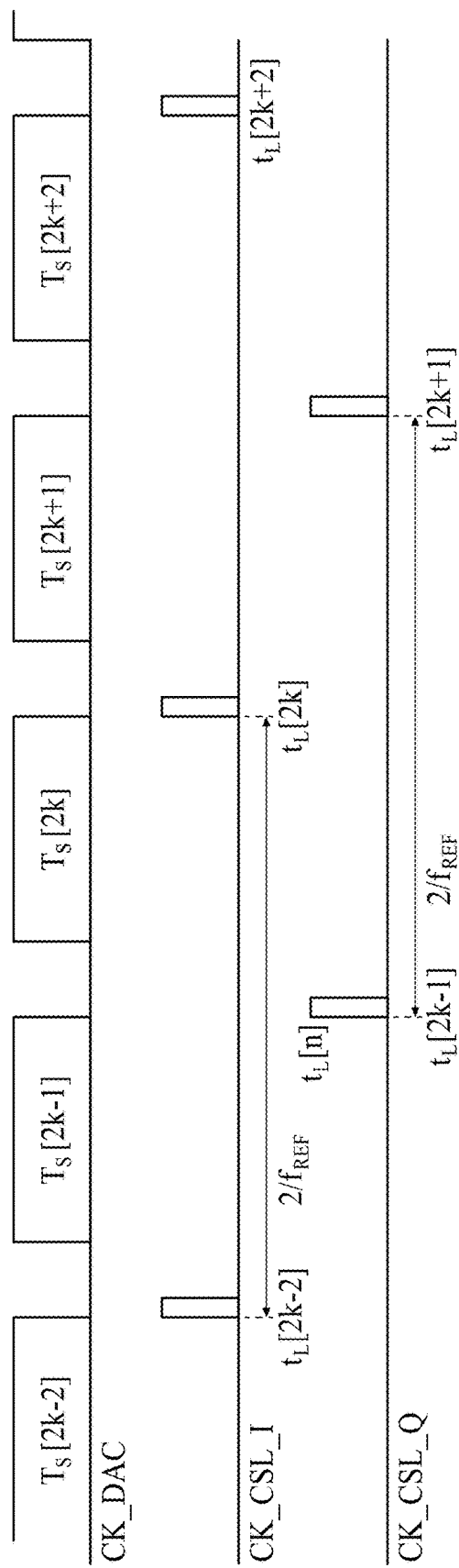
FIG. 2B are waveforms of the DAC control signal CK_DAC, the in-phase CSL control signal CK_CSL_I, and the quadrature CSL control signal CK_CSL_Q, in accordance with some embodiments.

FIG. 2B are waveforms of the DAC control signal CK_DAC the in-phase CSL control signal CK_CSL_I, and the quadrature CSL control signal CK_CSL_Q, in accordance with some embodiments. The DAC control signal CK_DAC stays at the logic HIGH during the pre-charge time periods $T_s$[2k−2], $T_s$[2k−1], $T_s$[2k], $T_s$[2k+1], and $T_s$[2k+2]. Here, k is a positive integer. During time periods that are not within the pre-charge time periods, the DAC control signal CK_DAC stays at the logic LOW.

In FIG. 2B, the in-phase CSL control signal CK_CSL_I changes from the logic LOW to the logic HIGH at every other CSL time. The quadrature CSL control signal CK_CSL_Q also changes from the logic LOW to the logic HIGH at every other CSL time. Each of the in-phase CSL control signal CK_CSL_I and the quadrature CSL control signal CK_CSL_Q stays at the logic HIGH for a time duration $\Delta t_L$ after the CSL time that the corresponding CSL control signal is changed to from the logic LOW to the logic HIGH. The logic pulses (at the CSL times) of the in-phase CSL control signal CK_CSL_I interlaces in the time domain with the logic pulses (at the CSL times) of the quadrature CSL control signal CK_CSL_Q. For example, the in-phase CSL control signal CK_CSL_I changes from the logic LOW to the logic HIGH at the CSL time $t_L$[2k−1] and the CSL time $t_L$[2k], while the quadrature CSL control signal CK_CSL_Q changes from the logic LOW to the logic HIGH at the CSL time $t_L$[2k−1] and the CSL time $t_L$[2k+1].

In operation, as shown in FIG. 2A and FIG. 2B, during the pre-charge time period (e.g., $T_s$[n], where the integer n is either an even integer 2k or an odd integer n=2k+1), the DAC control signal CK_DAC is at the logic HIGH, which drives each of the pre-charge switches 160A into the connected state. During the pre-charge time period $T_s$[n], both the in-phase CSL control signal CK_CSL_I and the quadrature CSL control signal CK_CSL_Q are at the logic LOW, which drive each of the charge-sharing switches 140A and 141A into the disconnected state. During the pre-charge time period (e.g., $T_s$[n]), the first terminal 152A of the charge-sharing capacitor 150A is electrically isolated from the connection nodes 102 and 103 of the DCO 100, while the first terminal 152A of the charge-sharing capacitor 150A is conductively connected to the output terminal 178A of the DAC 170A. At the end of the pre-charge time period, the charge-sharing capacitor 150A is charged to a voltage level that is equal to the target voltage $V_{tgA}$[n] at the output terminal 178A of the DAC 170A.

Figure 2C:
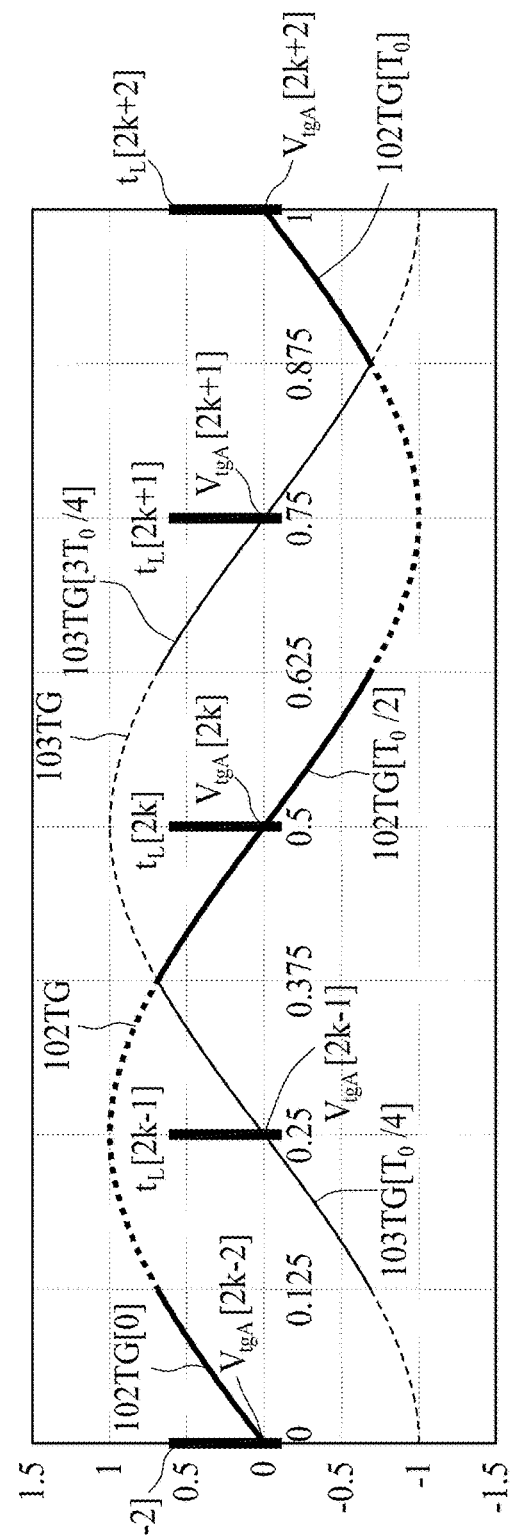
FIG. 2C is a plot diagram of the ideal oscillation waveforms at the connection nodes of the DCO and the target voltages sampled at various CSL times, in accordance with some embodiments.

FIG. 2C is a plot diagram of the ideal oscillation waveforms at the connection nodes 102 and 103 of the DCO 200 and the target voltages sampled at various CSL times, in accordance with some embodiments. The horizontal axis in FIG. 2C is the time which is measured in the unit of a time period $T_0$ that is the inverse of the ideal oscillation frequency $f_{osc}$ of the DCO 200. The vertical axis in FIG. 2C is the amplitude of the oscillation at the connection node 102 or 103 of the DCO 200. The value of each target voltage $V_{tgA}$[n] is sampled at a CSL time either on the ideal oscillation waveform 102TG at the connection node 102 or on the ideal oscillation waveform 103TG at the connection node 103. Specifically, as shown in FIG. 2C, when the integer n is an odd integer, the value of the target voltage $V_{tgA}$[2k−2], $V_{tgA}$[2k], and $V_{tgA}$[2k+2] are sampled on the ideal oscillation waveform 102TG correspondingly at the CSL time $t_L$[2k−2], the CSL time $t_L$[2k], and the CSL time $t_L$[2k+2]. When the integer n is an even integer, the value of the target voltage $V_{tgA}$[2k−1] and $V_{tgA}$[2k+1] are sampled on the ideal oscillation waveform 103TG correspondingly at the CSL time $t_L$[2k−1] and the CSL time $t_L$[2k+1]. In FIG. 2C, each of the ideal oscillation waveforms 102TG and 103TG is a sinusoidal wave which has a time period $T_0$ that is the inverse of the ideal oscillation frequency $f_{osc}$ of the DCO 200. The phase of the ideal oscillation waveform 103TG lags behind the phase of the ideal oscillation waveform 102TG by a phase difference of $\pi/2$.

In FIG. 2C, the target voltage $V_{tgA}$[n] is generated by the DAC 170A from the voltage digital words DV1[n]. In some embodiments, the voltage digital word DV1[n] is fetched from a memory. In some embodiments, for each integer value n, the voltage digital word DV1[n] for generating the target voltage $V_{tgA}$[n] is created based on a stored digital word from a memory. In some embodiments, segments of the ideal oscillation waveforms 102TG and 103TG are stored in the memory as parts of a discrete time signal. For example, in some implementations, segments 102TG[0], 102TG[$T_0$/2], and 102TG[$T_0$] are stored in the memory as in-phase segments of the discrete time signal, while segments 103TG[$T_0$/4] and 103TG[$3T_0$/4] are stored in the memory as quadrature segments of the discrete time signal. The segments 102TG[0], 102TG[$T_0$/2], and 102TG[$T_0$] are correspondingly the segments of the ideal oscillation waveform 102TG in the time interval ranging from 0 to $T_0$/8, the time interval ranging from $3T_0$/8 to $5T_0$/8, and the time interval ranging from $7T_0$/8 to $T_0$. The segments 103TG[$T_0$/4] and 103TG[$3T_0$/4] are correspondingly the segments of the ideal oscillation waveform 103TG in the time interval ranging from $T_0$/8 to $3T_0$/8 and the time interval ranging from $5T_0$/8 to $7T_0$/8.

During the operation, when the charge-sharing capacitor 150A in FIG. 2A is charged to a voltage level that is equal to the target voltage $V_{tgA}$[n] at the end of the pre-charge time period $T_s$[n] as shown in FIG. 2B, either the in-phase CSL control signal CK_CSL_I or the quadrature CSL control signal CK_CSL_Q changes from the logic LOW to the logic HIGH at the CSL time $t_L$[n]. In FIG. 2A and FIG. 2B, during the time duration $\Delta t_L$ after the CSL time $t_L$[n], the DAC control signal CK_DAC is at the logic LOW, which drives each of the pre-charge switch 160A into the disconnected state, and the first terminal 152A of the charge-sharing capacitor 150A is electrically isolated from the output terminal 178A of the DAC 170A.

In FIG. 2A and FIG. 2B, during the time duration $\Delta t_L$ after the CSL time $t_L$[n], if the integer n is an even integer, the in-phase CSL control signal CK_CSL_I is at the logic HIGH which drives the charge-sharing switch 140A into the connected state, and the quadrature CSL control signal CK_CSL_Q is at the logic LOW which drives the charge-sharing switch 141A into the disconnected state. The connected state of the charge-sharing switch 140A causes the connection node 102 conductively connected to the charge-sharing node 155A, while the disconnected state of the charge-sharing switch 141A prevents a direct conductive connection between the connection node 103 and the charge-sharing node 155A. Because of the conductive connection between the charge-sharing node 155A and the connection node 102, the voltage signal $V_{osc\_IP}$ at the connection node 102 is modified towards the target voltage $V_{tgA}$[n] on the charge-sharing node 155A at the CSL time $t_L$[n].

Figure 2D:
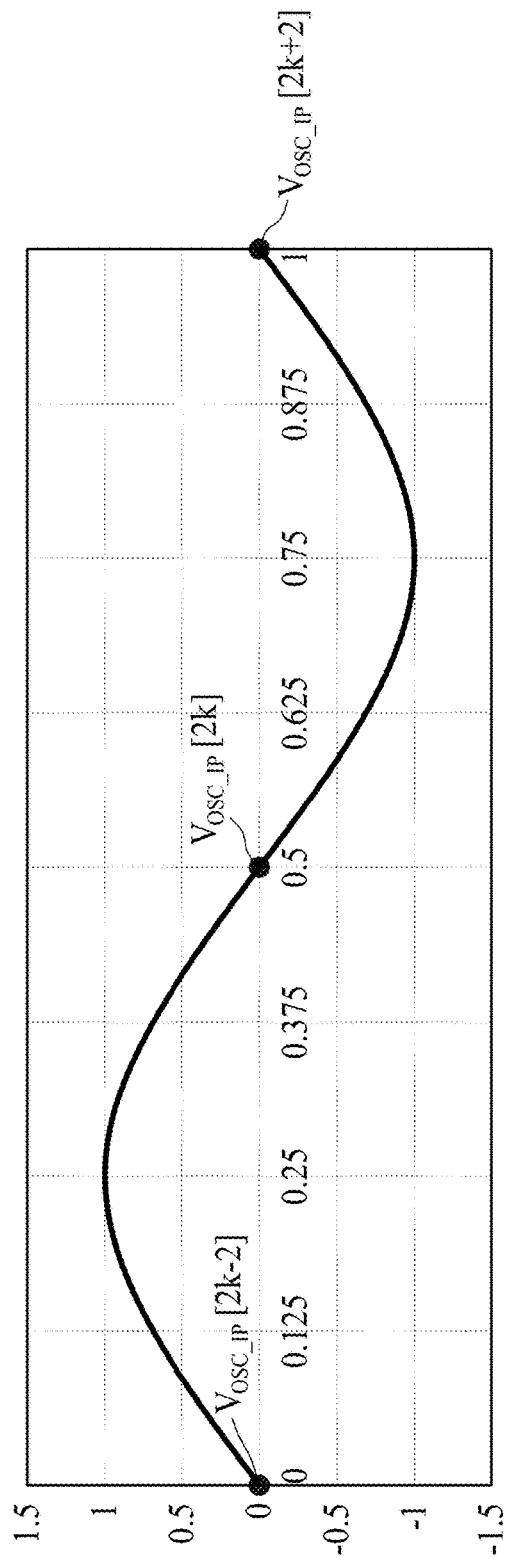
FIG. 2D is a waveform of the voltage signal $V_{osc\_IP}$ at a connection node with CS locking points identified on the waveform, in accordance with some embodiments.

At each CSL time (e.g., $t_L$[2k−2], $t_L$[2k], or $t_L$[2k+2]) when the integer n is an even integer, the voltage signal $V_{osc\_IP}$ is corrected with the charge-sharing process at the corresponding CS locking point. FIG. 2D is a waveform of the voltage signal $V_{osc\_IP}$ at the connection node 102 with CS locking points identified on the waveform, in accordance with some embodiments. At each CS locking point, the waveform is corrected based on the voltage on the charge-sharing node 155A. For example, the voltage signal $V_{osc\_IP}$ of the connection node 102 at the CS locking points $V_{osc\_IP}$[2k−2], $V_{osc\_IP}$[2k], and $V_{osc\_IP}$ [2k+2] is correspondingly corrected based on the voltages $V_{tgA}$[2k−2], $V_{tgA}$[2k], and $V_{tgA}$[2k+2] at the charge-sharing node 155A (corresponding to the CSL time $t_L$[2k−2], $t_L$[2k], or $t_L$[2k+2]).

In FIG. 2A and FIG. 2B, during the time duration $\Delta t_L$ after the CSL time $t_L$[n], if the integer n is an odd integer, the in-phase CSL control signal CK_CSL_I is at the logic LOW which drives the charge-sharing switch 140A into the disconnected state, and the quadrature CSL control signal CK_CSL_Q is at the logic HIGH which drives the charge-sharing switch 141A into the connected state. The disconnected state of charge-sharing switch 140A prevents a direct conductive connection between the connection node 102 and the charge-sharing node 155A, while the connected state of charge-sharing switch 141A causes the connection node 103 conductively connected to the charge-sharing node 155A. Because of the conductive connection between the charge-sharing node 155A and the connection node 103, the voltage signal $V_{osc\_IQ}$ at the connection node 103 is modified towards the target voltage $V_{tgA}$[n] on the charge-sharing node 155A at the CSL time $t_L$[n].

Figure 2E:
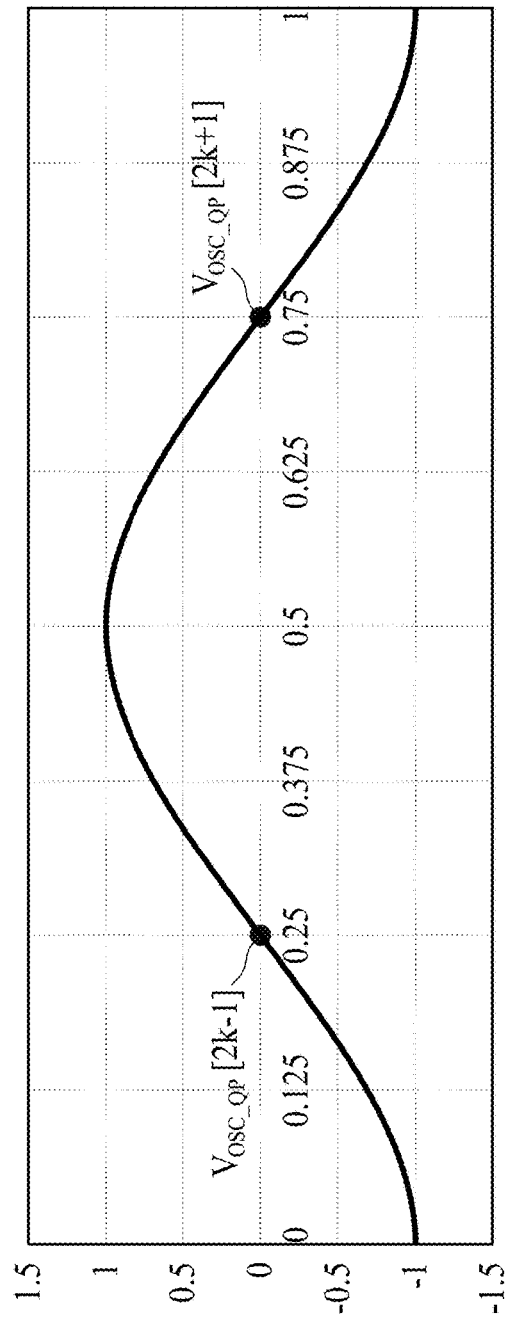
FIG. 2E is a waveform of the voltage signal $V_{osc\_IQ}$ at a connection node with CS locking points identified on the waveform, in accordance with some embodiments.

At each CSL time (e.g., $t_L$[2k−1] or $t_L$[2k+1]) when the integer n is an odd integer, the voltage signal $V_{osc\_QP}$ is corrected with the charge-sharing process at the corresponding CS locking point. FIG. 2E is a waveform of the voltage signal $V_{osc\_IQ}$ at the connection node 103 with CS locking points identified on the waveform, in accordance with some embodiments. At each CS locking point, the waveform is corrected based on the voltage on the charge-sharing node 155A. For example, the voltage signal $V_{osc\_QP}$ of the connection node 103 at the CS locking points $V_{osc\_QP}$ [2k−1], and $V_{osc\_QP}$ [2k+1] is correspondingly corrected based on the voltages $V_{tgA}$[2k−1] and $V_{tgA}$[2k+1] at the charge-sharing node 155A (corresponding to the CSL time $t_L$[2k−1] or $t_L$[2k+1]).

In the example embodiments of FIG. 1A and FIG. 2A, the oscillation waveforms at two connection nodes are corrected at various CS locking points. In some alternative embodiments, the oscillation waveforms at more than two connection nodes are corrected at various CS locking points. For example, in alternative embodiments, the oscillation waveforms at four connection nodes are corrected at various CS locking points.

Figure 3A:
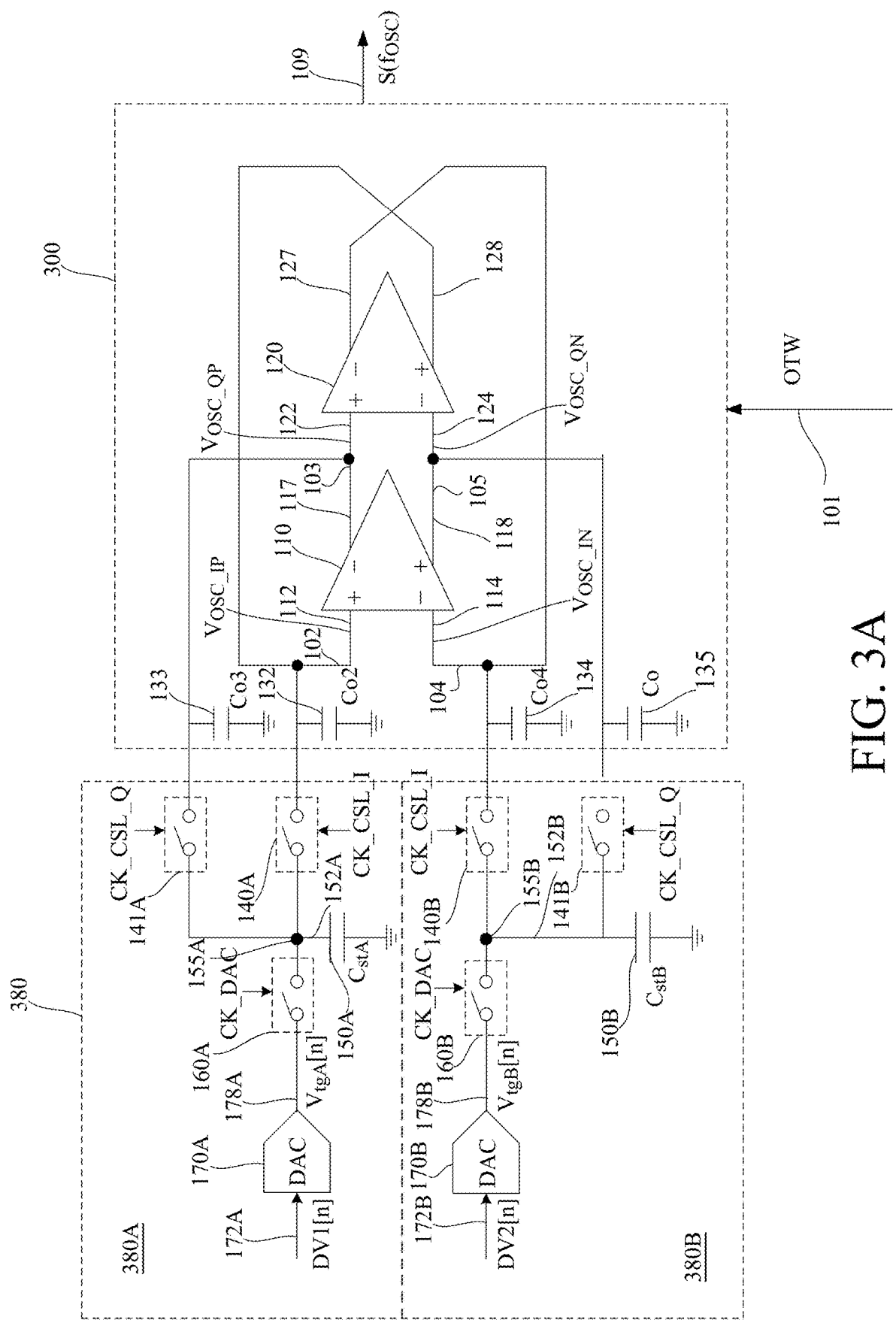
FIG. 3A is a schematic diagram of a ring based digitally controlled oscillator (DCO) coupled with a charge-sharing circuit, in accordance with some embodiments.

FIG. 3A is a schematic diagram of a ring based digitally controlled oscillator (DCO) 300 coupled with a charge-sharing circuit 380, in accordance with some embodiments. The DCO 300 in FIG. 3A has the same circuit structure as the DCO 100 in FIG. 1A and the DCO 200 in FIG. 2A, except for the difference in the modeling of the connection nodes by the node-to-ground capacitors. In each of the DCO 100 of FIG. 1A and the DCO 200 of FIG. 2A, two connection nodes are modeled for the charge-sharing process with corresponding node-to-ground capacitors. In the DCO 300 of FIG. 3A, however, four connection nodes 102, 103, 104, and 105 are modeled for the charge-sharing process correspondingly with the node-to-ground capacitors 132, 133, 134, and 135. The node-to-ground capacitor 132 has a capacitance value $C_{o2}$, the node-to-ground capacitor 133 has a capacitance value $C_{o3}$, the node-to-ground capacitor 134 has a capacitance value $C_{o4}$, and the node-to-ground capacitor 135 has a capacitance value Cos. Additionally, in each of the DCO 100 of FIG. 1A and the DCO 200 of FIG. 2A, two connection nodes are subjected to charge-sharing corrections. In the DCO 300 of FIG. 3A, however, each of the four connection nodes 102, 103, 104, and 105 is subjected to charge-sharing corrections.

The charge-sharing circuit 380 of FIG. 3A includes a first branch circuit 380A and a second branch circuit 380B. The first branch circuit 380A is configured to provide charge-sharing corrections for the connection nodes 102 and 103 of the DCO 300, while the second branch circuit 380B is configured to provide charge-sharing corrections for the connection nodes 104 and 105 of the DCO 300. The first branch circuit 380A is the same as the charge-sharing circuit 280 of FIG. 2A, and the second branch circuit 380B has similar circuit structure as the first branch circuit 380A.

In the first branch circuit 380A, the charge-sharing node 155A is connected to the connection node 102 through the charge-sharing switch 140A and connected to the connection node 103 through the charge-sharing switch 141A. The connection state of the charge-sharing switch 140A is controlled by an in-phase CSL control signal CK_CSL_I. The connection state of the charge-sharing switch 141A is controlled by a quadrature CSL control signal CK_CSL_Q. Depending on the connection states of the charge-sharing switches 140A and 141A, the charge on the charge-sharing capacitor 150A is shared with either the charge on the node-to-ground capacitor 132 or the charge on the node-to-ground capacitor 133. The output terminal 178A of the DAC 170A is connected to the first terminal 152A of the charge-sharing capacitor 150A through the pre-charge switch 160A. The connection state of the pre-charge switch 160A is controlled by a DAC control signal CK_DAC. The DAC 170A has an input terminal 172A that is configured to receive a voltage digital word DV1[n]. A target voltage $V_{tgA}$[n] at the output terminal 178A of the DAC 170A is generated by the DAC 170A from the voltage digital word DV1[n].

In the second branch circuit 380B, the charge-sharing node 155B is connected to the connection node 104 through the charge-sharing switch 140B and connected to the connection node 105 through the charge-sharing switch 141B. The connection state of the charge-sharing switch 140B is controlled by an in-phase CSL control signal CK_CSL_I. The connection state of the charge-sharing switch 141B is controlled by a quadrature CSL control signal CK_CSL_Q. Depending on the connection states of the charge-sharing switches 140B and 141B, the charge on the charge-sharing capacitor 150B is shared with either the charge on the node-to-ground capacitor 134 or the charge on the node-to-ground capacitor 135. The output terminal 178B of the DAC 170B is connected to the first terminal 152B of the charge-sharing capacitor 150B through the pre-charge switch 160B. The connection state of the pre-charge switch 160B is controlled by a DAC control signal CK_DAC. The DAC 170B has an input terminal 172B that is configured to receive a voltage digital word DV2[n]. A target voltage $V_{tgB}$[n] at the output terminal 178B of the DAC 170B is generated by the DAC 170B from the voltage digital word DV2[n].

In some embodiments, the charge-sharing switches 140A and 141A are implemented correspondingly as a first branch-one charge-sharing capacitor and a second branch-one charge-sharing capacitor. The charge-sharing switches 140B and 141B are implemented correspondingly as a first branch-two charge-sharing capacitor and a second branch-two charge-sharing capacitor. The charge-sharing capacitor 150A and the charge-sharing capacitor 150B are implemented correspondingly as a branch-one charge-sharing capacitor and a branch-two charge-sharing capacitor. The pre-charge switch 160A and the pre-charge switch 160B are implemented correspondingly as a branch-one pre-charge switch and a branch-two pre-charge switch. The DAC 170A and The DAC 170B are implemented correspondingly as a branch-one DAC and a branch-two DAC.

Figure 3B:
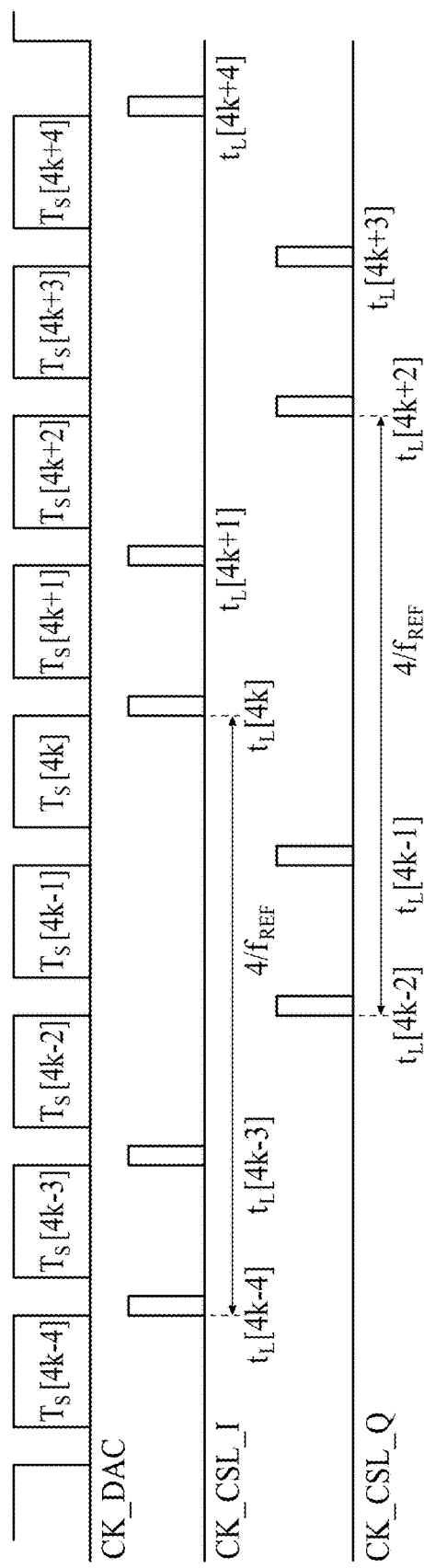
FIG. 3B are waveforms of the DAC control signal CK_DAC, the in-phase CSL control signal CK_CSL_I, and the quadrature CSL control signal CK_CSL_Q, in accordance with some embodiments.

FIG. 3B are waveforms of the DAC control signal CK_DAC, the in-phase CSL control signal CK_CSL_I, and the quadrature CSL control signal CK_CSL_Q, in accordance with some embodiments. The DAC control signal CK_DAC stays at the logic HIGH during each of the pre-charge time periods, such as $T_s[n]$, where the integer n ranges from 4k−4 to 4k+4 for the pre-charge time periods as shown in FIG. 3B. Here, k is a positive integer. During the time periods that are not within the pre-charge time periods, the DAC control signal CK_DAC stays at the logic LOW.

In FIG. 3B, as shown in the waveform of the in-phase CSL control signal CK_CSL_I and the waveform of the quadrature CSL control signal CK_CSL_Q, each of the logic HIGH pulses of the control signal CK_CSL_I or the control signal CK_CSL_Q starts at a CSL time $t_L[n]$ and stays at the logic HIGH for a time duration $\Delta t_L$ after the CSL time $t_L[n]$. The integer n for the CSL time $t_L[n]$ as shown in FIG. 3B ranges from 4k−4 to 4k+4, where k is a positive integer.

In FIG. 3B, every two logic HIGH pulses of the control signal CK_CSL_I are followed by two logic HIGH pulses of the control signal CK_CSL_Q, and every two logic HIGH pulses of the CSL control signal CK_CSL_Q are followed by two logic HIGH pulses of the CSL control signal CK_CSL_I. Specifically, the two logic HIGH pulses of the control signal CK_CSL_I at the CSL time $t_L[4k−4]$ and at the CSL time $t_L[4k−3]$ are followed by the two logic HIGH pulses of the control signal CK_CSL_Q at the CSL time $t_L[4k−2]$ and at the CSL time $t_L[4k−1]$, while the two logic HIGH pulses of the control signal CK_CSL_I at the CSL time $t_L[4k]$ and at the CSL time $t_L[4k+1]$ are followed by the two logic HIGH pulses of the control signal CK_CSL_Q at the CSL time $t_L[4k+2]$ and at the CSL time $t_L[4k+3]$. The two logic HIGH pulses of the control signal CK_CSL_Q at the CSL time $t_L[4k−2]$ and at the CSL time $t_L[4k−1]$ are followed by the two logic HIGH pulses of the control signal CK_CSL_I at the CSL time $t_L[4k]$ and at the CSL time $t_L[4k+1]$, while The two logic HIGH pulses of the control signal CK_CSL_Q at the CSL time $t_L[4k+2]$ and at the CSL time $t_L[4k+3]$ are followed by the two logic HIGH pulses of the control signal CK_CSL_I at the CSL time $t_L[4k+4]$ and at the CSL time $t_L[4k+5]$ (even though the logic HIGH pulse of the control signal CK_CSL_I at the CSL time $t_L[4k+5]$ is not explicitly shown in the figure).

In operation, as shown in FIG. 3A and FIG. 3B, during the pre-charge time period (e.g., $T_s[n]$), the charge-sharing node 155A is electrically isolated from the connection nodes 102 and 103 of the DCO 100 by the charge-sharing switches 140A and 141A, and the charge-sharing node 155B is electrically isolated from the connection nodes 104 and 105 of the DCO 100 by the charge-sharing switches 140B and 141B. Additionally, the charge-sharing node 155A is conductively connected to the output terminal 178A of the DAC 170A through the pre-charge switch 160A, and the charge-sharing node 155B is conductively connected to the output terminal 178B of the DAC 170B through the pre-charge switch 160B. At the end of the pre-charge time period $T_s[n]$, the charge-sharing capacitor 150A is charged to a voltage level that is equal to the target voltage $V_{tgA}[n]$ at the output terminal 178A of the DAC 170A, and the charge-sharing capacitor 150B is charged to a voltage level that is equal to the target voltage $V_{tgB}[n]$ at the output terminal 178B of the DAC 170B.

Figure 3C:
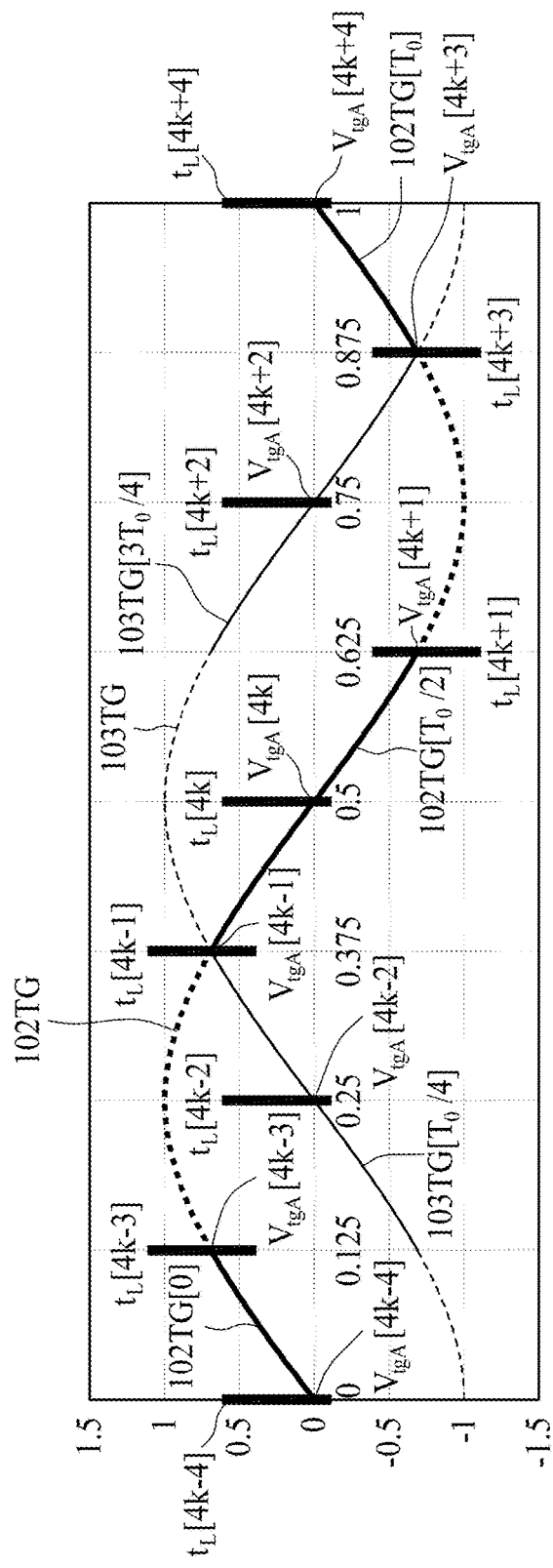
FIG. 3C is a plot diagram of the ideal oscillation waveforms at the connection nodes of the DCO and the target voltages applied to the charge-sharing node in the first branch circuit, in accordance with some embodiments.

FIG. 3C is a plot diagram of the ideal oscillation waveforms at the connection nodes 102 and 103 of the DCO 300 and the target voltages applied to the charge-sharing node 155A in the first branch circuit 380A, in accordance with some embodiments. FIG. 3F is a plot diagram of the ideal oscillation waveforms at the connection nodes 104 and 105 of the DCO 300 and the target voltages applied to the charge-sharing node 155B in the second branch circuit 380B, in accordance with some embodiments. The horizontal axis in each of FIG. 3C and FIG. 3F is the time which is measured in the unit of a time period $T_0$ that is the inverse of the ideal oscillation frequency $f_{osc}$ of the DCO 300. The vertical axis in FIG. 3C is the amplitude of the oscillation at the connection node 102 or 103 of the DCO 300. The vertical axis in FIG. 3F is the amplitude of the oscillation at the connection node 104 or 105 of the DCO 300.

In FIG. 3C, the value of each target voltage $V_{tgA}[n]$ is sampled at a CSL time either on the ideal oscillation waveform 102TG at the connection node 102 or on the ideal oscillation waveform 103TG at the connection node 103. Specifically, as shown in FIG. 3C, the value of the target voltage $V_{tgA}$ is sampled on the ideal oscillation waveform 102TG at the CSL time $t_L[n]$, if the integer n is equal to 4k−4, 4k−3, 4k, 4k+1, or 4k+4. Additionally, the value of the target voltage $V_{tgA}$ is sampled on the ideal oscillation waveform 103TG at the CSL time $t_L[n]$, if the integer n is equal to 4k−2, 4k−1, 4k+2, or 4k+3. In FIG. 3C, each of the ideal oscillation waveforms 102TG and 103TG is a sinusoidal wave which has the time period $T_0$ that is the inverse of the ideal oscillation frequency $f_{osc}$ of the DCO 300. The phase of the ideal oscillation waveform 103TG lags behind the phase of the ideal oscillation waveform 102TG by a phase difference of $\pi/2$.

In FIG. 3C, the target voltage $V_{tgA}[n]$ is generated by the DAC 170A from the voltage digital words DV1[n]. In some embodiments, the voltage digital word DV1[n] is fetched from a memory. In some embodiments, segments of the ideal oscillation waveforms 102TG and 103TG are stored in the memory as parts of a discrete time signal. For example, in some implementations, segments 102TG[0], 102TG[$T_0/2$], and 102TG[$T_0$] are stored in the memory as in-phase segments of the discrete time signal, while segments 103TG[$T_0/4$] and 103TG[$3T_0/4$] are stored in the memory as quadrature segments of the discrete time signal. The segments 102TG[0], 102TG[$T_0/2$], and 102TG[$T_0$] are correspondingly the segments of the ideal oscillation waveform 102TG in the time interval ranging from 0 to $T_0/8$, the time interval ranging from $3T_0/8$ to $5T_0/8$, and the time interval ranging from $7T_0/8$ to $T_0$. The segments 103TG[$T_0/4$] and 103TG[$3T_0/4$] are correspondingly the segments of the ideal oscillation waveform 103TG in the time interval ranging from $T_0/8$ to $3T_0/8$ and the time interval ranging from $5T_0/8$ to $7T_0/8$.

In FIG. 3F, the value of each target voltage $V_{tgB}[n]$ is sampled at a CSL time either on the ideal oscillation waveform 104TG at the connection node 104 or on the ideal oscillation waveform 105TG at the connection node 105. Specifically, as shown in FIG. 3F, the value of the target voltage $V_{tgB}$ is sampled on the ideal oscillation waveform 104TG at the CSL time $t_L[n]$, if the integer n is equal to 4k−4, 4k−3, 4k, 4k+1, or 4k+4. Additionally, the value of the target voltage $V_{tgB}$ is sampled on the ideal oscillation waveform 105TG at the CSL time $t_L[n]$, if the integer n is equal to 4k−2, 4k−1, 4k+2, or 4k+3. In FIG. 3C, each of the ideal oscillation waveforms 104TG and 105TG is a sinusoidal wave which has the time period $T_0$ that is the inverse of the ideal oscillation frequency $f_{osc}$ of the DCO 300. The phase of the ideal oscillation waveform 105TG lags behind the phase of the ideal oscillation waveform 104TG by a phase difference of $\pi/2$.

In FIG. 3F, the target voltage $V_{tgB}[n]$ is generated by the DAC 170B from the voltage digital words DV2[n]. In some embodiments, the voltage digital word DV2[n] is fetched from a memory. In some embodiments, segments of the ideal oscillation waveforms 104TG and 105TG are stored in the memory as parts of a discrete time signal. For example, in some implementations, segments 104TG[0], 104TG[$T_0/2$], and 104TG[$T_0$] are stored in the memory as in-phase segments of the discrete time signal, while segments 105TG[$T_0/4$] and 105TG[$3T_0/4$] are stored in the memory as quadrature segments of the discrete time signal. The segments 104TG[0], 104TG[$T_0/2$], and 104TG[$T_0$] are correspondingly the segments of the ideal oscillation waveform 104TG in the time interval ranging from 0 to $T_0/8$, the time interval ranging from $3T_0/8$ to $5T_0/8$, and the time interval ranging from $7T_0/8$ to $T_0$. The segments 105TG[$T_0/4$] and 105TG[$3T_0/4$] are correspondingly the segments of the ideal oscillation waveform 105TG in the time interval ranging from $T_0/8$ to $3T_0/8$ and the time interval ranging from $5T_0/8$ to $7T_0/8$.

In FIG. 3B, after each pre-charge time period $T_s[n]$, a logic HIGH pulse of the control signal CK_CSL_I or CK_CSL_Q is initiated at the CSL time $t_L[n]$. In FIG. 3B, the integer n ranges from 4k−4 to 4k+4, where k is a positive integer. During the operation, at the end of the pre-charge time period $T_s[n]$, the charge-sharing capacitor 150A is charged to a voltage level that is equal to the target voltage $V_{tgA}[n]$ at the output terminal 178A of the DAC 170A, and the charge-sharing capacitor 150B is charged to a voltage level that is equal to the target voltage $V_{tgB}[n]$ at the output terminal 178B of the DAC 170B. Then, at the CSL time $t_L[n]$, either the control signal CK_CSL_I or the control signal CK_CSL_Q changes from the logic LOW to the logic HIGH, which starts a corresponding logic HIGH pulse. In FIG. 3A and FIG. 3B, during the time duration $\Delta t_L$ after the CSL time $t_L[n]$, because the DAC control signal CK_DAC stays at the logic LOW, the charge-sharing node 155A is electrically isolated from the output terminal 178A of the DAC 170A by the pre-charge switch 160A, and the charge-sharing node 155B is electrically isolated from the output terminal 178B of the DAC 170B by the pre-charge switch 160B.

In FIG. 3A and FIG. 3B, during the time duration $\Delta t_L$ after the CSL time $t_L[n]$, for the integer n that is equal to 4k−4, 4k−3, 4k, 4k+1, or 4k+4, the control signal CK_CSL_I is at the logic HIGH and the control signal CK_CSL_Q is at the logic LOW. Because of the logic levels of the control signals CK_CSL_I and CK_CSL_Q, the connection node 102 is conductively connected to the charge-sharing node 155A through the charge-sharing switch 140A while the charge-sharing switch 141A prevents a direct conductive connection between the connection node 103 and the charge-sharing node 155A. Additionally, because of the logic levels of the control signals CK_CSL_I and CK_CSL_Q, the connection node 104 is conductively connected to the charge-sharing node 155B through the charge-sharing switch 140B while the charge-sharing switch 141B prevents a direct conductive connection between the connection node 105 and the charge-sharing node 155B.

Consequently, during the time duration $\Delta t_L$ after the CSL time $t_L[n]$, for the integer n that is equal to 4k−4, 4k−3, 4k, 4k+1, or 4k+4, the voltage signal $V_{osc\_IP}$ at the connection node 102 and the voltage signal $V_{osc\_IN}$ at the connection node 104 are both corrected based on the charge-sharing process, because of the conductive connection between the charge-sharing node 155A and the connection node 102 and the conductive connection between the charge-sharing node 155B and the connection node 104. At the CSL time $t_L[n]$, the voltage signal $V_{osc\_IP}$ at the connection node 102 is modified towards the target voltage $V_{tgA}[n]$ on the charge-sharing node 155A, while the voltage signal $V_{osc\_IN}$ at the connection node 104 is modified towards the target voltage $V_{tgB}[n]$ on the charge-sharing node 155B.

Figure 3D:
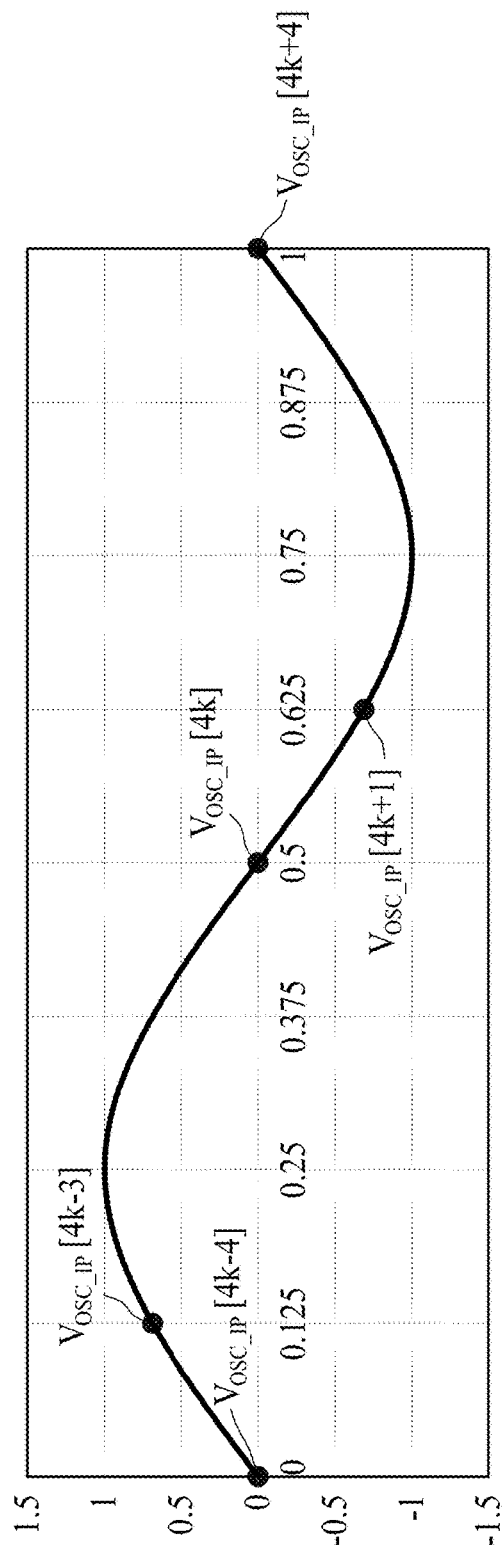
FIG. 3D is a waveform of the voltage signal $V_{osc\_IP}$ at a connection node with CS locking points identified on the waveform, in accordance with some embodiments.
Figure 3E:
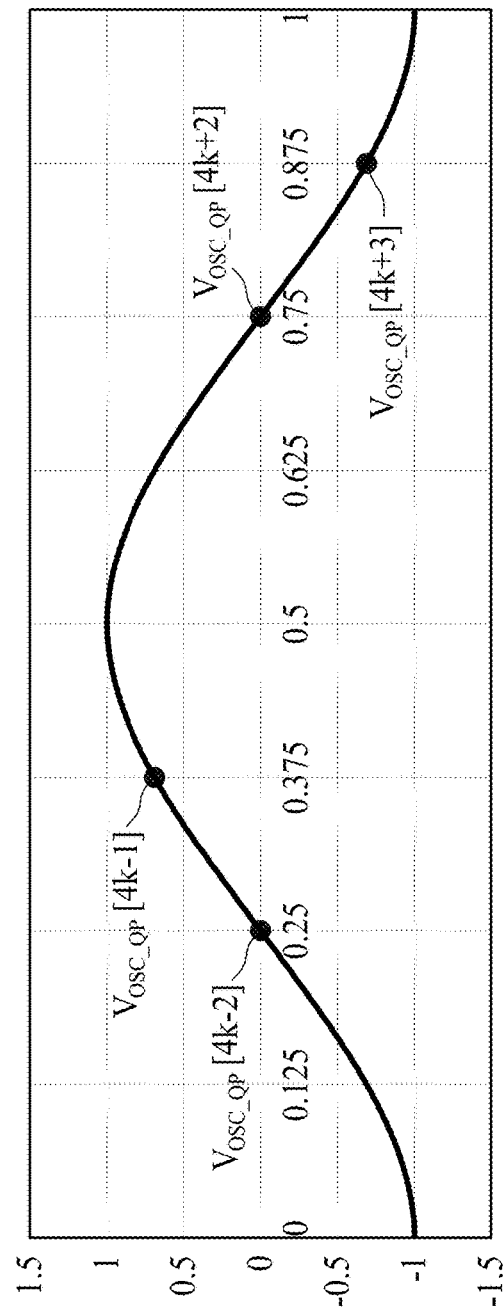
FIG. 3E is a waveform of the voltage signal $V_{osc\_QP}$ at a connection node with CS locking points identified on the waveform, in accordance with some embodiments.
Figure 3F:
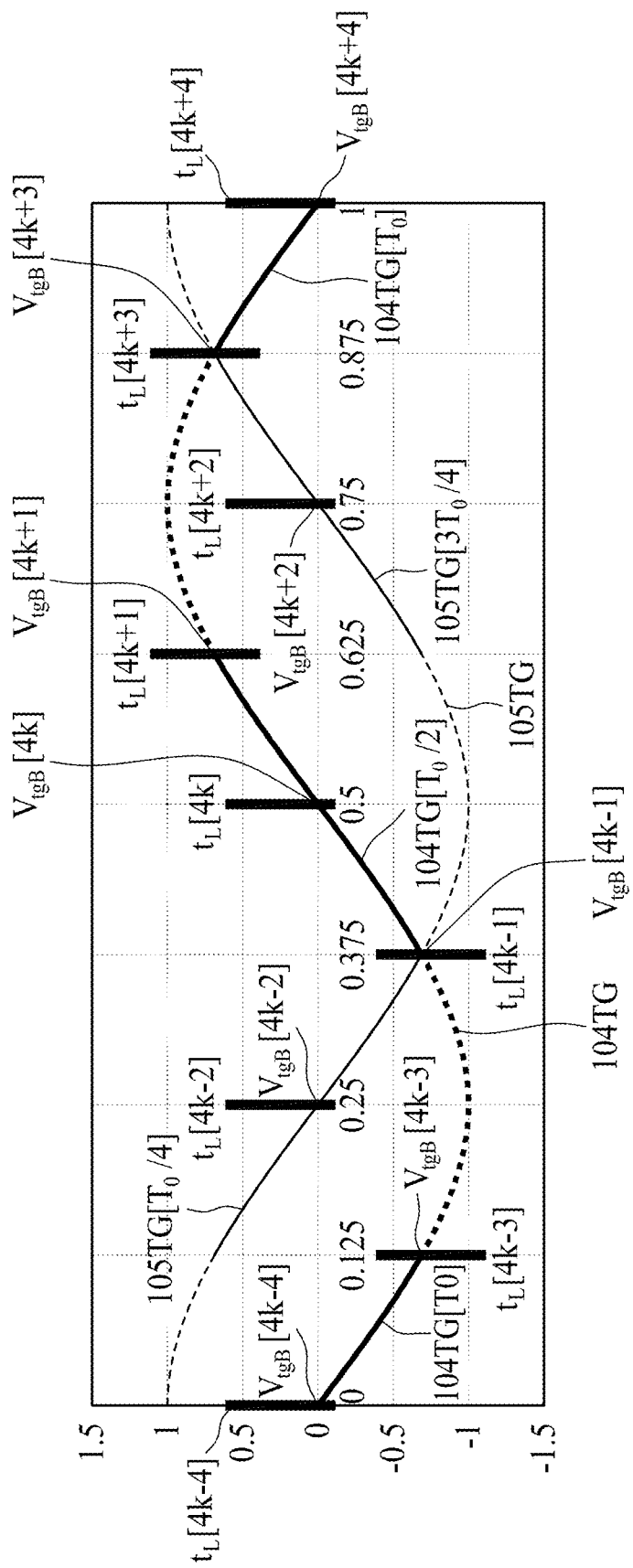
FIG. 3F is a plot diagram of the ideal oscillation waveforms at the connection nodes of the DCO and the target voltages applied to the charge-sharing node in the second branch circuit, in accordance with some embodiments.
Figure 3G:
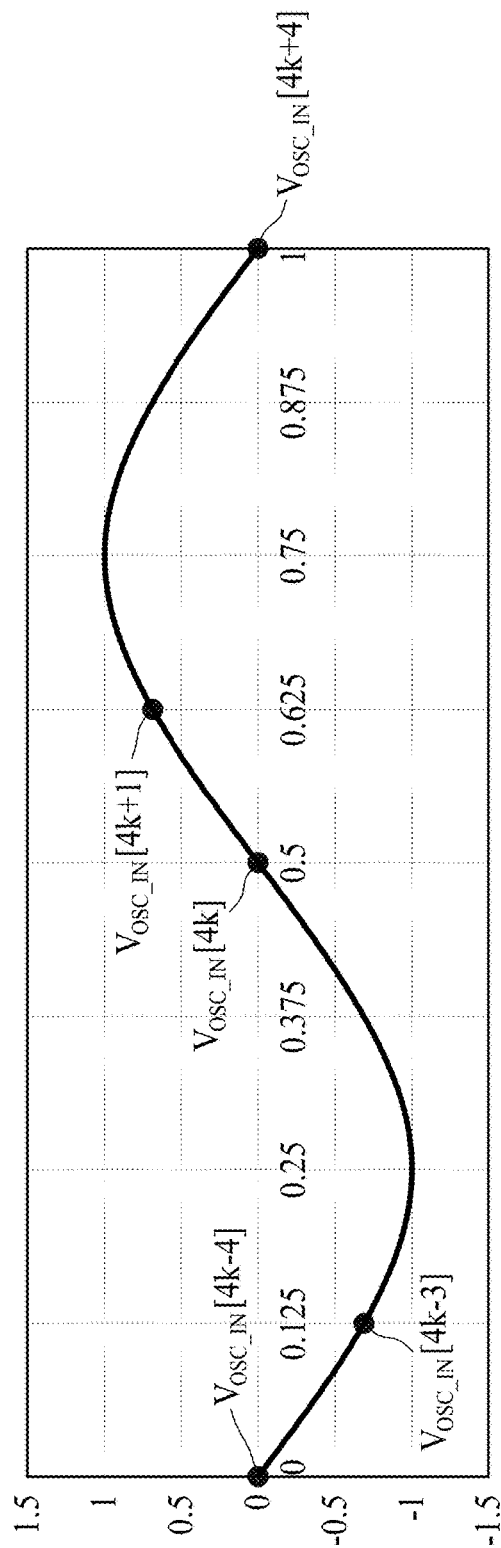
FIG. 3G is a waveform of the voltage signal $V_{osc\_IN}$ at a connection node with CS locking points identified on the waveform, in accordance with some embodiments.

Each CSL time $t_L[n]$ (for the integer n that is equal to 4k−4, 4k−3, 4k, 4k+1, or 4k+4) corresponds to a first CS locking point in FIG. 3D on the waveform of the voltage signal $V_{osc\_IP}$ and a second CS locking point in FIG. 3G on the waveform of the voltage signal $V_{osc\_IN}$.

The CS locking points in FIG. 3D include $V_{osc\_IP}[4k-4]$, $V_{osc\_IP}[4k-3]$, $V_{osc\_IP}[4k]$, $V_{osc\_IP}[4k+1]$, and $V_{osc\_IP}[4k+4]$. At each CS locking point, the waveform of the voltage signal $V_{osc\_IP}$ is corrected based on the voltage on the charge-sharing node 155A at the same CSL time $t_L[n]$. For example, the voltage signal $V_{osc\_IP}$ of the connection node 102 at the CS locking point $V_{osc\_IP}[4k]$ is corrected based on the corresponding voltage $V_{tgA}[4k]$ of the charge-sharing node 155A, and the voltage signal $V_{osc\_IP}$ of the connection node 102 at the CS locking point $V_{osc\_IP}[4k+1]$ is corrected based on the corresponding voltage $V_{tgA}[4k+1]$ of the charge-sharing node 155A.

The CS locking points in FIG. 3G include $V_{osc\_IN}[4k-4]$, $V_{osc\_IN}[4k-3]$, $V_{osc\_IN}[4k]$, $V_{osc\_IN}[4k+1]$, and $V_{osc\_IN}[4k+4]$. At each CS locking point, the waveform of the voltage signal $V_{osc\_IN}$ is corrected based on the voltage on the charge-sharing node 155B at the same CSL time $t_L[n]$. For example, the voltage signal $V_{osc\_IN}$ of the connection node 104 at the CS locking point $V_{osc\_IN}[4k]$ is corrected based on the corresponding voltage $V_{tgA}[4k]$ of the charge-sharing node 155B, and the voltage signal $V_{osc\_IN}$ of the connection node 104 at the CS locking point $V_{osc\_IN}[4k+1]$ is corrected based on the corresponding voltage $V_{tgA}[4k+1]$ of the charge-sharing node 155B.

In FIG. 3A and FIG. 3B, during the time duration $\Delta t_L$ after the CSL time $t_L[n]$, for the integer n that is equal to 4k−2, 4k−1, 4k+2, or 4k+3, the control signal CK_CSL_I is at the logic LOW and the control signal CK_CSL_Q is at the logic HIGH. Because of the logic levels of the control signals CK_CSL_I and CK_CSL_Q, the connection node 103 is conductively connected to the charge-sharing node 155A through the charge-sharing switch 141A while the charge-sharing switch 140A prevents a direct conductive connection between the connection node 102 and the charge-sharing node 155A. Additionally, because of the logic levels of the control signals CK_CSL_I and CK_CSL_Q, the connection node 105 is conductively connected to the charge-sharing node 155B through the charge-sharing switch 141B while the charge-sharing switch 140B prevents a direct conductive connection between the connection node 104 and the charge-sharing node 155B.

Consequently, during the time duration $\Delta t_L$ after the CSL time $t_L[n]$, for the integer n that is equal to 4k−2, 4k−1, 4k+2, or 4k+3, the voltage signal $V_{osc\_QP}$ at the connection node 103 and the voltage signal $V_{osc\_QN}$ at the connection node 105 are both modified, because of the conductive connection between the charge-sharing node 155A and the connection node 103 and the conductive connection between the charge-sharing node 155B and the connection node 105. At the CSL time $t_L[n]$, the voltage signal $V_{osc\_QP}$ at the connection node 103 is modified towards the target voltage $V_{tgA}[n]$ on the charge-sharing node 155A, while the voltage signal $V_{osc\_QN}$ at the connection node 105 is modified towards the target voltage $V_{tgB}[n]$ on the charge-sharing node 155B.

Figure 3H:
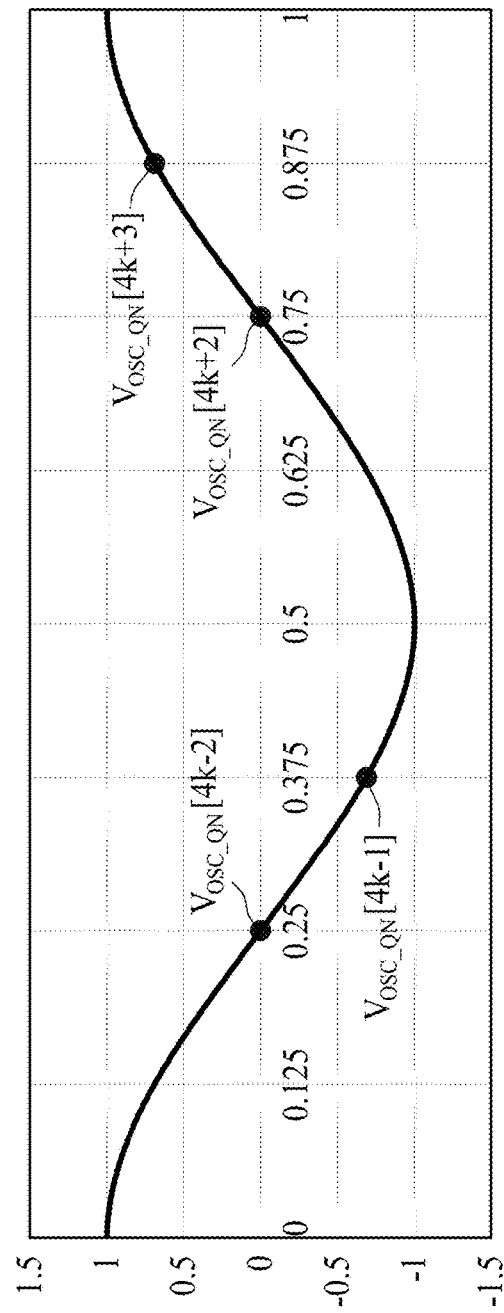
FIG. 3H is a waveform of the voltage signal $V_{osc\_QN}$ at a connection node with CS locking points identified on the waveform, in accordance with some embodiments.

Each CSL time $t_L[n]$ (for the integer n that is equal to 4k−2, 4k−1, 4k+2, or 4k+3) corresponds to a first CS locking point in FIG. 3E on the waveform of the voltage signal $V_{osc\_QP}$ and a second CS locking point in FIG. 3H on the waveform of the voltage signal $V_{osc\_QN}$.

The CS locking points in FIG. 3E include $V_{osc\_QP}[4k−2]$, $V_{osc\_QP}[4k−1]$, $V_{osc\_QP}[4k+2]$, and $V_{osc\_QP}[4k+3]$. At each CS locking point, the waveform of the voltage signal $V_{osc\_QP}$ is corrected based on the voltage on the charge-sharing node 155A at the same CSL time $t_L[n]$. For example, the voltage signal $V_{osc\_QP}$ of the connection node 103 at the CS locking point $V_{osc\_QP}[4k+2]$ is corrected based on the corresponding voltage $V_{tgA}[4k+2]$ of the charge-sharing node 155A, and the voltage signal $V_{osc\_QP}$ of the connection node 103 at the CS locking point $V_{osc\_QP}[4k+3]$ is corrected based on the corresponding voltage $V_{tgA}[4k+3]$ of the charge-sharing node 155A.

The CS locking points in FIG. 3H include $V_{osc\_QN}[4k−2]$, $V_{osc\_QN}[4k−1]$, $V_{osc\_QN}[4k+2]$, and $V_{osc\_QN}[4k+3]$. At each CS locking point, the waveform of the voltage signal $V_{osc\_QN}$ is corrected based on the voltage on the charge-sharing node 155B at the same CSL time $t_L[n]$. For example, the voltage signal $V_{osc\_QN}$ of the connection node 105 at the CS locking point $V_{osc\_QN}[4k+2]$ is corrected based on the voltage $V_{tgB}[4k+2]$ of the charge-sharing node 155B, and the voltage signal $V_{osc\_QN}$ of the connection node 105 at the CS locking point $V_{osc\_QN}[4k+3]$ is corrected based on the voltage $V_{tgA}[4k+3]$ of the charge-sharing node 155B.

Figure 5A:
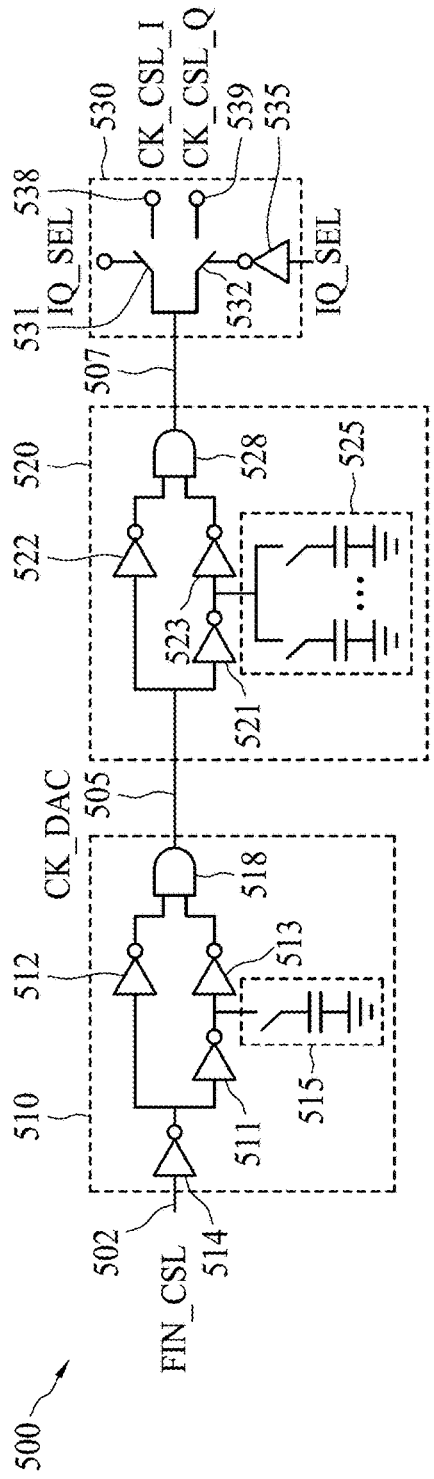
FIG. 5A is a schematic diagram of a pulse generation circuit, in accordance with some embodiments.

In some embodiments, the DAC control signal CK_DAC, the in-phase CSL control signal CK_CSL_I, and the quadrature CSL control signal CK_CSL_Q are generated by a pulse generation circuit. FIG. 5A is a schematic diagram of a pulse generation circuit 500, in accordance with some embodiments. The pulse generation circuit 500 includes a DAC pulse generator 510, a CSL pulse generator 520, and a pulse selector 530. In FIG. 5A, a CSL clock signal FIN_CSL is received by the pulse generation circuit 500 at the input 502, the DAC control signal CK_DAC is generated at the output 505 of the DAC pulse generator 510, and the CSL control signals CK_CSL_I and CK_CSL_Q are correspondingly generated at the outputs 538 and 539 of the pulse selector 530. The CSL phase selection signal IQ_SEL received by the pulse selector 530 determines whether the CSL control signal CK_CSL_I is generated at the output 538 or the CSL control signal CK_CSL_Q is generated at the output 539.

The DAC pulse generator 510 includes inverters 511-514, an AND gate 518, and a capacitor bank circuit 515. The output of the inverter 514 is connected to a first input of the AND gate 518 through a first path having the inverter 512 and connected to a second input of the AND gate 518 through a second path having the inverters 511 and 513. The delay time difference between the first path and the second path determines the pulse width at the output 505 of the AND gate 518. The capacitor bank circuit 515, which is connected to the connection node between of the inverter 511 and the inverter 513, is operative to change the delay time of the second path and consequently change the pulse width of the DAC pulse.

The CSL pulse generator 520 includes inverters 521-523, an AND gate 528, and a capacitor bank circuit 525. The output 505 of the DAC pulse generator 510 is connected to a first input of the AND gate 528 through a first path having the inverter 522 and connected to a second input of the AND gate 528 through a second path having the inverters 521 and 523. The delay time difference between the first path and the second path determines the pulse width of the CSL control signal at the input 507 of the pulse selector 530. The capacitor bank circuit 525, which is connected to the connection node between the inverter 521 and the inverter 523, is operative to change the delay time of the second path and consequently change the pulse width of the CSL control signal at the output 538 or the output 539.

The pulse selector 530 includes a first switch 531 and a second switch 532. The first switch 531 is connected between the input 507 of the pulse selector 530 and the output 538 of the pulse selector 530. The second switch 532 is connected between the input 507 of the pulse selector 530 and the output 539 of the pulse selector 530. The first switch 531 is directly controlled by the CSL phase selection signal IQ_SEL, and the second switch 532 is controlled by the CSL phase selection signal IQ_SEL through an inverter 535. When the CSL phase selection signal IQ_SEL is at the logic HIGH, the first switch 531 is at the connected state and while the second switch 532 is at the disconnected state. When the CSL phase selection signal IQ_SEL is at the logic HIGH, the first switch 531 is at the disconnected state and while the second switch 532 is at the connected state.

Figure 5B:
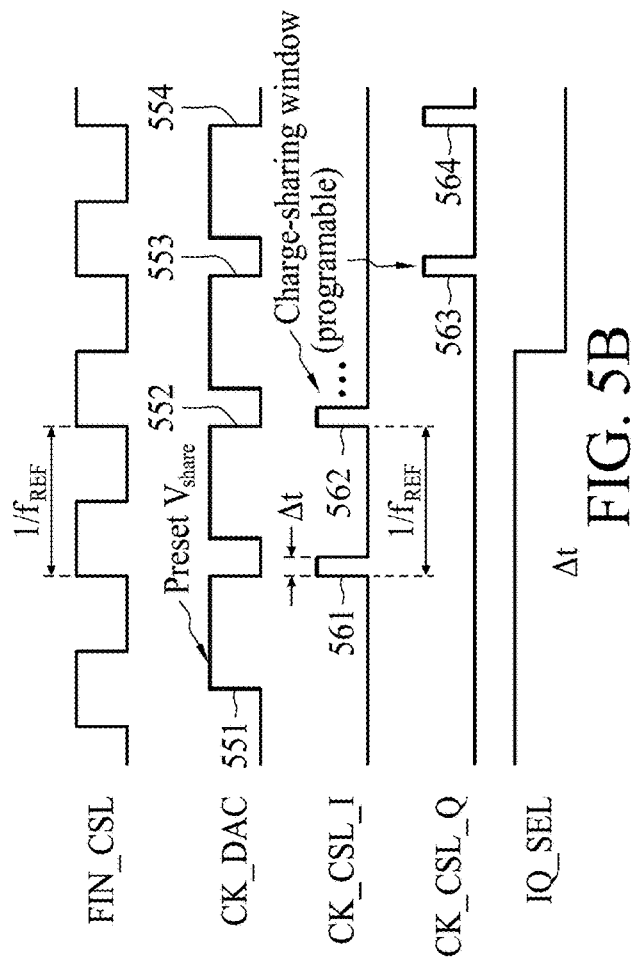
FIG. 5B are waveforms of the signals at various input and output terminals of the pulse generation circuit in FIG. 5A, in accordance with some embodiments.

FIG. 5B are waveforms of the signals at various input and output terminals of the pulse generation circuit 500 in FIG. 5A, in accordance with some embodiments. In some embodiments, the CSL clock signal FIN_CSL in FIG. 5B is generated from a reference oscillation signal by gating the reference oscillation signal with a clock gating circuit, and the CSL clock signal has a same frequency as the reference frequency $f_{REF}$ of the reference oscillation signal. The time period of the CSL clock signal FIN_CSL is $1/f_{REF}$. The falling edge of each DAC pulse (551, 552, 553, or 554) is aligned with a rising edge of the CSL clock signal FIN_CSL. The rising edge of each CSL control pulse (561, 562, 563, or 564) is also aligned with a rising edge of the CSL clock signal FIN_CSL. The pulse width $T_s$ of each DAC pulse (551, 552, 553, or 554) depends upon the capacitance value of the capacitor bank circuit 515 of the DAC pulse generator 510. The larger the capacitance value of the capacitor bank circuit 515, the smaller the pulse width $T_s$ of each DAC pulse (551, 552, 553, or 554). The pulse width $\Delta t$ of each CSL control pulse (561, 562, 563, or 564) depends upon the capacitance value of the capacitor bank circuit 525 of the CSL pulse generator 520. The larger the capacitance value of the capacitor bank circuit 525, the larger the pulse width $\Delta t$ of each CSL control pulse (561, 562, 563, or 564).

Figure 6:
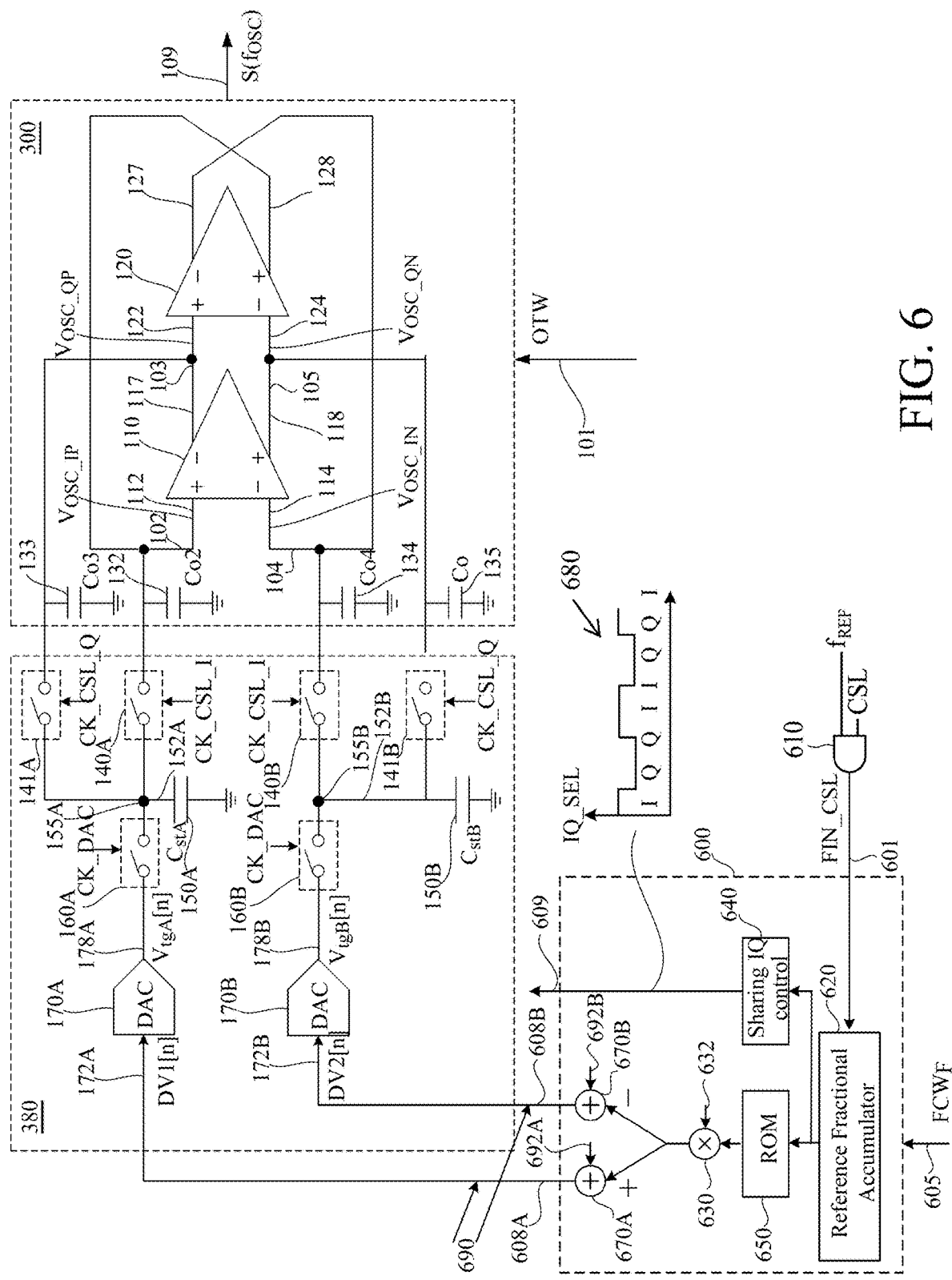
FIG. 6 is a schematic diagram of a Digital Reference Waveform Generator (DRWG) configured to provide the voltage digital words for generating the target voltages at the CS locking points on the waveforms of various connection nodes, in accordance with some embodiments.

FIG. 6 is a schematic diagram of a Digital Reference Waveform Generator (DRWG) 600 configured to provide the voltage digital words for generating the target voltages at the CS locking points on the waveforms of various connection nodes, in accordance with some embodiments. In FIG. 6, the DRWG 600 receives the CSL clock signal FIN_CSL at the input 601 and the frequency control words $FCW_F$ at the input 605, and the DRWG 600 generates the voltage digital words DV1[n] and DV2[n] correspondingly at the outputs 608A and 608B. The outputs 608A and 608B of the DRWG 600 are correspondingly coupled to the input 172A of the DAC 170A and the input 172B of the DAC 170B in the charge-sharing circuit 380. The charge-sharing circuit 380 is coupled to the DCO 300 to provide charge-sharing corrections for the connection nodes 102, 103, 104, and 105 in the DCO 300. The configurations and the operations of the charge-sharing circuit 380 and the DCO 300 are described previously with respect to FIGS. 3A-3H.

In FIG. 6, the DRWG 600 includes a reference fractional accumulator 620, a ROM 650, a sharing IQ control 640, a multiplier 630, and adders 670A and 670B. The reference fractional accumulator 620 receives the CSL clock signal FIN_CSL from the input 601 and the frequency control words $FCW_F$ from the input 605. The output of the reference fractional accumulator 620 is coupled to the sharing IQ control 640 and the ROM 650. The output of the sharing IQ control 640 is the output 609 of the DRWG 600 for providing the CSL phase selection signal IQ_SEL. The output of the ROM 650 is connected to the multiplier 630. The output of the multiplier 630 is coupled to both adders 670A and 670B. The output of the adders 670A is the output 608A of the DRWG 600 for providing the voltage digital words DV1[n]. The output of the adders 670B is the output 608B of the DRWG 600 for providing the voltage digital words DV2[n].

In the DRWG 600 of FIG. 6, the ideal oscillation waveforms at the connection nodes 102 and 103 of the DCO 300 are stored in the ROM 650. In some embodiments, the ideal oscillation waveforms at the connection nodes 102 and 103 of the DCO 300 are stored as a composite oscillation waveform that includes in-phase segments and quadrature segments of a discrete time signal. In some embodiments, the composite oscillation waveform has M data points, and each data point corresponds to an amplitude of the composite oscillation waveform at one discrete time which is labeled from 0 to M−1. Examples of the integer M used in some implementations include 8, 16, 32, and 64. In some embodiments, the integer M used in the implementation is 1024. The amplitude of the composite oscillation waveform at each discrete time is represented by a digital word DV(i), where the index i ranges from 0 to M−1.

In FIG. 6, the reference oscillation signal $f_{REF}$ and a charge-sharing signal CSL are coupled to the input terminals of the AND gate 610, and the CSL clock signal FIN_CSL is generated at the output terminal of the AND gate 610. The CSL clock signal FIN_CSL is generated by gating the reference oscillation signal $f_{REF}$ with the charge-sharing signal CSL. In FIG. 6, a DRWG coupling 690 is formed between the DRWG 600 and the charge-sharing circuit 380. The DRWG coupling 690 includes a first connection between the output 608A of the DRWG 600 and the input 172A of the DAC 170A and a second connection between the output 608B of the DRWG 600 and the input 172B of the DAC 170B.

Figure 7A:
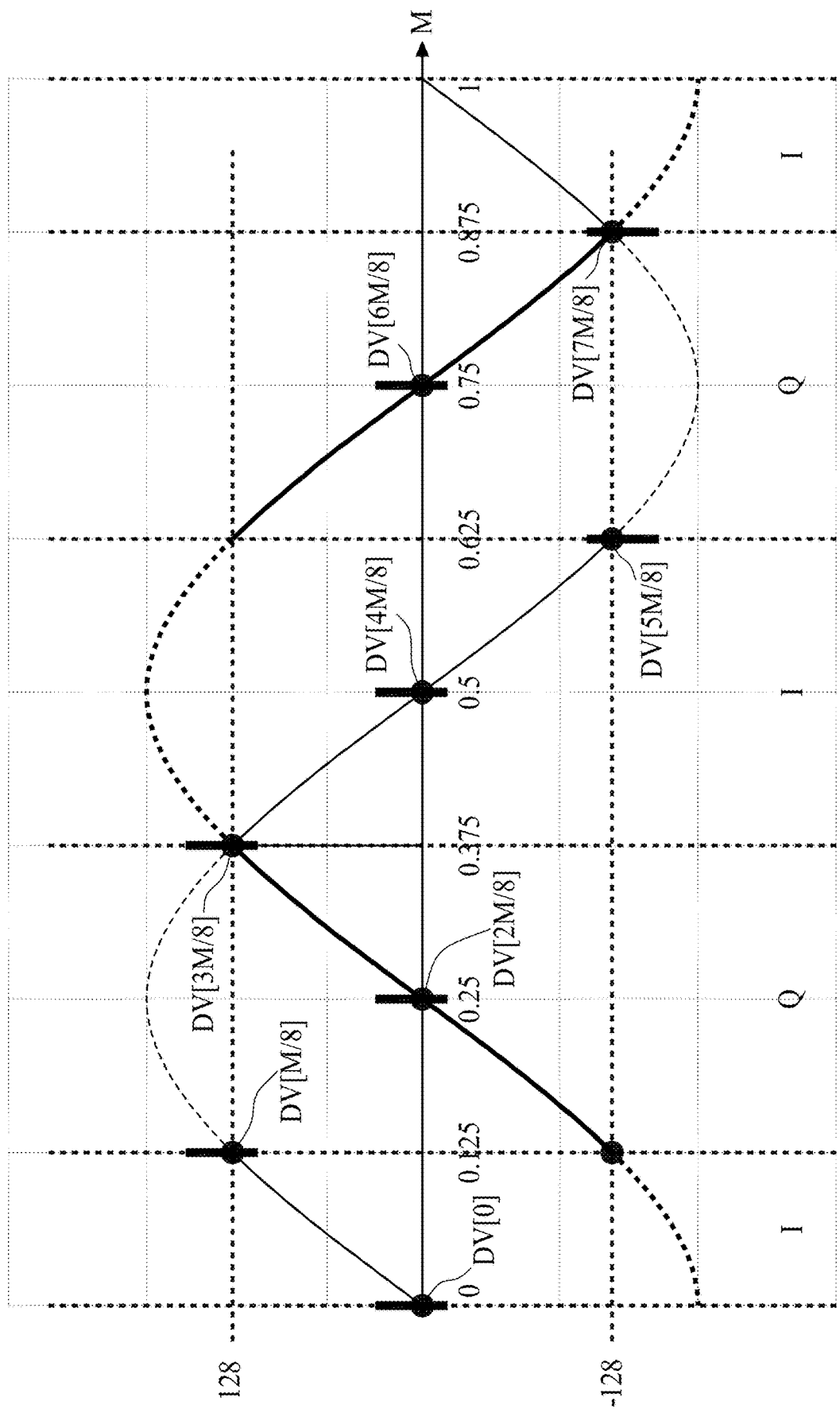
FIGS. 7A-7G is a plot diagram of a composite oscillation waveform, in accordance with some embodiments.

FIG. 7A is a plot diagram of a composite oscillation waveform, in accordance with some embodiments. In FIG. 7A, the digital words for representing the amplitudes of the composite oscillation waveform are 8 bit signed integers. The in-phase "I" segments include the digital words DV(i) having the index i ranging from 0 to M/8, the index i ranging from 3M/8 to 5M/8, and the index i ranging from 7M/8 to M. The quadrature "Q" segments include the digital words DV(i) having the index i ranging from M/8 to 3M/8 and the index i ranging from 5M/8 to 7M/8.

The in-phase "I" segment corresponding to the index ranging from 0 to M/8 represents the amplitudes of the in-phase sinusoidal wave from sin(0) to sin(2π*/8). The in-phase "I" segment corresponding to the index ranging from 3M/8 to 5M/8 represents the amplitudes of the in-phase sinusoidal wave from sin(2π*3/8) to sin(2π*5/8). The in-phase "I" segment corresponding to the index ranging from 7M/8 to M represents the amplitudes of the in-phase sinusoidal wave from sin(2π7/8) to sin(2π). The index range for each in-phase "I" segment is labeled with an identifier "I" in FIG. 7A.

The quadrature "Q" segment corresponding to the index ranging from M/8 to 3M/8 represents the amplitudes of the quadrature sinusoidal wave from sin(2π*/8) to sin(2π*3/8). The quadrature "Q" segment corresponding to the index ranging from 5M/8 to 7M/8 represents the amplitudes of the quadrature sinusoidal wave from sin(2π*5/8) to sin(2π*7/8). The index range for each quadrature "Q" segment is labeled with an identifier "Q" in FIG. 7A.

During the operations of the charge-sharing circuit 380 and the DCO 300, as shown in FIGS. 3A-3H, each DAC pulse has a pulse width corresponding to a pre-charge time period $T_s[n]$, and each CSL control pulse in the CSL control signal (CK_CSL_I or CK_CSL_Q) has a rising edge that starts at a CSL time $t_L[n]$. In some embodiments, such as in the examples as shown in FIGS. 5A-5B, the falling edge of each DAC pulse and the rising edge of each CSL control signal are synchronized with a CSL clock signal FIN_CSL. In FIG. 6, the CSL clock signal FIN_CSL is also provide to the input 601 of the DRWG 600. While the DRWG 600 is clocked with the CSL clock signal FIN_CSL, the voltage digital words DV1[n] and DV2[n] generated by the DRWG 600 correspondingly at the outputs 608A and 608B are synchronized with the DAC pulses. In some embodiments, as shown in FIG. 6, the CSL clock signal FIN_CSL is generated by gating the reference oscillation signal $f_{REF}$ with a charge-sharing signal CSL. Two adjacent CSL control pulses, as shown in FIG. 3B and FIG. 5B, are separated by a time difference of $1/f_{REF}$. Consequently, two adjacent CS locking points on the waveforms in FIGS. 3C-3H are also separated by a time difference of $1/f_{REF}$.

The voltage digital words DV1[n] and DV2[n] for the CS locking points on the waveforms are generated based on the digital words DV[j*M/m] for the selected CS locking points on the composite oscillation waveform stored in the ROM 650. Here, the integer j (which ranges from 0 to m−1) is the index of the selected CS locking point chosen from the data points in the ROM 650, and the integer m represents the total number of the selected CS locking points on the composite oscillation waveform. The integer M is the number of data points stored in the ROM 650 for the composite oscillation waveform. In the example of FIG. 7A, the integer m is equal 8. The digital words DV[0], DV[M/8], DV[2M/8], DV[3M/8], DV[4M/8], DV[5M/8], DV[6M/8], and DV[7M/8] represent the amplitudes of the selected CS locking points on the composite oscillation waveform in FIG. 7A. The digital words DV[0], DV[M/8], DV[4M/8], and DV[5M/8] are selected from one of the in-phase "I" segments. The digital words DV[2M/8], DV[3M/8], DV[6M/8], and DV[7M/8] are selected from one of the quadrature "Q" segments.

In a specific example, when the integer m=8 and the integer M=32, the digital words for the selected CS locking points are digital words DV[0], DV[4], DV[8], DV[12], DV[16], DV[20], DV[24], and DV[28]. The digital words DV[0], DV[4], DV[16], and DV[20] are selected from one of the in-phase "I" segments. The digital words DV[8], DV[12], DV[24], and DV[28] are selected from one of the quadrature "Q" segments.

In the operation of the DRWG 600 in FIG. 6, at each clock cycle of the CSL clock signal FIN_CSL, one of the digital words for the selected CS locking points in the ROM 650 is converted to a voltage digital word DV1[n] at the outputs 608A and a voltage digital word DV2[n] at the outputs 608B. Specifically, after a digital word DV[j*M/m] in the ROM 650 is chosen based on a data address as specified by the reference fractional accumulator 620, the digital word DV[j*M/m] is send to the adders 670A and 670B. In some embodiments, the digital word DV[j*M/m] fetched from the ROM 650 is sent to the adder 670A directly, while the digital word DV[j*M/m] is sent to the adder 670B after an amplitude inversion operation at the multiplier 630. A wave_slope signal received at the input 632 of the multiplier 630 as determines whether the digital word DV[j*M/m] is subject to the amplitude inversion operation. The voltage digital word DV1[n] at the outputs 608A is generated from the adder 670A after a common mode signal wave_cm is added to the digital word received from the multiplier 630. The voltage digital word DV2[n] at the outputs 608B is generated from the adder 670B after a common mode signal wave_cm is added to the digital word received from the multiplier 630.

Before the digital word DV[j*M/m] is fetched from the ROM 650, the data address for the digital word DV[j*M/m] is specified by the reference fractional accumulator 620. The reference fractional accumulator 620 also specifies the type of the segment on which the digital word DV[j*M/m] is located and provides the type of the segment associating the digital word DV[j*M/m] to the sharing IQ control 640. Based on the type of the segment associating the digital word DV[j*M/m], the CSL phase selection signal IQ_SEL is generated at the output 609 of the sharing IQ control 640, to identify the type of the segment from which the voltage digital words DV1[n] and DV2[n] are created from the digital word DV[j*M/m]. In some embodiments, the CSL phase selection signal IQ_SEL is at the logic HIGH when the digital word DV[j*M/m] is on an in-phase "I" segment, but the CSL phase selection signal IQ_SEL is at the logic LOW when the digital word DV[j*M/m] is on a quadrature "Q" segment.

The CSL phase selection signal IQ_SEL at the output 609 of the sharing IQ control 640 is coupled to the pulse selector 530 of the pulse generation circuit 500 in FIG. 5A. If each of the voltage digital words DV1[n] and DV2[n] is on one of the in-phase "I" segments, a CSL control pulse for the control signal CK_CSL_I is generated by the pulse generation circuit 500. If each of the voltage digital words DV1[n] and DV2[n] is on one of the quadrature "Q" segments, a CSL control pulse for the control signal CK_CSL_Q is generated by the pulse generation circuit 500.

During operation, in the example of a composite oscillation waveform in FIG. 7A, the digital words DV[0], DV[M/8], DV[2M/8], DV[3M/8], DV[4M/8], DV[5M/8], DV[6M/8], and DV[7M/8] are sequentially fetched from the ROM 650 and correspondingly converted the voltage digital words DV1[n] and DV2[n]. The first CS locking point in an oscillation cycle is represented by the digital word DV[0], and the last CS locking point in an oscillation cycle is represented by the digital word DV[7M/8]. After the digital word DV[7M/8] for the last CS locking point in the current oscillation cycle is fetched and converted, the digital word DV[0] for the first CS locking point in the next oscillation cycle is fetched and converted, then the digital words for the remaining CS locking points following the first CS locking point are sequentially fetched and converted. This process of outputting the voltage digital words for the CS locking points are repeated one oscillation cycle after another oscillation cycle.

As each of the voltage digital words DV1[n] and DV2[n] for the CS locking points are generated at the outputs 608A and 608B of the DRWG 600 in FIG. 6, the corresponding CSL phase selection signal IQ_SEL is generated in synchronization at the output 609 of the DRWG 600. The inset 680 of FIG. 6 is an example output of the CSL phase selection signal IQ_SEL synchronized to the clock cycles of the CSL clock signal FIN_CSL. The output pattern "IQQIIQQI" represent the CSL phase selection signal IQ_SEL during a time period when the digital words DV[M/8], DV[2M/8], DV[3M/8], DV[4M/8], DV[5M/8], DV[6M/8], DV[7M/8], and DV[0] in FIG. 7A are sequentially fetched and converted.

In the DRWG 600 of FIG. 6, before the data addresses for the CS locking points and the associated type of the segments are specified by the reference fractional accumulator 620, the total number of the selected CS locking points on the composite oscillation waveform is determined. In some embodiments, the total number (e.g., the integer m) of the selected CS locking points per period $1/f_{osc}$ of the oscillation waveform is determined by the frequency control words $FCW_F$ received at the input 605 of the DRWG 600, based on the equation $m=1/FCW_F$. In the example of FIG. 7A, m=8, and $FCW_F$=0.125. Other examples are show in FIGS. 7B-7E, which provide various number of selected CS locking points for one period $1/f_{osc}$ of the oscillation waveform.

Figure 7B:
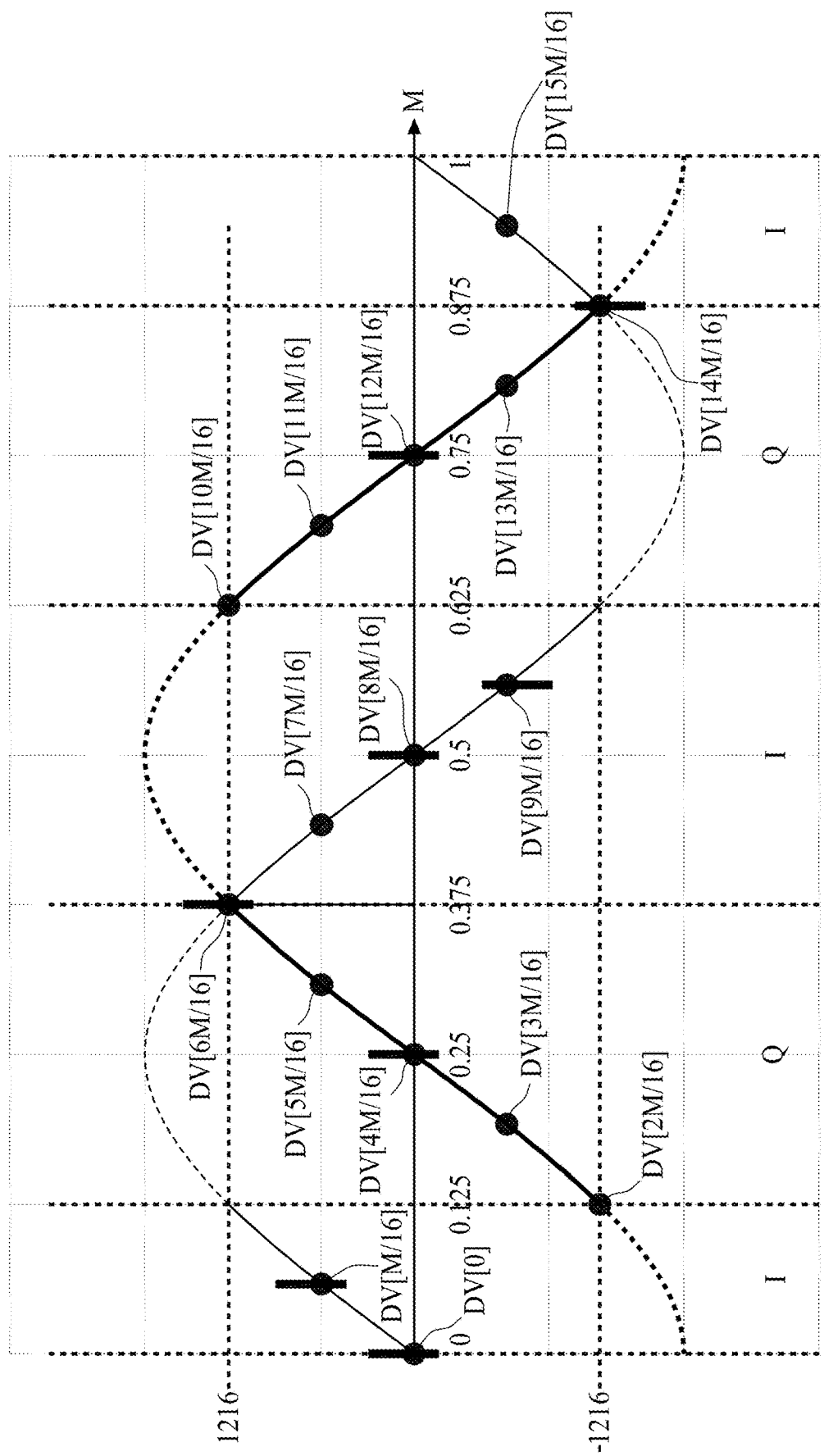
Figure 7C:
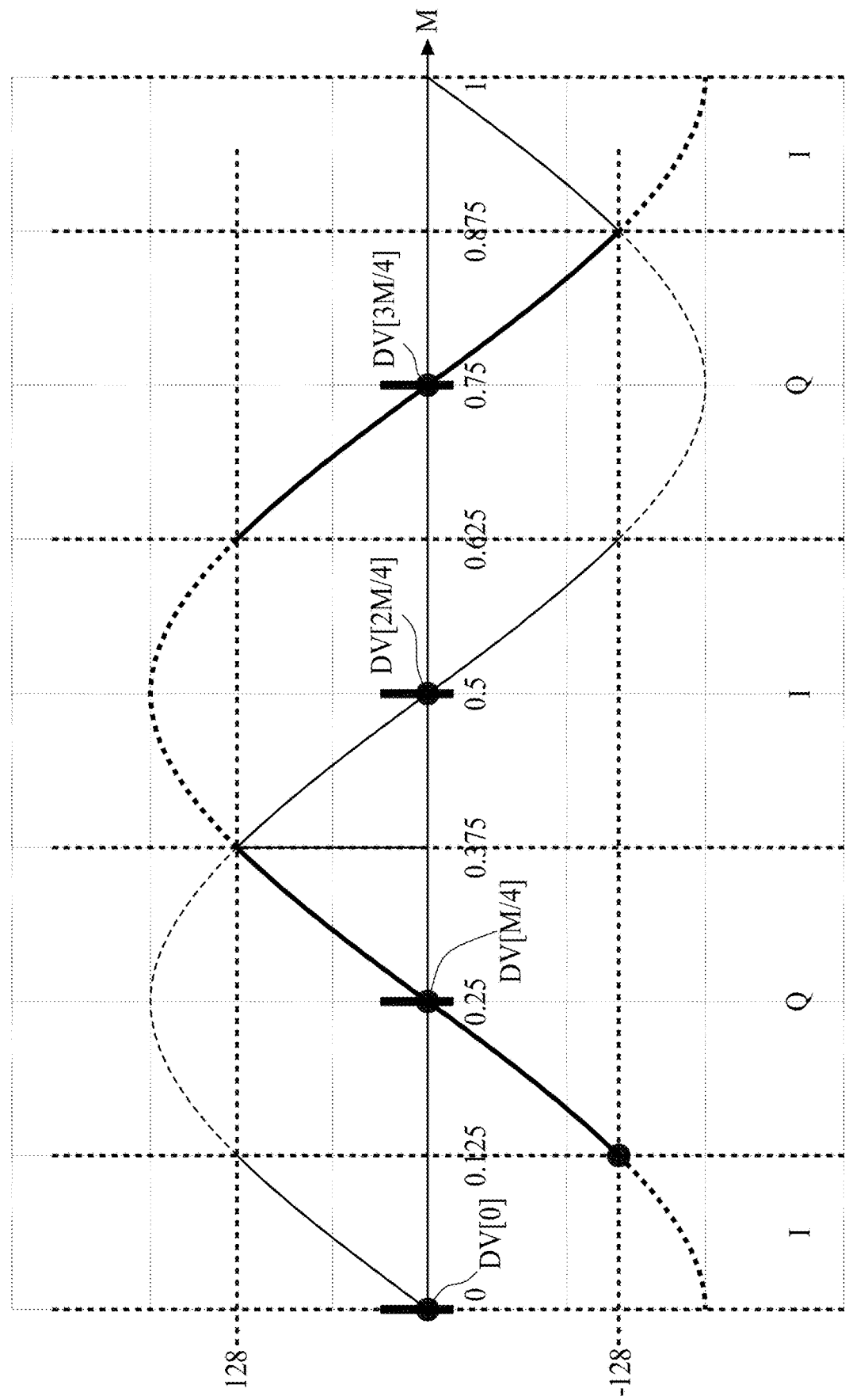
Figure 7D:
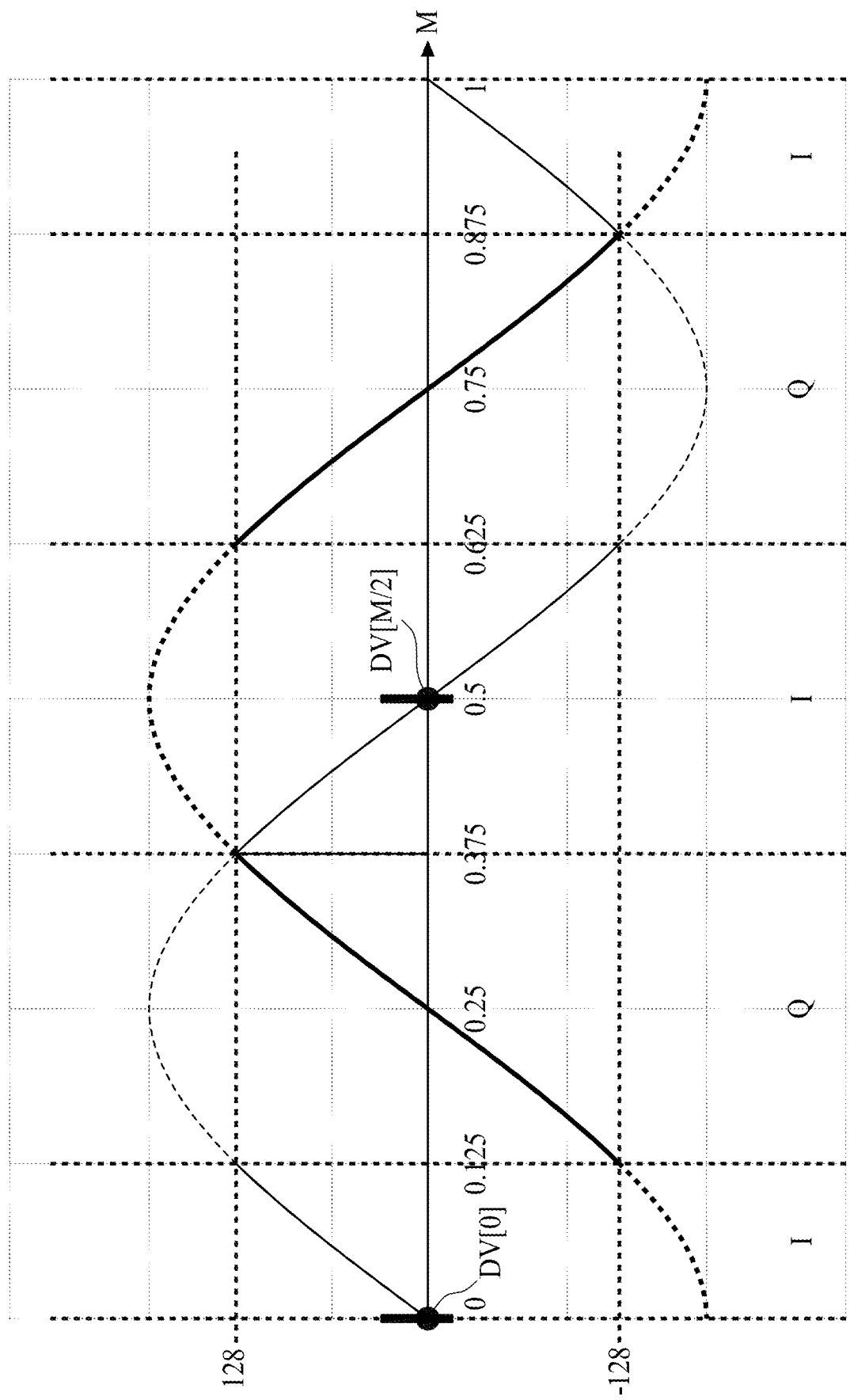
Figure 7E:
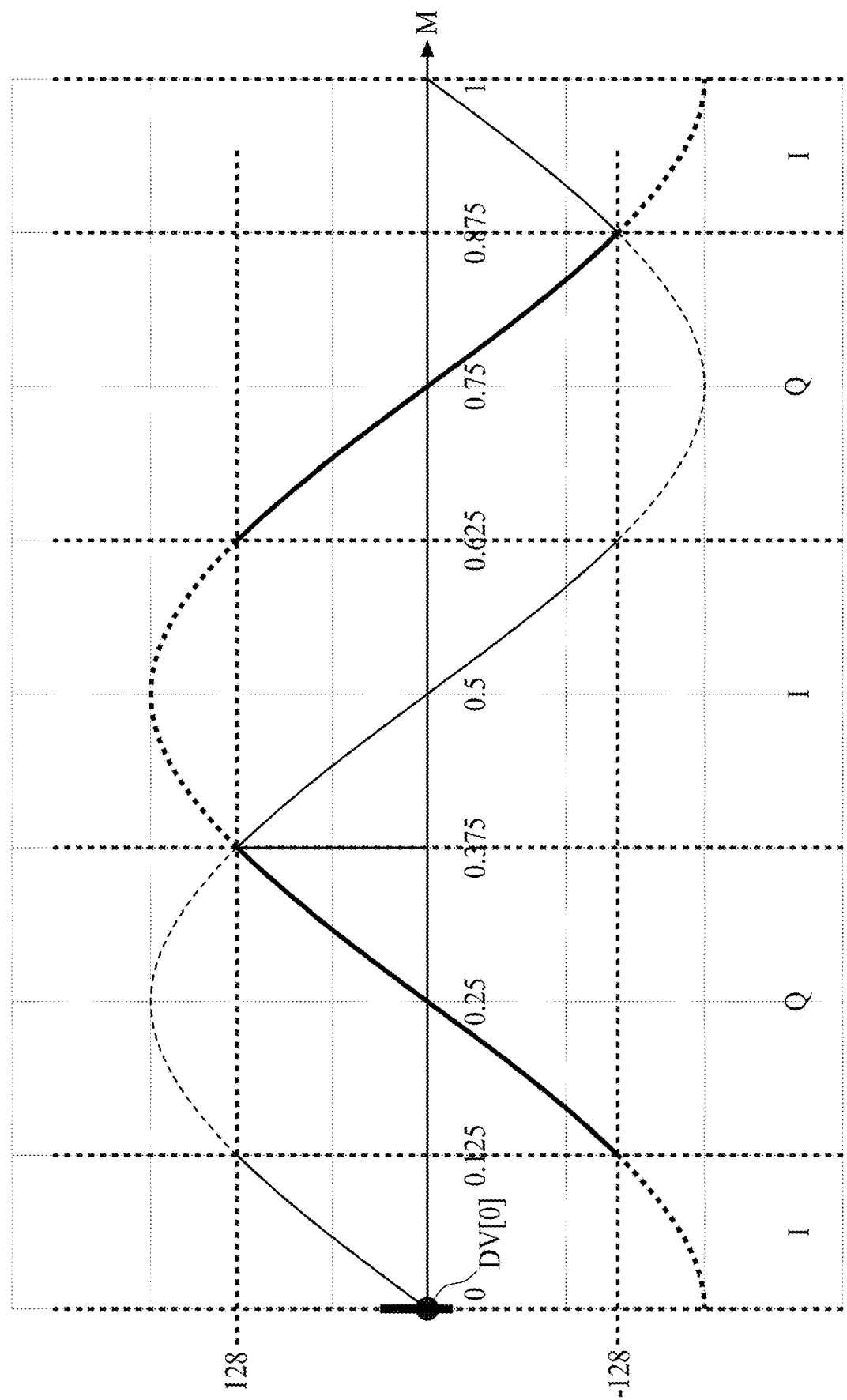
Figure 7F:
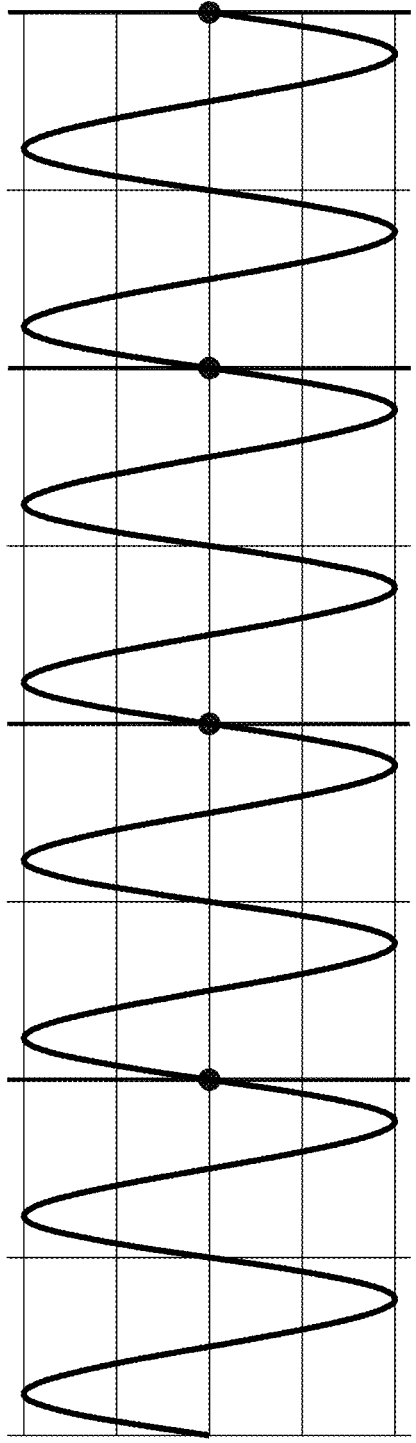
Figure 7G:
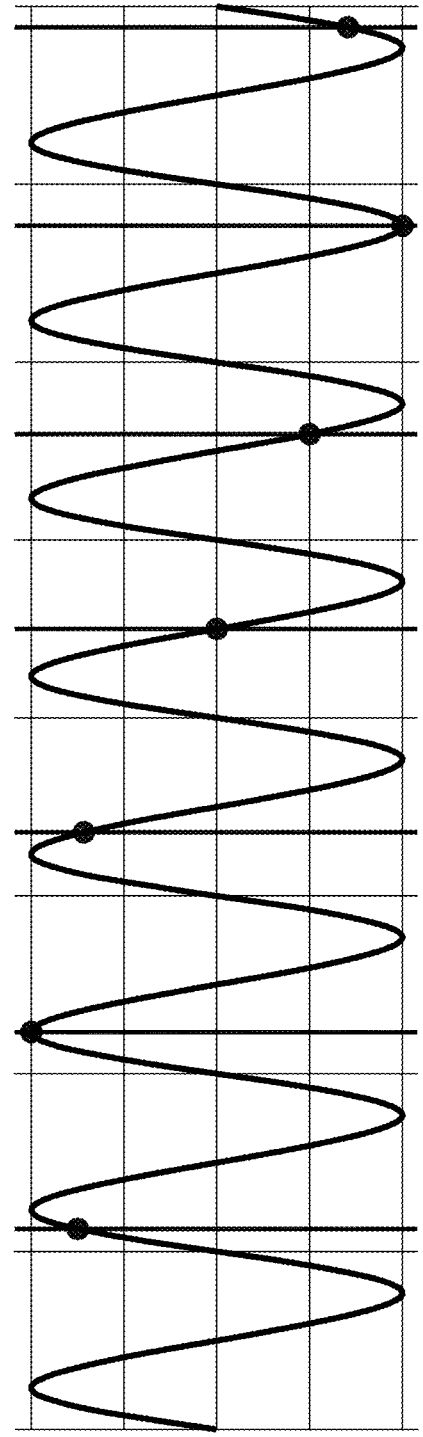

In FIG. 7B, the frequency control words $FCW_F$=0.0625, and sixteen (m=16) CS locking points are selected for one period $1/f_{osc}$ of the oscillation waveform. In FIG. 7C, frequency control words $FCW_F$=0.25, and four (m=4) CS locking points are selected for one period $1/f_{osc}$ of the oscillation waveform. In FIG. 7D, the frequency control words $FCW_F$=0.5, and two (m=2) CS locking points are selected for one period $1/f_{osc}$ of the oscillation waveform. In FIG. 7E, the frequency control words $FCW_F$=1, and one (m=1) CS locking point is selected for one period $1/f_{osc}$ of the oscillation waveform. FIGS. 7F-7G provide more examples of selecting CS locking points for an oscillation waveform. In FIG. 7F, the frequency control words $FCW_F$=2, and one CS locking point is selected for every two periods of the oscillation waveform. In FIG. 7G, the frequency control words $FCW_F$=1.125, and nine CS locking points are selected for every eight periods of the oscillation waveform because $FCW_F$=9/8.

In the embodiments of FIG. 1A, FIG. 2A, or FIG. 3A, each of the DCO includes two differential inverters. The number of differential inverters in the DCO that is coupled to the charge-sharing circuit is not limited to two. Other selections of the total number of differential inverters in the DCO that is coupled to the charge-sharing circuit are within the contemplated scope of the present disclosure. For example, in some embodiments, three differential inverters are used to implement the DCO that is coupled to the charge-sharing circuit. In some embodiments, four differential inverters are used to implement the DCO that is coupled to the charge-sharing circuit. Furthermore, in some embodiments, the differential inverters in the DCO that is coupled to the charge-sharing circuit are implemented as pseudo differential inverters.

Figure 8A:
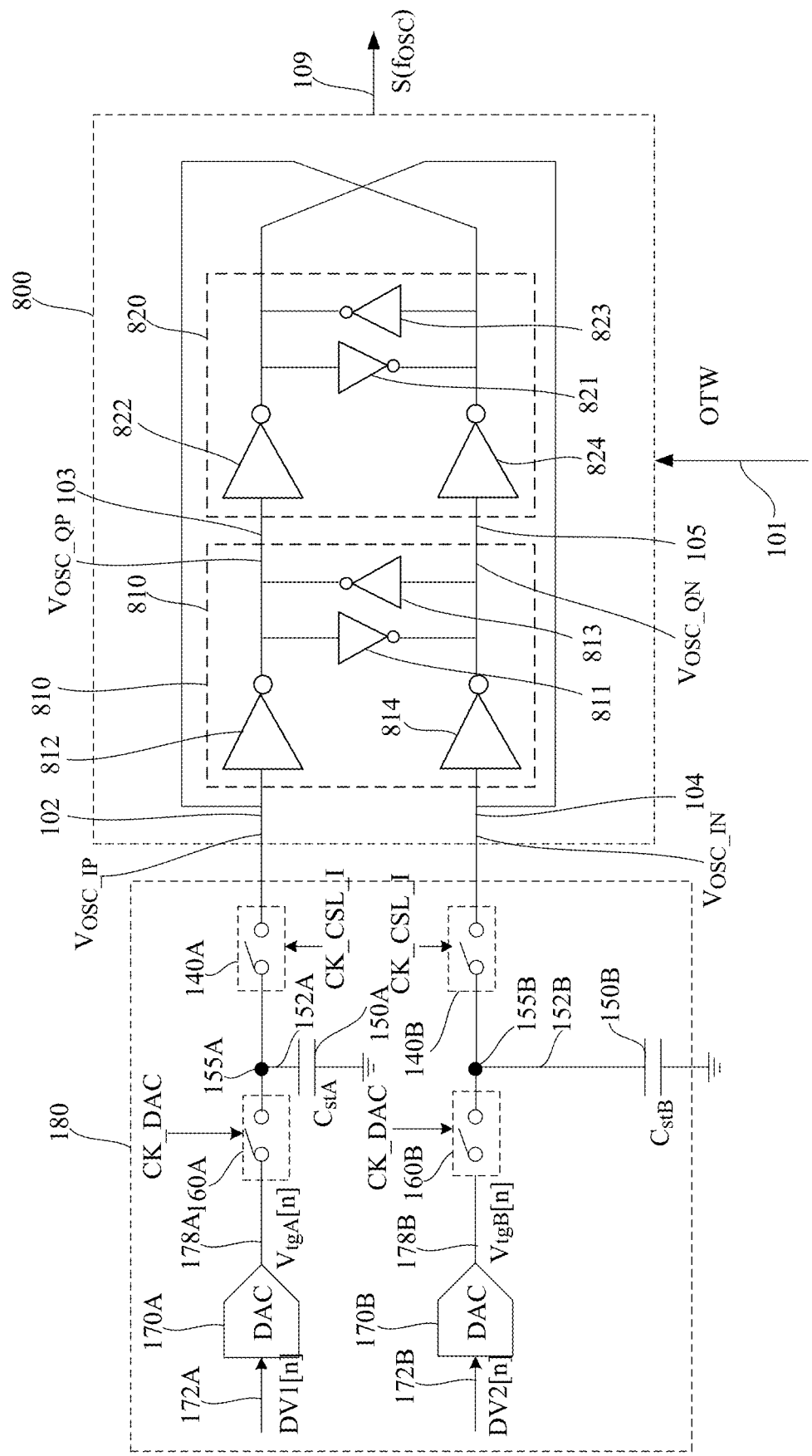
FIGS. 8A-8C are schematic diagrams of a ring based DCO which is coupled to a charge-sharing circuit and includes pseudo-differential inverters, in accordance with some embodiments.
Figure 8B:
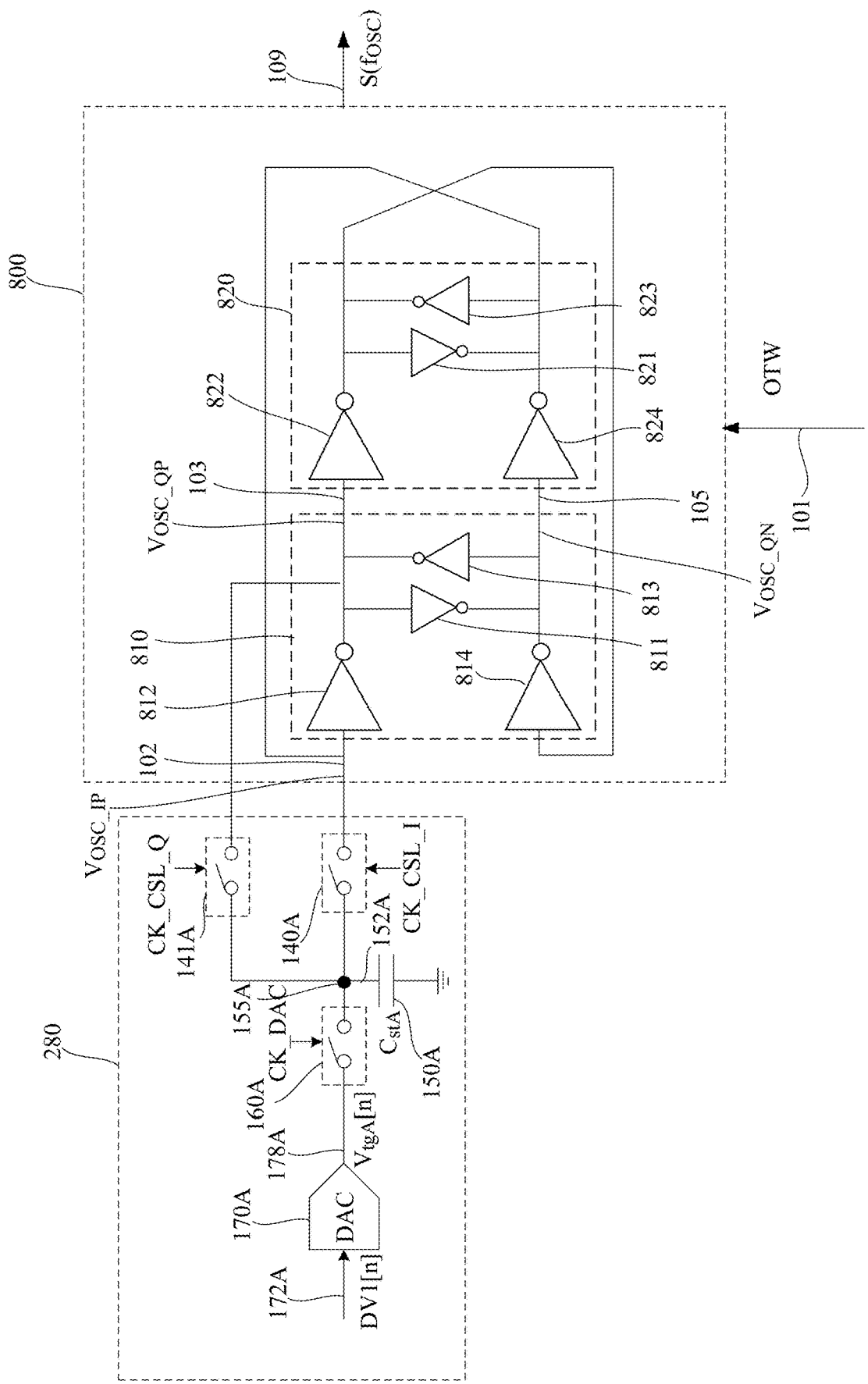
Figure 8C:
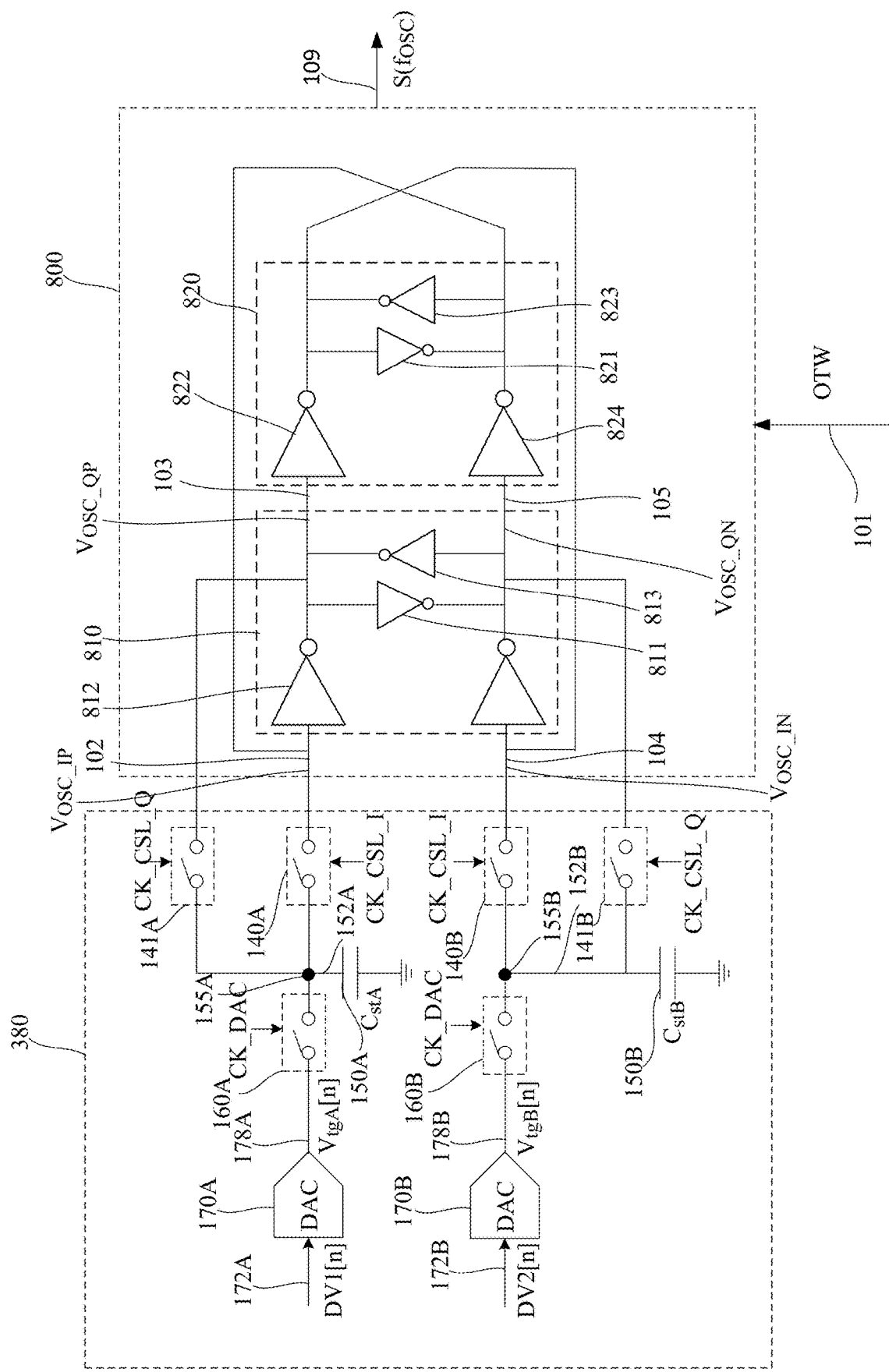

FIGS. 8A-8C are schematic diagrams of a ring based DCO 800 which is coupled to a charge-sharing circuit and includes pseudo differential inverters, in accordance with some embodiments. In FIGS. 8A-8C, the ring based DCO 800 includes two pseudo differential inverters 810 and 820. The pseudo differential inverter 810 includes inverters 812, 814, 811, and 813. The output of the inverter 812 is connected to both the input of the inverter 811 and the output of the inverter 813. The output of the inverter 814 is connected to both the output of the inverter 811 and the input of the inverter 813. Similarly, the pseudo differential inverter 820 includes inverters 822, 824, 821, and 823. The output of the inverter 822 is connected to both the input of the inverter 821 and the output of the inverter 823. The output of the inverter 824 is connected to both the output of the inverter 821 and the input of the inverter 823. Furthermore, the input of the inverter 812 in the pseudo differential inverter 810 is connected to the output of the inverter 824 in the pseudo differential inverter 820. The input of the inverter 814 in the pseudo differential inverter 810 is connected to the output of the inverter 822 in the pseudo differential inverter 820.

In FIGS. 8A-8C, the connection node 102 is directly connected to the input of the inverter 812, the connection node 104 is directly connected to the input of the inverter 814, the connection node 103 is directly connected to the input of the inverter 822, and the connection node 105 is directly connected to the input of the inverter 824. The node-to-ground capacitor for modeling the charge-sharing process at each of the connection nodes 102, 104, 103, and 105 is not explicitly shown in FIGS. 8A-8C, even though the charge-sharing process at each of the connection node is effected by the corresponding node-to-ground capacitor. The voltage signals at the connection nodes 102, 103, 104, and 105 are identified correspondingly as the voltage signals $V_{osc\_IP}$, $V_{osc\_QP}$, $V_{osc\_IN}$, and $V_{osc\_QN}$. During operation, each of the voltage signals $V_{osc\_IP}$, $V_{osc\_QP}$, $V_{osc\_IN}$, and $V_{osc\_QN}$ is a sinusoidal wave as shown in FIG. 4.

In FIG. 8A, the connection nodes 102 and 104 of the ring based DCO 800 are directly connected to the charge-sharing circuit 180, which is configured to correct the oscillation waveforms at the connection nodes 102 and 104 at various CS locking points. The coupling between the charge-sharing circuit 180 and the connection nodes in the ring based DCO 800 in FIG. 8A is the same as the coupling between the charge-sharing circuit 180 and the connection nodes in the ring based DCO 100 in FIG. 1A.

In FIG. 8B, the connection nodes 102 and 103 of the ring based DCO 800 are directly connected to the charge-sharing circuit 280, which is configured to correct the oscillation waveforms at the connection nodes 102 and 103 at various CS locking points. The coupling between the charge-sharing circuit 280 and the connection nodes in the ring based DCO 800 in FIG. 8B is the same as the coupling between the charge-sharing circuit 280 and the connection nodes in the ring based DCO 200 in FIG. 2A.

In FIG. 8C, four connection nodes (i.e., 102, 103, 104 and 105) of the ring based DCO 800 are directly connected to the charge-sharing circuit 380, which is configured to correct the oscillation waveforms at four connection nodes (i.e., 102, 103, 104 and 105) at various CS locking points. The coupling between the charge-sharing circuit 380 and the connection nodes in the ring based DCO 800 in FIG. 8C is the same as the coupling between the charge-sharing circuit 380 and the connection nodes in the ring based DCO 300 in FIG. 3A.

In some embodiments, when a phase locked loop (PLL) is implemented with a ring based DCO which is coupled to a charge-sharing circuit, the phase jittering of the oscillating signal generated with the PLL is reduced by the charge-sharing processes provided by the charge-sharing circuit. FIGS. 9A-9G are schematic diagrams of PLLs each implemented with a ring based DCO which is coupled with a charge-sharing circuit, in accordance with some embodiments.

In FIGS. 9A-9G, a ring based DCO (e.g., 100, 200, 300, 800, 900) is used to construct a PLL. The PLL includes a frequency divider 920, a Time-to-Digital Converter ("TDC") 940, and a digital filter 950. The output oscillating signal $S(f_{osc})$ from the output terminal 109 of the DCO is coupled to the input 922 of the frequency divider 920. The divided-frequency signal from the output 928 of the frequency divider 920 is coupled to the input 944 of the TDC 940. The TDC 940 generates a digital error signal at the output 948 based on a comparison between the divided-frequency signal received at the input 944 and a reference signal of the loop reference frequency $f_0$ received at the input 942 of the TDC 940. The digital error signal generated by the TDC 940 represents a phase difference between the divided-frequency signal and the reference signal of the loop reference frequency $f_0$. The digital error signal at the output 948 of the TDC 940 is coupled to the input 952 of the digital filter 950, and a filtered digital error signal is generated by the digital filter 950 based on the digital error signal. In some embodiments, an oscillator tuning word OTW is generated by the digital filter 950 base on the filtered digital error signal, and the OTW from the output 958 of the digital filter 950 is coupled to the input 101 of the DCO.

A change of the OTW causes a change of the oscillation frequency $f_{osc}$ of the output oscillating signal $S(f_{osc})$ at the output terminal 109 of the DCO. The change of the oscillation frequency $f_{osc}$ causes a change of the digital error signal at the output 948 of the TDC 940, and the change of the digital error signal further causes a change of the OTW. The feedback loop minimizes the digital error signal and causes the oscillation frequency $f_{osc}$ of the DCO to be locked to N times the loop reference frequency $f_0$, where value of N is the ratio between the oscillation frequency $f_{osc}$ and the frequency of the divided-frequency signal generated by the frequency divider 920.

Figure 9A:
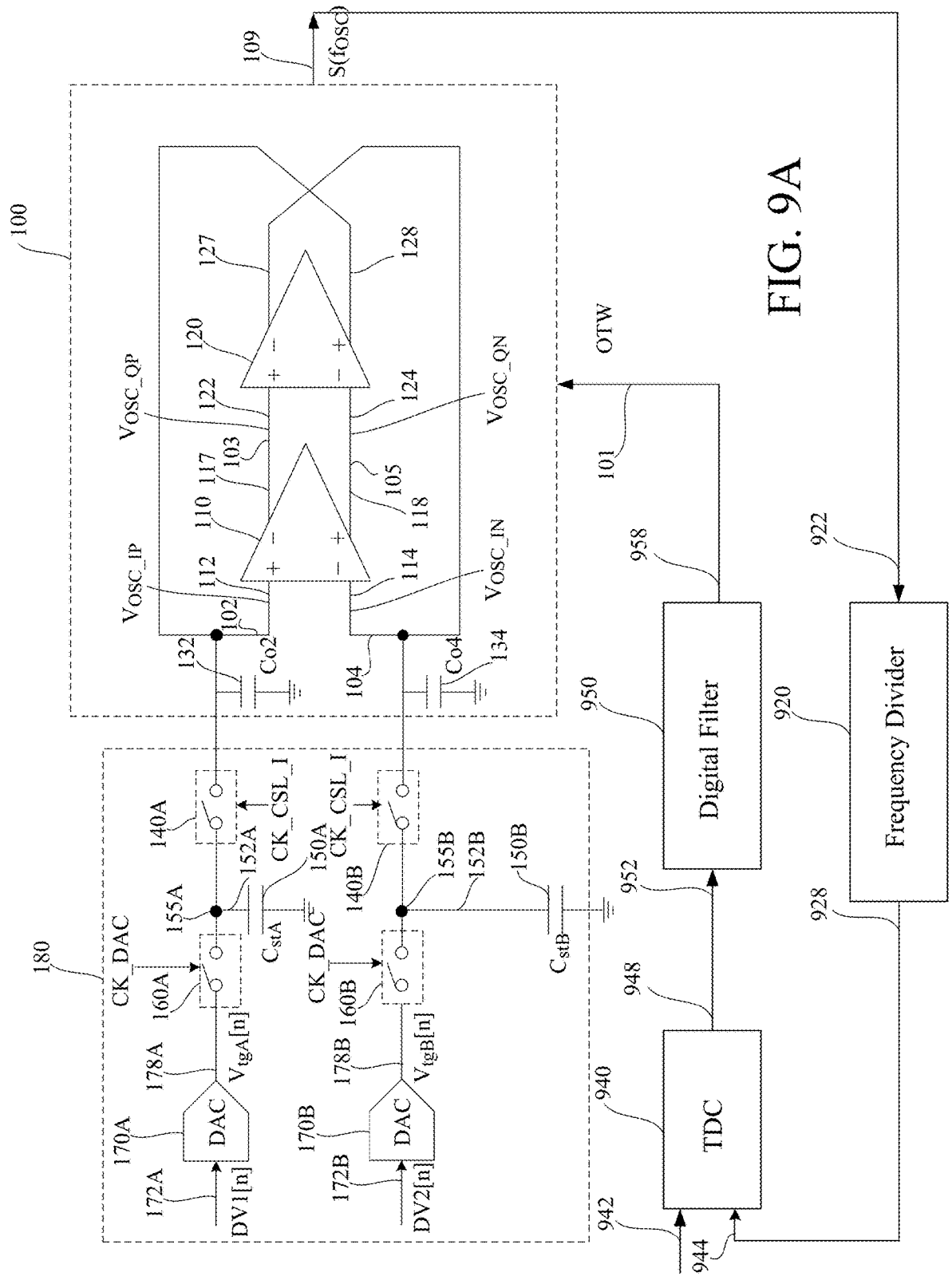
FIGS. 9A-9G are schematic diagrams of PLLs each implemented with a ring based DCO which is coupled with a charge-sharing circuit, in accordance with some embodiments.

In FIG. 9A, the ring based DCO 100 in the PLL is coupled to the charge-sharing circuit 180. The ring based DCO 100 and the charge-sharing circuit 180 in FIG. 9A are the same as the ring based DCO 100 and the charge-sharing circuit 180 in FIG. 1A. The couplings between the ring based DCO 100 and the charge-sharing circuit 180 in FIG. 9A is the same as the couplings between the ring based DCO 100 and the charge-sharing circuit 180 in FIG. 1A.

Figure 9B:
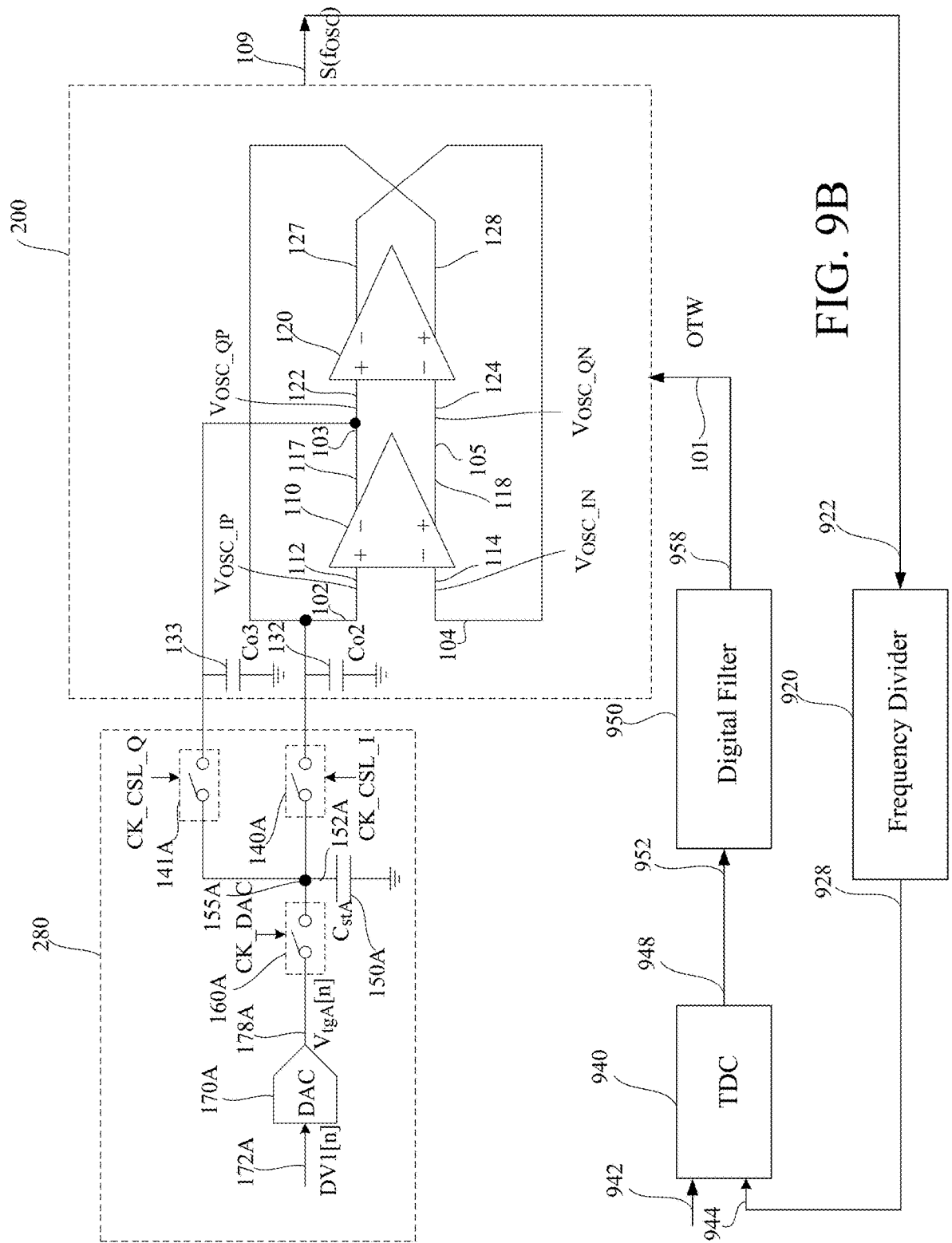

In FIG. 9B, the ring based DCO 200 in the PLL is coupled to the charge-sharing circuit 280. The ring based DCO 200 and the charge-sharing circuit 280 in FIG. 9B are the same as the ring based DCO 200 and the charge-sharing circuit 280 in FIG. 2A. The couplings between the ring based DCO 200 and the charge-sharing circuit 280 in FIG. 9B is the same as the couplings between the ring based DCO 200 and the charge-sharing circuit 280 in FIG. 2A.

Figure 9C:
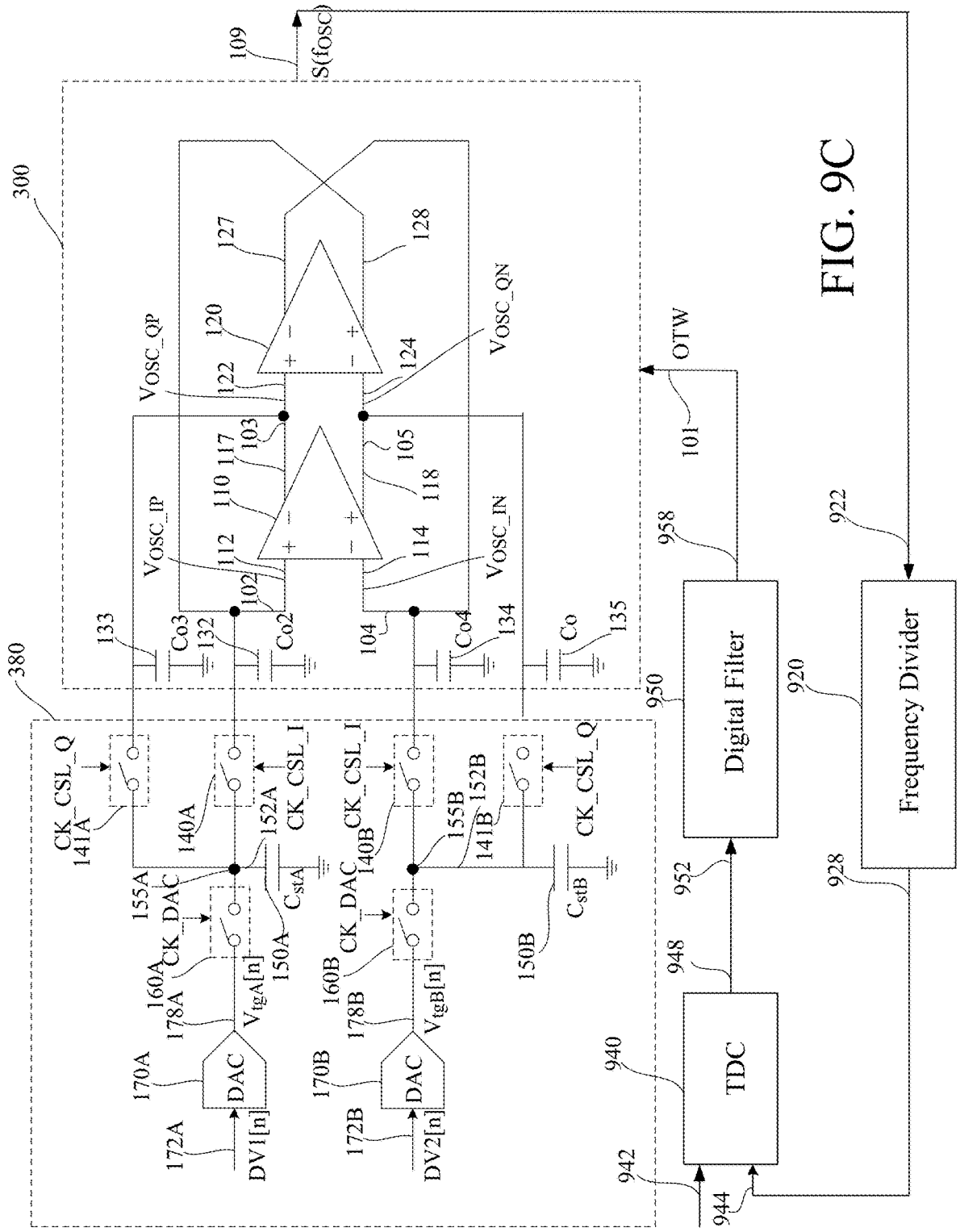

In FIG. 9C, the ring based DCO 300 in the PLL is coupled to the charge-sharing circuit 380. The ring based DCO 300 and the charge-sharing circuit 380 in FIG. 9C are the same as the ring based DCO 300 and the charge-sharing circuit 380 in FIG. 3A. The couplings between the ring based DCO 300 and the charge-sharing circuit 380 in FIG. 9C is the same as the couplings between the ring based DCO 300 and the charge-sharing circuit 380 in FIG. 3A.

Figure 9D:
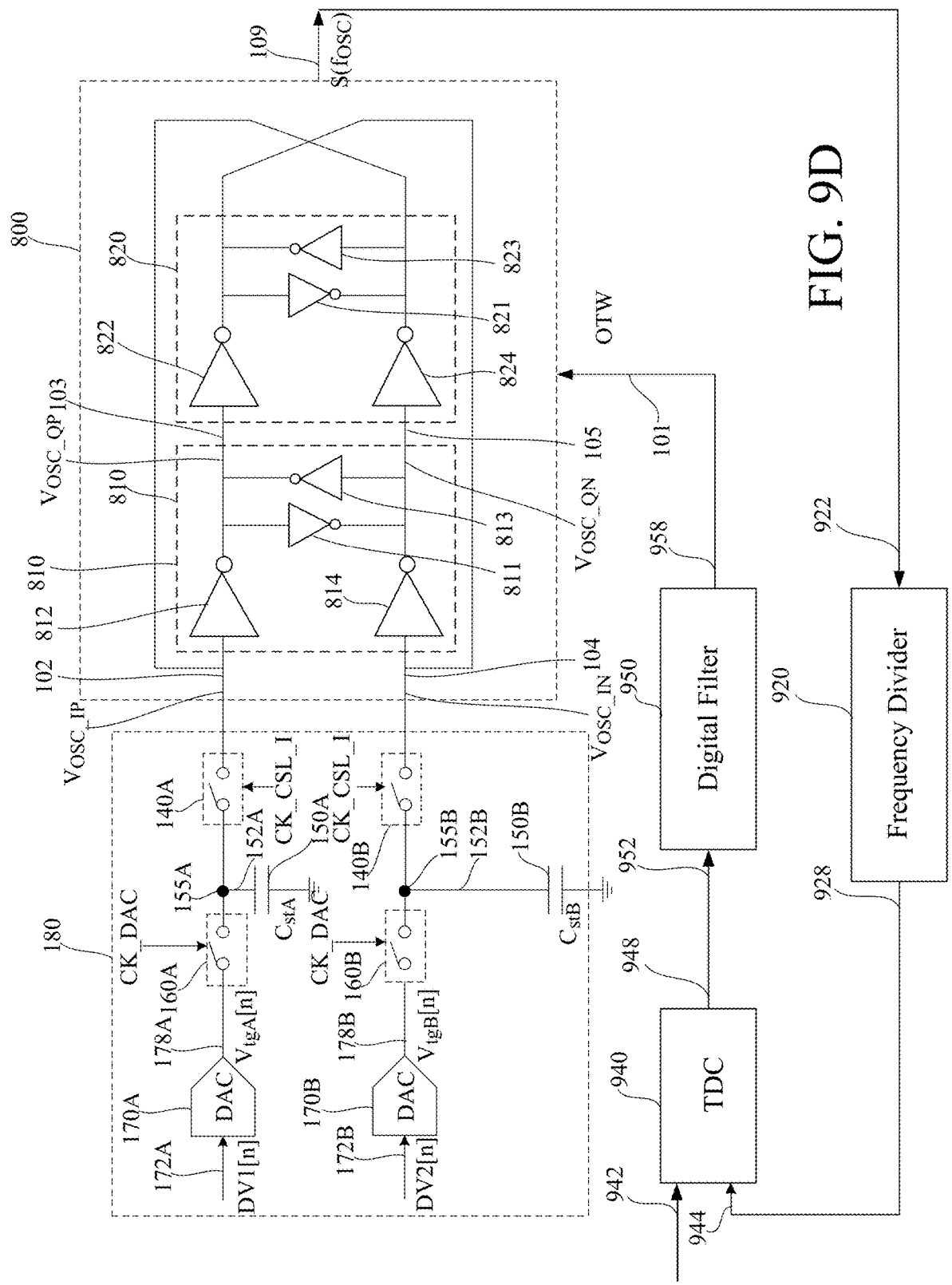
Figure 9E:
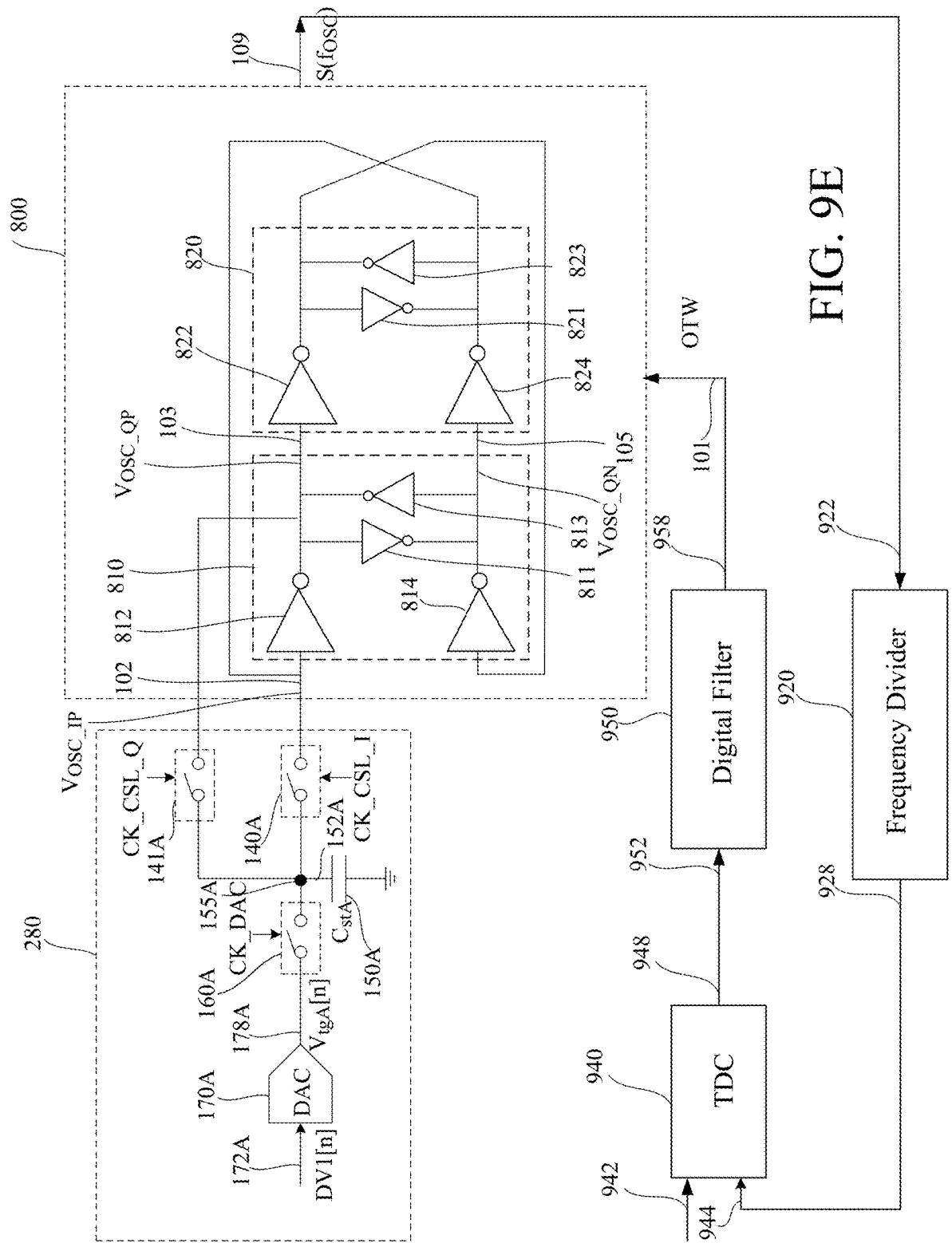
Figure 9F:
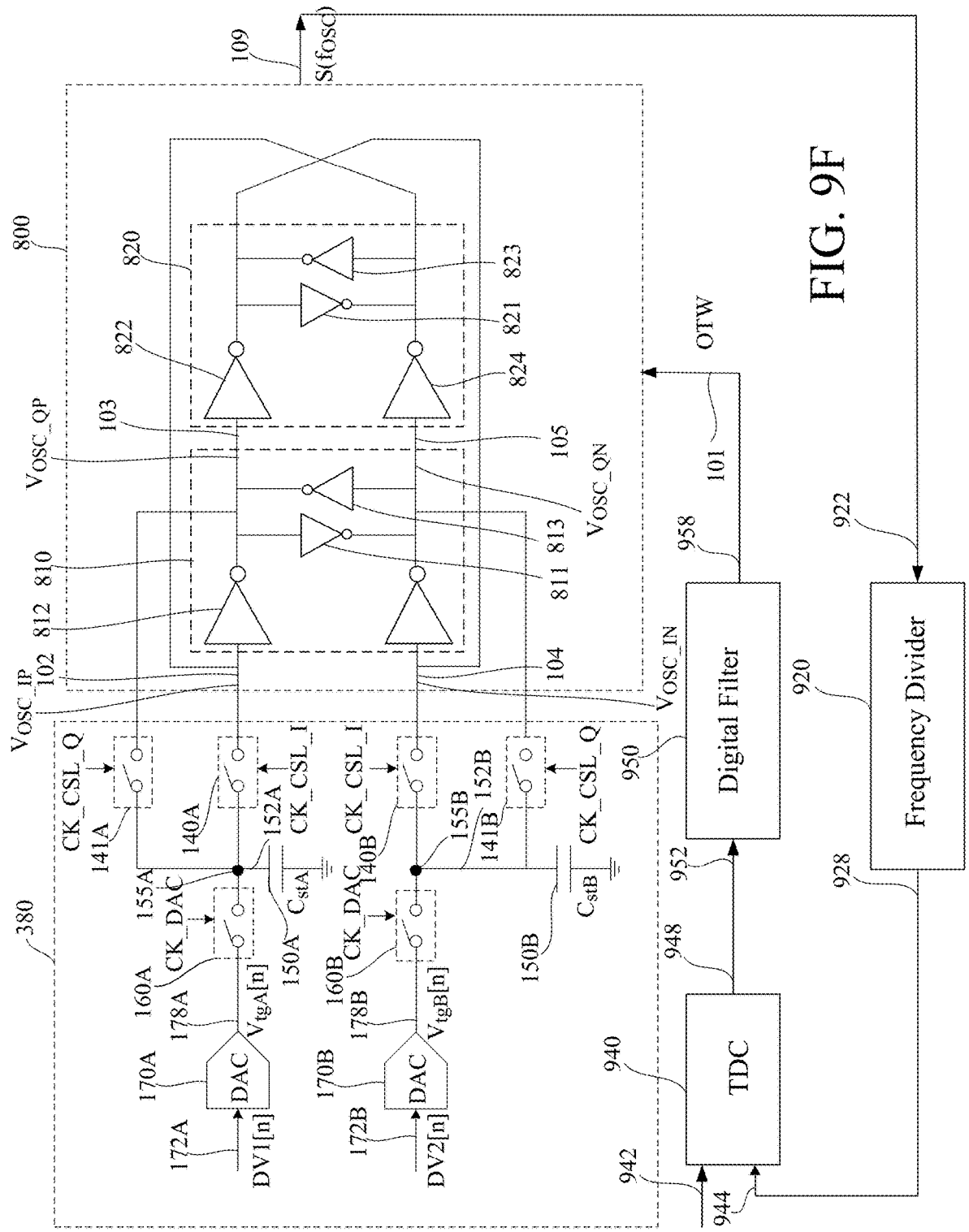

In FIGS. 9D-9F, the ring based DCO 800 in the PLL is coupled to the charge-sharing circuits 180, 280, or 380. The ring based DCO 800 in FIGS. 9D-9F is the same as the ring based DCO 800 in FIGS. 8A-8C. The charge-sharing circuit 180 in FIG. 9D, the charge-sharing circuit 280 in FIG. 9E, and the charge-sharing circuit 380 in FIG. 9F are correspondingly the same as the charge-sharing circuit 180 in FIG. 8A, the charge-sharing circuit 280 in FIG. 8B, and the charge-sharing circuit 380 in FIG. 8C. In FIG. 9D and in FIG. 8A, the coupling between the ring based DCO 800 and the charge-sharing circuit 180 is the same. In FIG. 9E and in FIG. 8B, the coupling between the ring based DCO 800 and the charge-sharing circuit 280 is the same. In FIG. 9F and in FIG. 8C, the coupling between the ring based DCO 800 and the charge-sharing circuit 380 is the same.

Figure 9G:
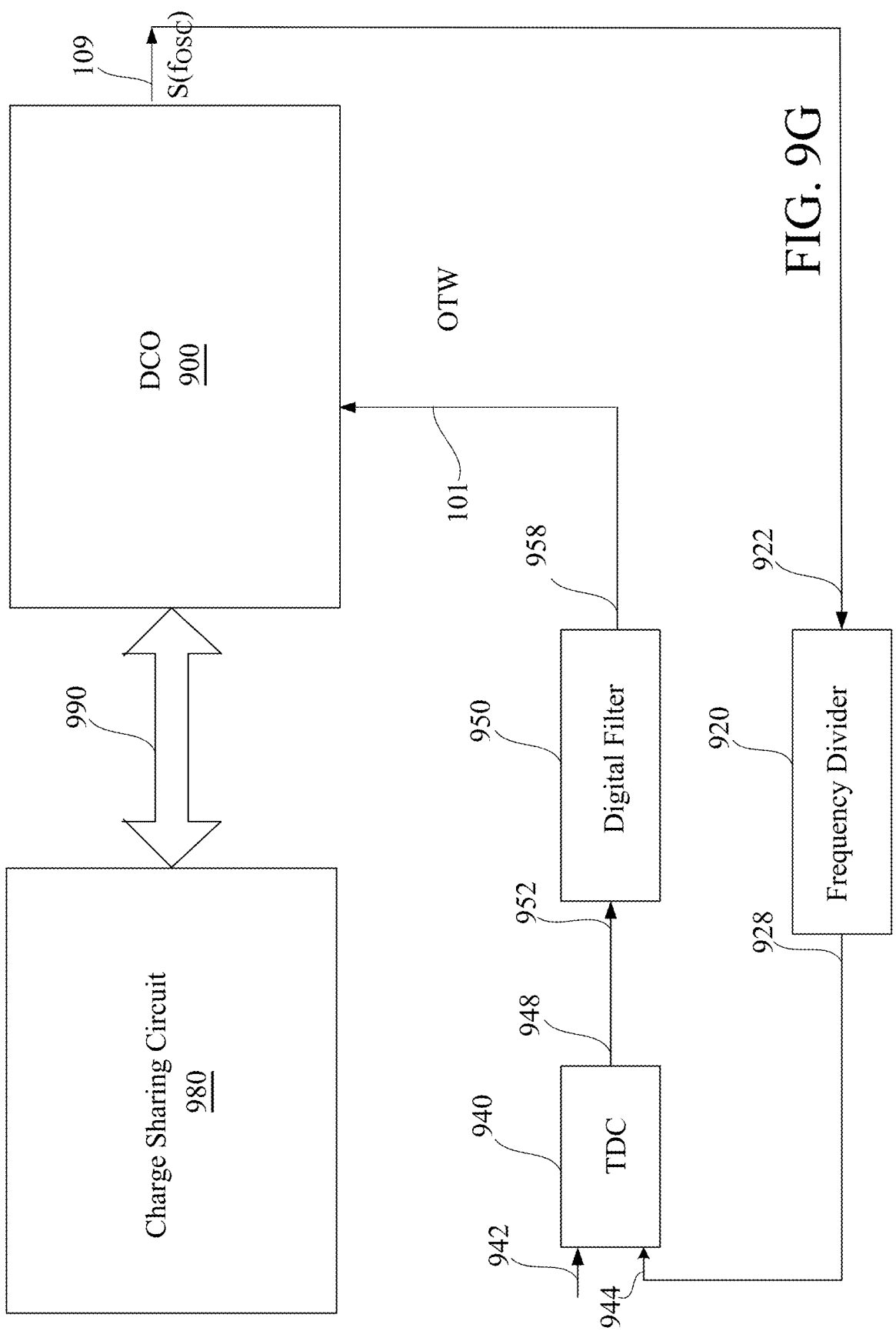

In FIG. 9G, the ring based DCO 900 in the PLL is coupled to the charge-sharing circuit 980. Examples of the ring based DCO 900 include the ring based DCO 100 in FIG. 1A, the ring based DCO 200 in FIG. 2A, the ring based DCO 300 in FIG. 3A, and the ring based DCO 800 in FIGS. 8A-8C. Other implementations of the ring based DCO 900 are within the contemplated scope of the present disclosure. Examples of the charge-sharing circuit 980 include the charge-sharing circuit 180 in FIG. 1A and in FIG. 8A, the charge-sharing circuit 280 in FIG. 2A and in FIG. 8B, and the charge-sharing circuit 380 in FIG. 3A and in FIG. 8C. Other implementations of the charge-sharing circuit 980 are within the contemplated scope of the present disclosure.

In FIG. 9G, the coupling between the ring based DCO 900 and the charge-sharing circuit 980 is conceptually represented by the charge-sharing coupling 990. Examples of the charge-sharing coupling 990 include the coupling between the ring based DCO 100 and the charge-sharing circuit 180 in FIG. 1A, the coupling between the ring based DCO 200 and the charge-sharing circuit 280 in FIG. 2A, and the coupling between the ring based DCO 300 and the charge-sharing circuit 380 in FIG. 3A. Examples of the charge-sharing coupling 990 also include the coupling between the ring based DCO 800 and the charge-sharing circuit 180 in FIG. 8A, the coupling between the ring based DCO 800 and the charge-sharing circuit 280 in FIG. 8B, and the coupling between the ring based DCO 800 and the charge-sharing circuit 380 in FIG. 8C. Other implementations of the charge-sharing coupling 990 are within the contemplated scope of the present disclosure. For example, in some embodiments, the charge-sharing coupling 990 has a minimal of one connection between a connection node in the ring based DCO 900 and a charge-sharing node in the charge-sharing circuit 980 through a charge-sharing switch.

In FIGS. 9A-9G, the digital filter 950 is characterized with a transfer function. In some embodiments, the transfer function is a static transfer function which does not change with time. In some embodiments, the transfer function is a dynamic transfer function which changes with time. In some embodiments, the transfer function is adjustable based on one or more control parameters. The digital filter 1050 in FIG. 10 is an adjustable digital filter.

Figure 10:
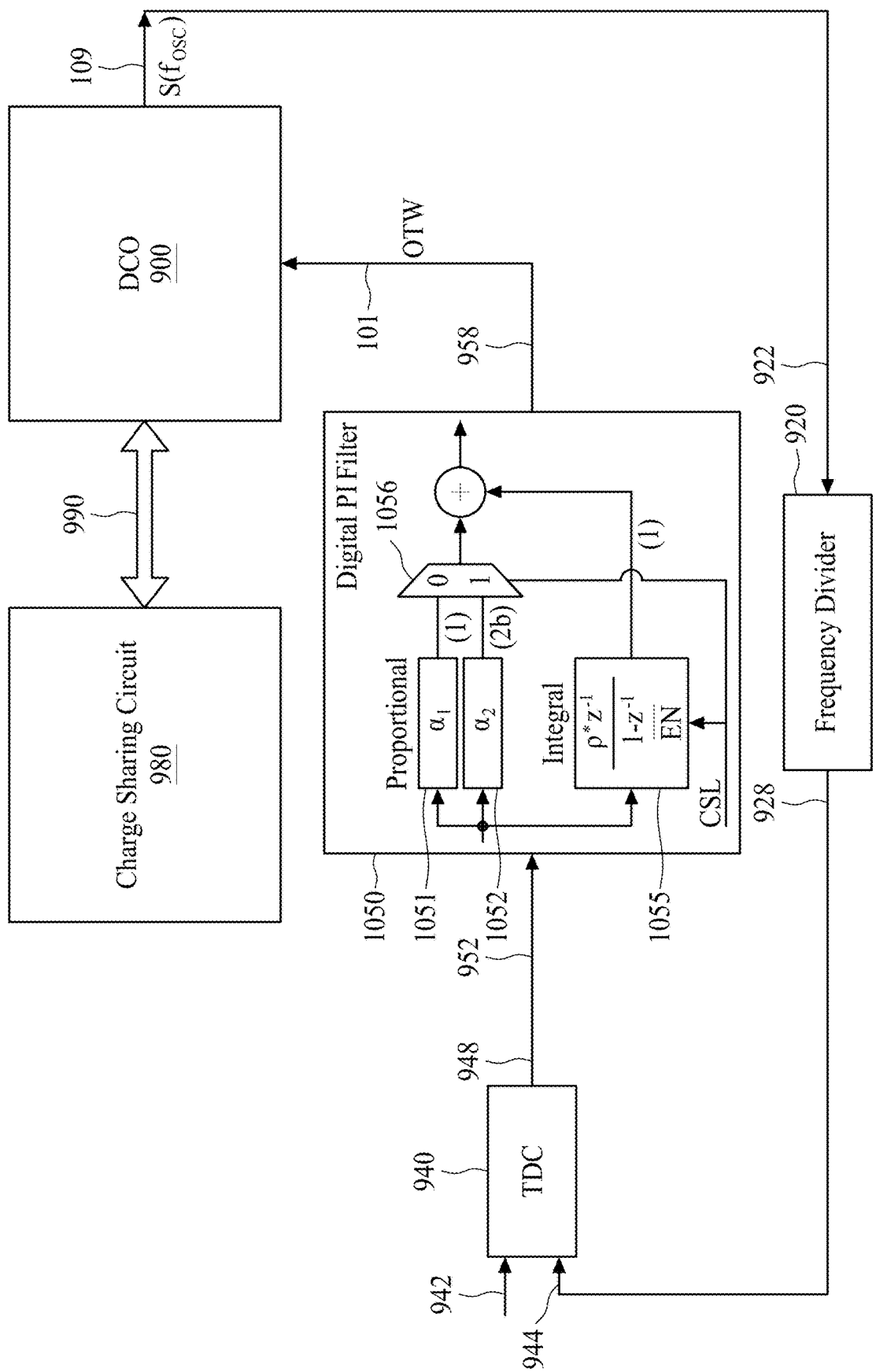
FIG. 10 is a schematic diagram of a PLL having an adjustable digital filter and a ring based DCO coupled to a charge-sharing circuit, in accordance with some embodiments.

FIG. 10 is a schematic diagram of a PLL having an adjustable digital filter and a ring based DCO coupled to a charge-sharing circuit, in accordance with some embodiments. The PLL in FIG. 10 includes a ring based DCO 900, a frequency divider 920, a Time-to-Digital Converter ("TDC") 940, and an adjustable digital filter 1050. The ring based DCO 900 is coupled to a charge-sharing circuit 980 with a charge-sharing coupling 990. In FIG. 10, the adjustable digital filter 1050 is controlled by a charge-sharing signal CSL. The charge-sharing signal CSL is connected to the disable/enable input of an integral path 1055 in the adjustable digital filter 1050. The charge-sharing signal CSL is also connected to a select input of a multiplexer 1056. The logic level of the charge-sharing signal CSL determines whether the adjustable digital filter 1050 functions as a proportional integration digital filter or as a proportional digital filter.

When the charge-sharing signal CSL is at the logic LOW, the adjustable digital filter 1050 becomes a proportional integration digital filter. Specifically, the logic LOW of the charge-sharing signal CSL enables the integral path 1055 with a transfer function $\rho \ast z^{-1}/(1-z^{-1})$, and the logic LOW of the charge-sharing signal CSL applied to the multiplexer 1056 selects the proportion path 1051 with a first proportional constant $\alpha_1$. When the charge-sharing signal CSL is at the logic HIGH, the adjustable digital filter 1050 becomes a proportional digital filter. Specifically, the logic LOW of the charge-sharing signal CSL applied to the multiplexer 1056 selects proportion path 1052 with a second proportional constant $\alpha_2$.

Figure 11:
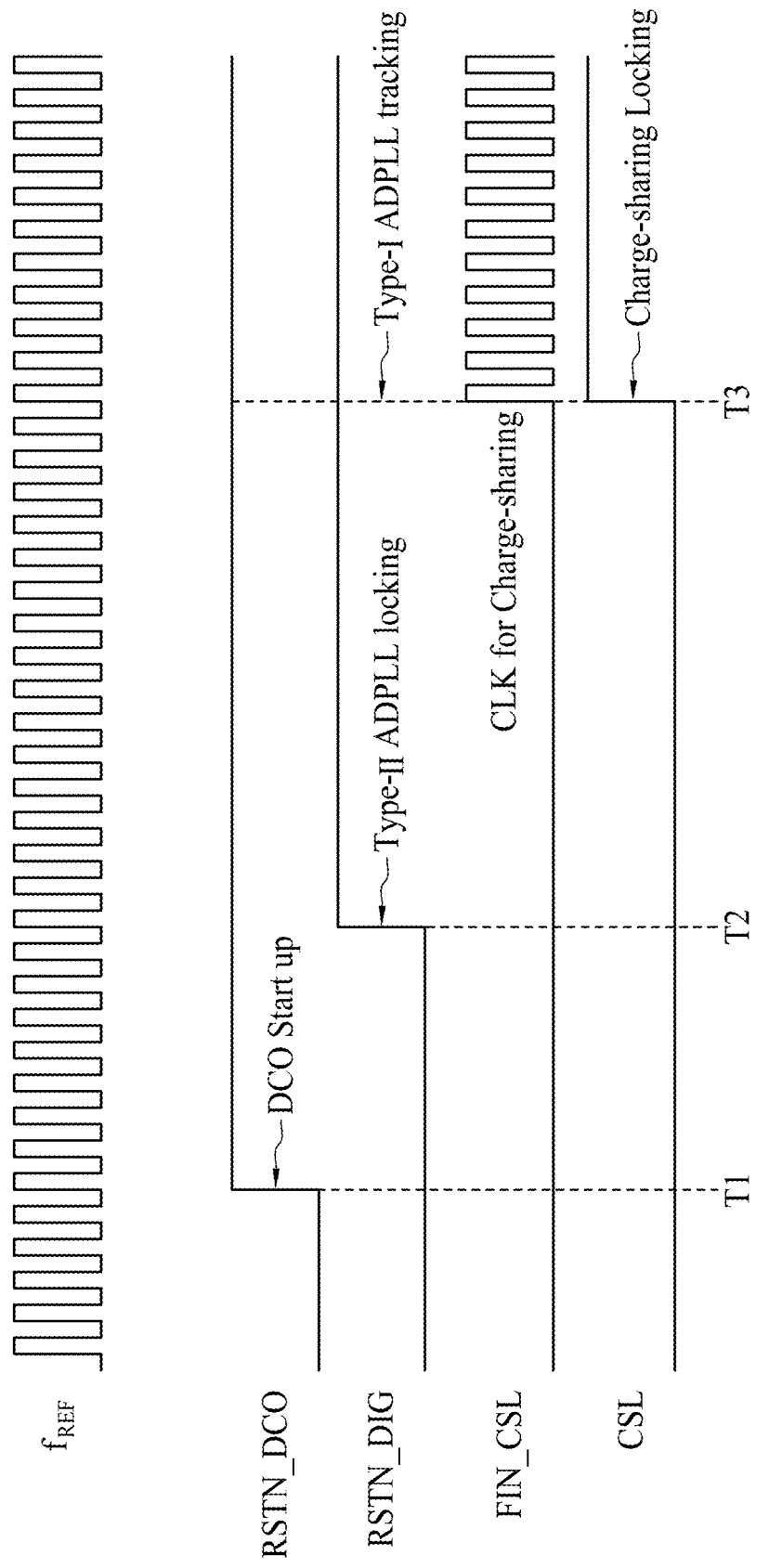
FIG. 11 is a timing diagram of various control signals used to control the operations of the PLL in FIG. 10, in accordance with some embodiments.

FIG. 11 is a timing diagram of various control signals used to control the operations of the PLL in FIG. 10, in accordance with some embodiments. In some embodiments, the PLL in FIG. 10 is implemented as an all-digital phase locked loop (ADPLL). At time T1, when the DCO resetting signal RSTN_DCO changes from the logic LOW to the logic HIGH, the ring based DCO 900 starts to oscillate in an open-loop mode, and the phase of the output oscillating signal is not correlated with the reference signal having the loop reference frequency $f_0$.

At time T2, when the PLL resetting signal RSTN_DIG changes from the logic LOW to the logic HIGH, the ring based DCO 900 starts to oscillate in a closed-loop mode, and the output oscillating signal is phase locked to an oscillating signal having a frequency signal that is a multiple of the loop reference frequency $f_0$. From time T2 to time T3, the charge-sharing signal CSL is at the logic LOW, which sets the adjustable digital filter 1050 as a proportional integration digital filter, and consequently, the PLL in FIG. 10 operates as a type-II ADPLL.

At time T3, the charge-sharing signal CSL changes from the logic LOW to the logic HIGH, and the adjustable digital filter 1050 consequentially changes from a proportional integration digital filter to a proportional digital filter. After time T3, the PLL in FIG. 10 operates as a type-I ADPLL, because the adjustable digital filter 1050 operates as a proportional digital filter. Furthermore, after time T3, when the charge-sharing signal CSL is at the logic HIGH, the CSL clock signal FIN_CSL for the charge-sharing circuit 980 is enabled. When the charge-sharing circuit 980 is enabled after time T3, the output oscillating signal of the ring based DCO 900 is phase corrected by the charge-sharing circuit 980 based on the charge-sharing processes.

In some embodiments, a ring based DCO coupled to a charge-sharing circuit 180 and/or used in a phase locked loop is implemented with a start-up assistance circuit. A DCO resetting signal RSTN_DCO applied to the start-up assistance circuit allows the ring based DCO to start a ring oscillation process at a predetermined time. In some embodiments, when DCO resetting signal RSTN_DCO is at a first logic level, the ring based DCO set to a steady state in which the output of the DCO does not swing, and when DCO resetting signal RSTN_DCO is at a second logic level, the ring based DCO is set to an oscillating state in which the output of the DCO generates an oscillating voltage swing.

Figure 12A:
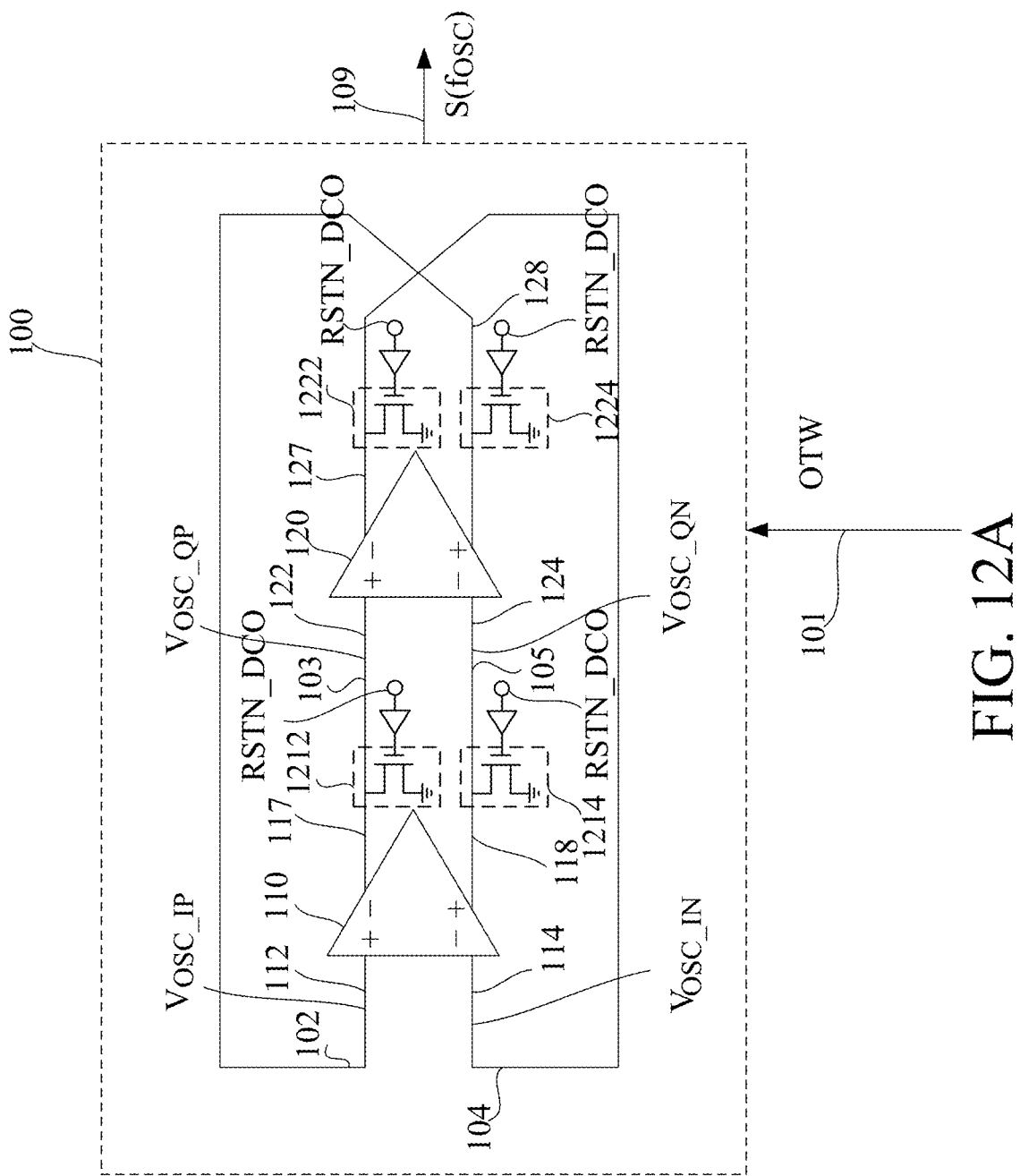
FIGS. 12A-12B are schematic diagrams of ring based DCOs each implemented with a start-up assistance circuit, in accordance with some embodiments.
Figure 12B:
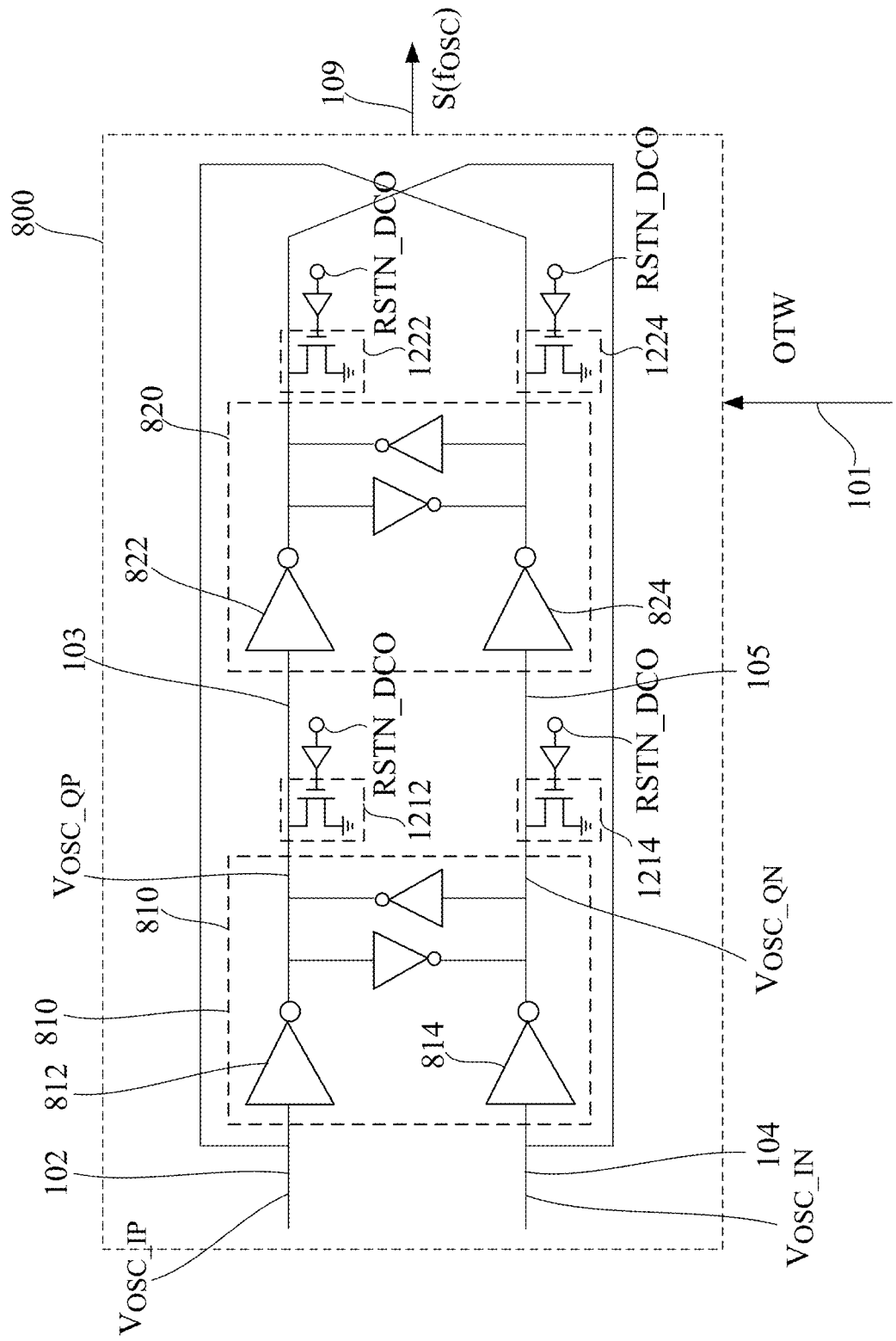

FIGS. 12A-12B are schematic diagrams of ring based DCOs each implemented with a start-up assistance circuit, in accordance with some embodiments. The ring based DCO in FIG. 12A is modified from the ring based DCO 100 in FIG. 1A by adding switches 1212, 1214, 1222, and 1224 driven by the DCO resetting signal RSTN_DCO through an inverter. Each of the two outputs of the inverter 110 is connected to the ground GND correspondingly through the switch 1212 and the switch 1214. Each of the two outputs of the inverter 120 is connected to the ground GND correspondingly through the switch 1222 and the switch 1224. The ring based DCO in FIG. 12B is modified from the ring based DCO 800 in FIGS. 8A-8C by adding switches 1212, 1214, 1222, and 1224 driven by the DCO resetting signal RSTN_DCO through an inverter. The output of each of the inverters 812, 814, 822, and 824 is connected to the ground GND correspondingly through one of the switches 1212, 1214, 1222, and 1224.

In the operation of the DCO in FIG. 12A or the DCO in FIG. 12B, when the DCO resetting signal RSTN_DCO is at the logic LOW, the switches 1212, 1214, 1222, and 1224 are all in the connected state, and the connection nodes 102, 103, 104, and 105 are all set to a same common voltage at the ground GND, which sets the DCO to the steady state. When the DCO resetting signal RSTN_DCO is changed to the logic HIGH, the switches 1212, 1214, 1222, and 1224 are all in the disconnected state, and the connection nodes 102, 103, 104, and 105 are all floated from the common voltage at the ground GND, which sets the DCO to the oscillating state.

Figure 13:
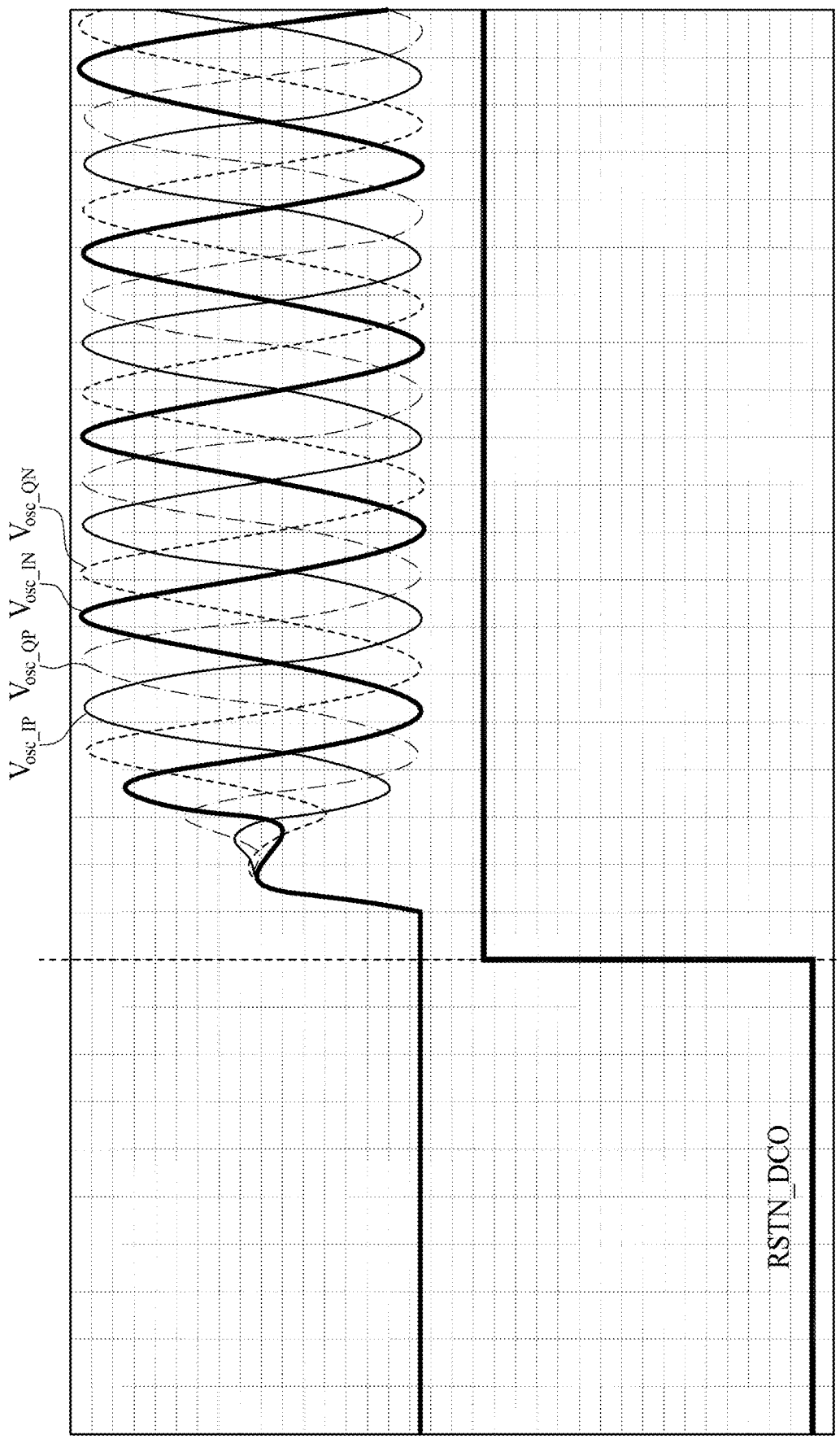
FIG. 13 are waveforms of the oscillating voltage signals at various connection nodes of the DCO in FIG. 12A or in FIG. 12B, in accordance with some embodiments.

FIG. 13 are waveforms of the oscillating voltage signals at various connection nodes of the DCO in FIG. 12A or in FIG. 12B, in accordance with some embodiments. In FIG. 13, the DCO resetting signal RSTN_DCO is charged from the logic LOW to the logic HIGH at time T1. The voltage signals $V_{osc\_IP}$, $V_{osc\_QP}$, $V_{osc\_IN}$, and $V_{osc\_QN}$ in FIG. 13 are correspondingly the voltage signals at the connection nodes 102, 103, 104, and 105. Before time T1, the DCO resetting signal RSTN_DCO is at the logic LOW, and the voltage signals $V_{osc\_IP}$, $V_{osc\_QP}$, $V_{osc\_IN}$, and $V_{osc\_QN}$ are all at the same common voltage. After time T1, the DCO resetting signal RSTN_DCO is at the logic HIGH, and the voltage signals $V_{osc\_IP}$, $V_{osc\_QP}$, $V_{osc\_IN}$, and $V_{osc\_QN}$ all start to oscillate. Each of the voltage signals $V_{osc\_IP}$, $V_{osc\_QP}$, $V_{osc\_IN}$, and $V_{osc\_QN}$ form a sinusoidal wave with the same oscillation frequency $f_{osc}$.

In FIG. 13, the sinusoidal wave of the voltage signal $V_{osc\_QP}$ is delayed from the sinusoidal wave of the voltage signal $V_{osc\_IP}$ by a phase angle of $\pi/2$. The sinusoidal wave of the voltage signal $V_{osc\_IN}$ is delayed from the sinusoidal wave of the voltage signal $V_{osc\_QP}$ by a phase angle of $\pi/2$. The sinusoidal wave of the voltage signal $V_{osc\_QN}$ is delayed from the sinusoidal wave of the voltage signal $V_{osc\_IN}$ by a phase angle of $\pi/2$. The sinusoidal wave of the voltage signal $V_{osc\_IP}$ is delayed from the sinusoidal wave of the voltage signal $V_{osc\_QN}$ by a phase angle of $\pi/2$.

In the operation of the DCO in FIG. 12B, the oscillation frequency $f_{osc}$ of the DCO is tuned based on the oscillator tuning word OTW received at the input terminal 101 of the DCO. In some embodiments, the oscillation frequency $f_{osc}$ of the DCO in FIG. 12B is adjusted by changing the delay time of each of the inverters 812, 814, 822, and 824. In some embodiments, each of the inverters 812, 814, 822, and 824 is implemented with multiple parallelly-connected CMOS inverters. In one example, as shown in FIG. 12C, the inverter (e.g., 812, 814, 822, or 824) in the DCO of FIG. 12B includes three parallelly connected CMOS inverters 1220, 1230, and 1240 and one variable capacitor 1250.

Figure 12C:
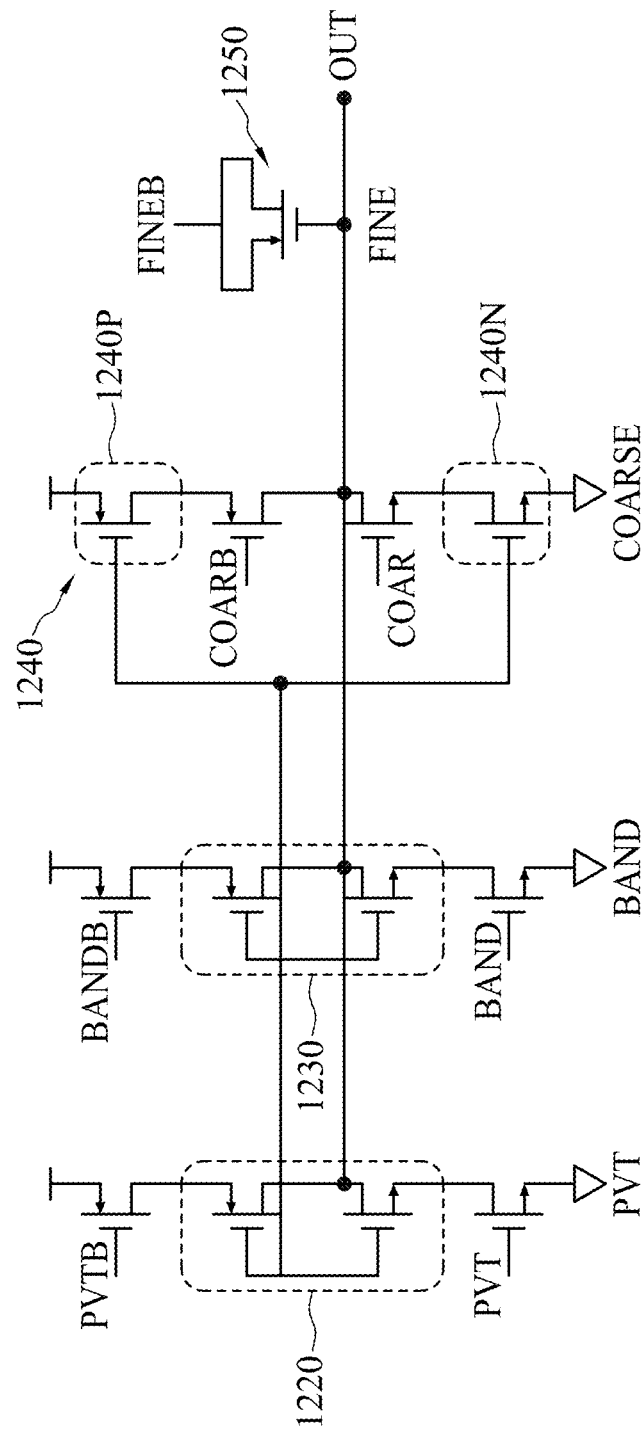
FIG. 12C is a schematic diagram of an inverter in the ring based DCO of FIG. 12B, in accordance with some embodiments.

In FIG. 12C, the delay time of each CMOS inverter (i.e., 1220, 1230, or 1240) is adjusted by changing the voltage difference between the voltage at the source of the PMOS and the voltage at the source of the NMOS. The delay time of each CMOS inverter 1220 is adjusted by the control signal PVT and the control signal PVTB (which is the inverse of the signal PVT). The control signal PVT is provided to compensate the variations in the PVT parameters (i.e., process, voltage, and temperature parameters). The delay time of each CMOS inverter 1230 is adjusted by the control signal BAND and the control signal BANDB (which is the inverse of the signal BAND). The control signal BAND is used to set the frequency band of the DCO in FIG. 12B. The delay time of each CMOS inverter 1240 (which includes two parts 1240P and 1240N) is adjusted by the control signal COAR and the control signal COARB (which is the inverse of the signal COAR). The control signal COAR provides coarse adjustment to the oscillation frequency $f_{osc}$ of the DCO in FIG. 12B. Fine adjustment to the oscillation frequency $f_{osc}$ of the DCO in FIG. 12B is provided by changing the capacitance value of the variable capacitor 1250 with the control signal FINE and the control signal FINEB (which is the inverse of the signal FINE).

In this disclosure, the total number of differential inverters in a ring based DCO that is coupled to a charge-sharing circuit is not limited to two. Other example implementations of a ring based DCO include a ring of three differential inverters, a ring of four differential inverters, a ring of five differential inverters, or a ring of more than five differential inverters as determined based on design needs.

Figure 14:
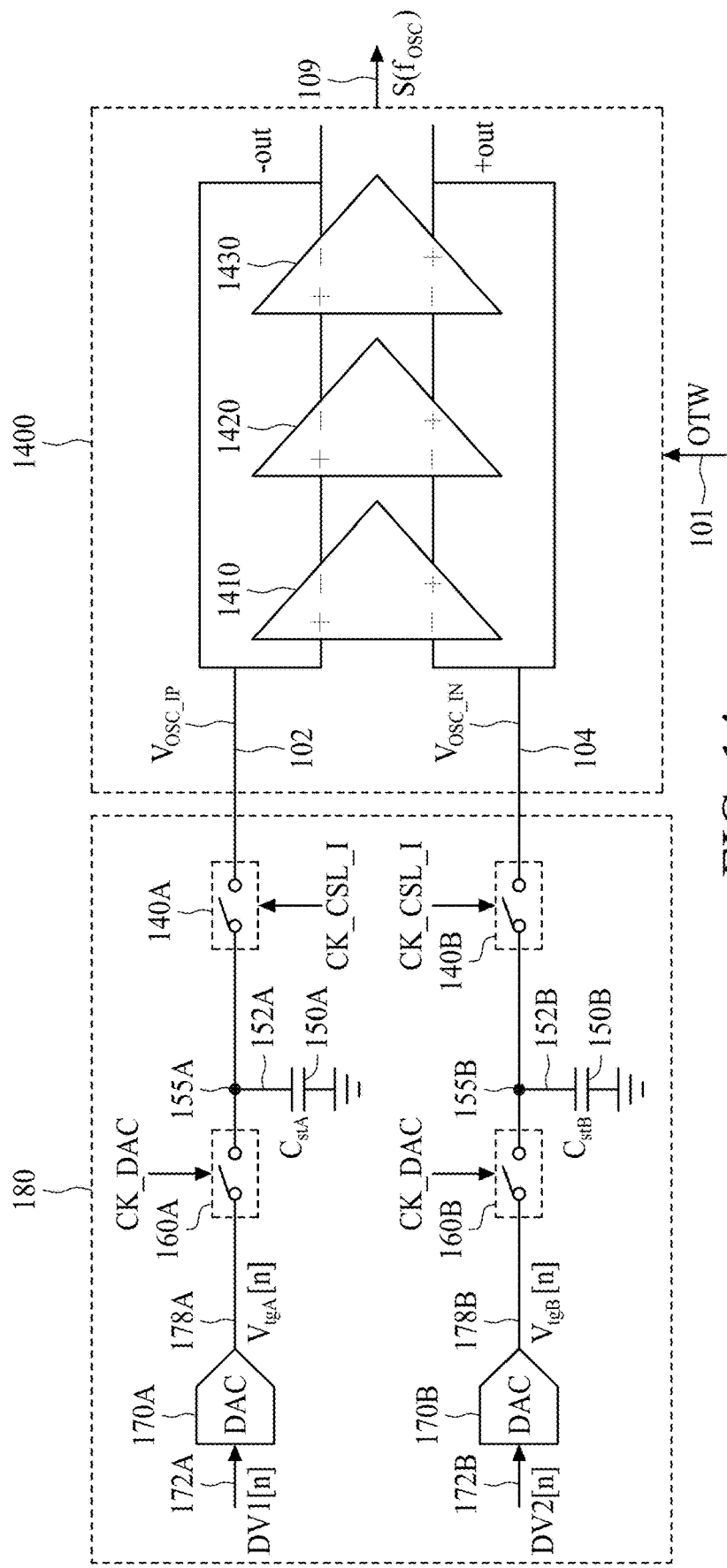
FIG. 14 is schematic diagram of a ring based DCO having three differential inverters, in accordance with some embodiments.

FIG. 14 is schematic diagram of a ring based DCO 1400 which is coupled to a charge-sharing circuit and includes three differential inverters, in accordance with some embodiments. The three differential inverters 1410, 1420, and 1430 form a ring of oscillation. The differential output terminals of the differential inverter 1410 are coupled to the differential input terminals of the differential inverter 1420. The differential output terminals of the differential inverter 1420 are coupled to the differential input terminals of the differential inverter 1430. The differential output terminals of the differential inverter 1430 are coupled to the differential input terminals of the differential inverter 1410.

In FIG. 14, the connection node 102 (at the non-inverting input terminal of the differential inverter 1410) and the connection node 104 (at the inverting input terminal of the differential inverter 1410) are coupled to the charge-sharing circuit 180, which is configured to correct the oscillation waveforms at the connection nodes 102 and 104 at various CS locking points. The sinusoidal wave of the voltage signal $V_{osc\_IP}$ at the connection node 102 and the sinusoidal wave the voltage signal $V_{osc\_IN}$ at the connection node 104 are shifted by a phase angle of 180 degrees. The charge-sharing circuit 180 in FIG. 14 is the same as the charge-sharing circuit 180 in FIG. 1A. The coupling between the charge-sharing circuit 180 and the connection nodes in the ring based DCO 1400 in FIG. 14 is the same as the coupling between the charge-sharing circuit 180 and the connection nodes in the ring based DCO 100 in FIG. 1A.

Similar to the modification of substituting the ring based DCO 100 of FIG. 1A with the ring based DCO 1400 of FIG. 14, other modifications of substituting a ring based DCO (e.g., 100, 200, 300, or 800 in various other implementations) with the ring based DCO 1400 of FIG. 14 are within the contemplated scope of the present disclosure.

In this disclosure, the ring of inverters in a DCO is not limited to the ring of differential inverters. In some embodiments, a ring based DCO that is coupled to a charge-sharing circuit include a ring of more than three non-differential inverters. In the example differential inverters in this disclosure, two input terminals and two output terminals provided for each differential inverter. The two input terminals are the non-inverting input terminal and the inverting input terminal. The two output terminals are the non-inverting output terminal and the inverting output terminal. In contrast, a non-differential inverter has one input terminal and one output terminal.

Figure 15A:
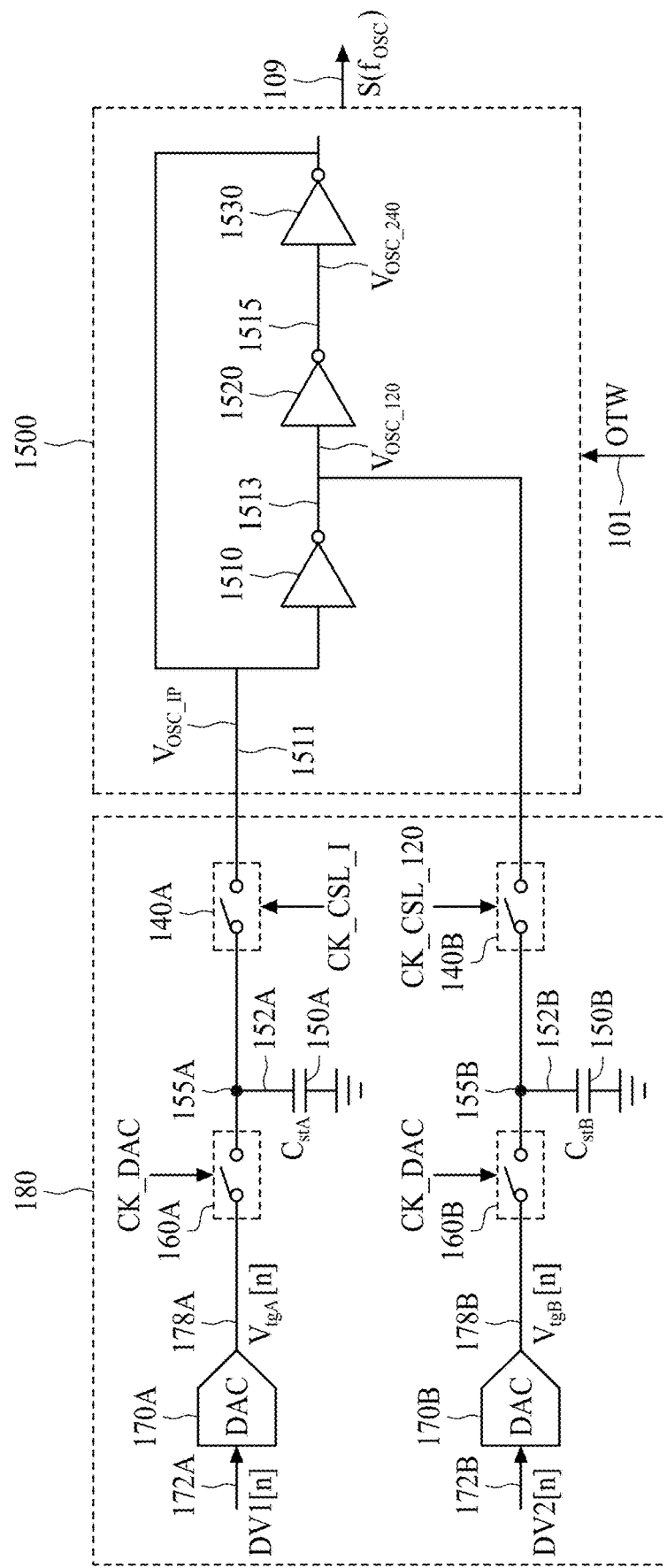
FIGS. 15A-15B are schematic diagrams of a ring based DCO having three non-differential inverters, in accordance with some embodiments.
Figure 15B:
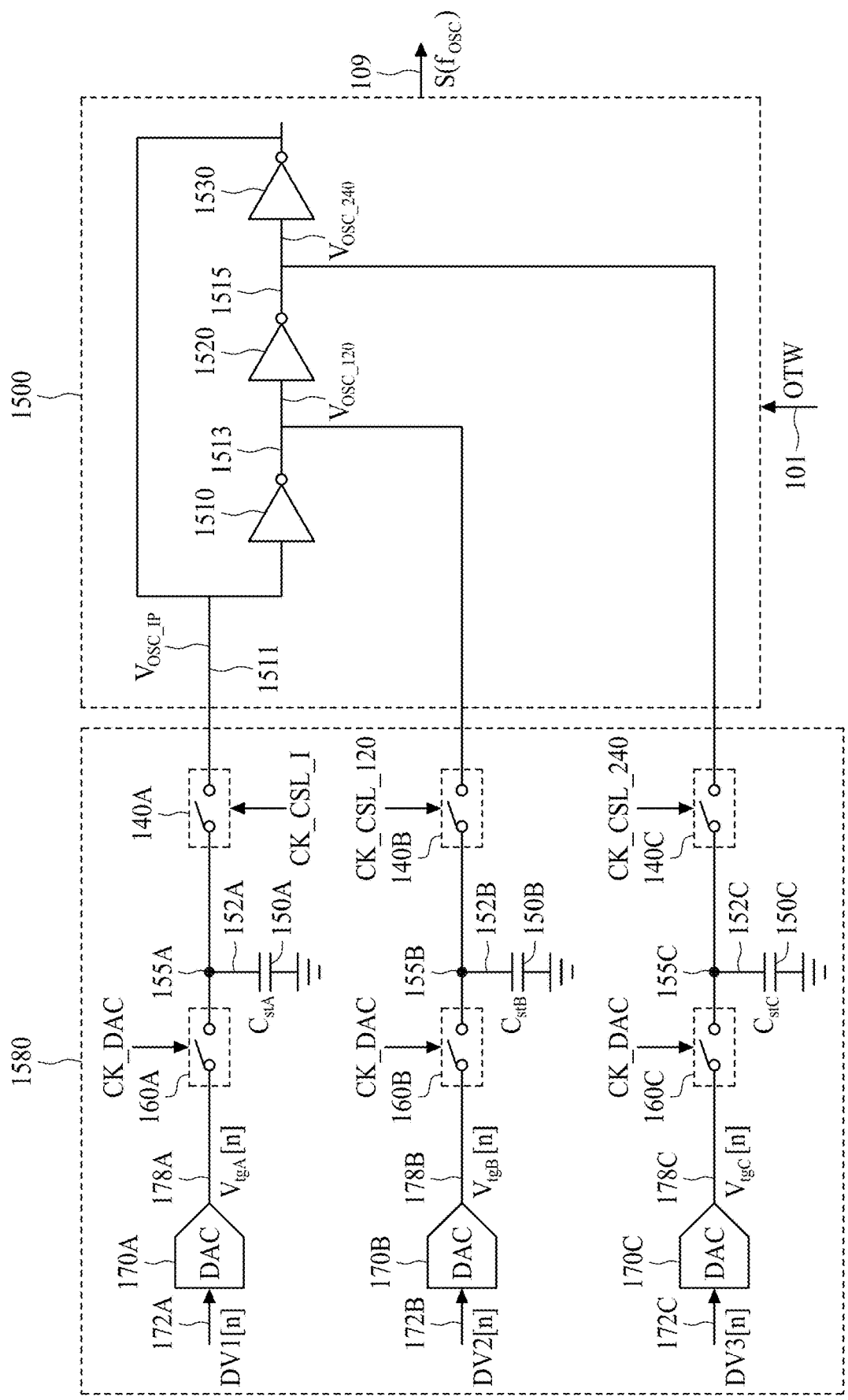

FIGS. 15A-15B are schematic diagrams of a ring based DCO 1500 which is coupled to a charge-sharing circuit and includes three non-differential inverters, in accordance with some embodiments. The three inverters 1510, 1520, and 1530 form a ring of oscillation. The output terminal of the inverter 1510 is coupled to the input terminal of the inverter 1520. The output terminal of the inverter 1520 is coupled to the input terminal of the inverter 1530. The output terminal of the inverter 1530 is coupled to the input terminal of the inverter 1510. When the ring based DCO 1500 is generating an oscillating output signal, the voltage signal $V_{osc\_IP}$ at the connection node 1511 (between inverters 1510 and 1530), the voltage signal $V_{osc\_120}$ at the connection node 1513 (between inverters 1510 and 1520), and the voltage signal $V_{osc\_240}$ at the connection node 1515 (between inverters 1520 and 1530) are all oscillating with the same oscillation frequency.

The sinusoidal wave of the voltage signal $V_{osc\_120}$ at the connection node 1513 is delayed from the sinusoidal wave of the voltage signal $V_{osc\_IP}$ at the connection node 1511 by a phase angle of 120 degrees. The sinusoidal wave of the voltage signal $V_{osc\_240}$ at the connection node 1515 is delayed from the sinusoidal wave of the voltage signal $V_{osc\_120}$ at the connection node 1513 by a phase angle of 120 degrees. The sinusoidal wave of the voltage signal $V_{osc\_IP}$ at the connection node 1511 is delayed from the sinusoidal wave of the voltage signal $V_{osc\_240}$ at the connection node 1515 by a phase angle of 120 degrees.

In FIG. 15A, the ring based DCO 1500 is coupled to the charge-sharing circuit 180, and the oscillation waveforms at the connection nodes 1511 and 1513 at various CS locking points are corrected with charge-sharing processes. In FIG. 15B, the ring based DCO 1500 is coupled to the charge-sharing circuit 1580, and the oscillation waveforms at the connection nodes 1511, 1513, and 1515 at various CS locking points are corrected with charge-sharing processes.

The charge-sharing circuit 180 in FIG. 15A is the same as the charge-sharing circuit 180 in FIG. 1A, except that the charge-sharing switch 140B receives different CSL control signals and the DAC 170B receives different voltage digital words DV2[n]. Specifically, the charge-sharing switch 140B in FIG. 1A receives the CSL control signal CK_CSL_I, but the charge-sharing switch 140B in FIG. 15A receives the CSL control signal CK_CSL_120. The CSL control signal CK_CSL_I determines the CSL time of each CS locking point on the waveform of the voltage signal $V_{osc\_IN}$ at the connection node 104 in the ring based DCO 100 of FIG. 1A, but the CSL control signal CK_CSL_120 determines the CSL time of each CS locking point on the waveform of the voltage signal $V_{osc\_120}$ at the connection node 1513 in the ring based DCO 1500 of FIG. 15A. Additionally, the voltage digital word DV2[n] received by the DAC 170B in FIG. 1A determines the target voltage $V_{tgB}[n]$ on the waveform of the voltage signal $V_{osc\_IN}$ at the connection node 104 in the ring based DCO 100 of FIG. 1A, but the voltage digital word DV2[n] received by the DAC 170B in FIG. 15A determines the target voltage $V_{osc\_120}[n]$ on the waveform of the voltage signal $V_{osc\_120}$ at the connection node 1513 in the ring based DCO 1500 of FIG. 15A.

The charge-sharing circuit 1580 in FIG. 15B is modified from the charge-sharing circuit 180 in FIG. 15A. The modification includes adding a charge-sharing switch 140C, a charge-sharing capacitor 150C, a pre-charge switch 160C, and a digital to analog converter such as a DAC 170C. A first terminal 152C of the charge-sharing capacitor 150C is connected to the charge-sharing node 155C and a second terminal of the charge-sharing capacitor 150C is connected to the ground. The first terminal 152C of the charge-sharing capacitor 150C is connected to the connection node 1515 in the ring based DCO 1500 through the charge-sharing switch 140C. The connection state of the charge-sharing switch 140C is controlled by a CSL control signal CK_CSL_240.

An output terminal 178C of the DAC 170C is connected to the first terminal 152C of the charge-sharing capacitor 150C through the pre-charge switch 160C. The connection state of the pre-charge switch 160C is controlled by a DAC control signal CK_DAC. The DAC 170C has an input terminal 172C that is configured to receive a voltage digital word DV3[n]. The voltage digital word DV3[n] determines the target voltage $V_{osc\_240}[n]$ on the waveform of the voltage signal $V_{osc\_240}$ at the connection node 1515 in the ring based DCO 1500 of FIG. 15B.

Figure 16A:
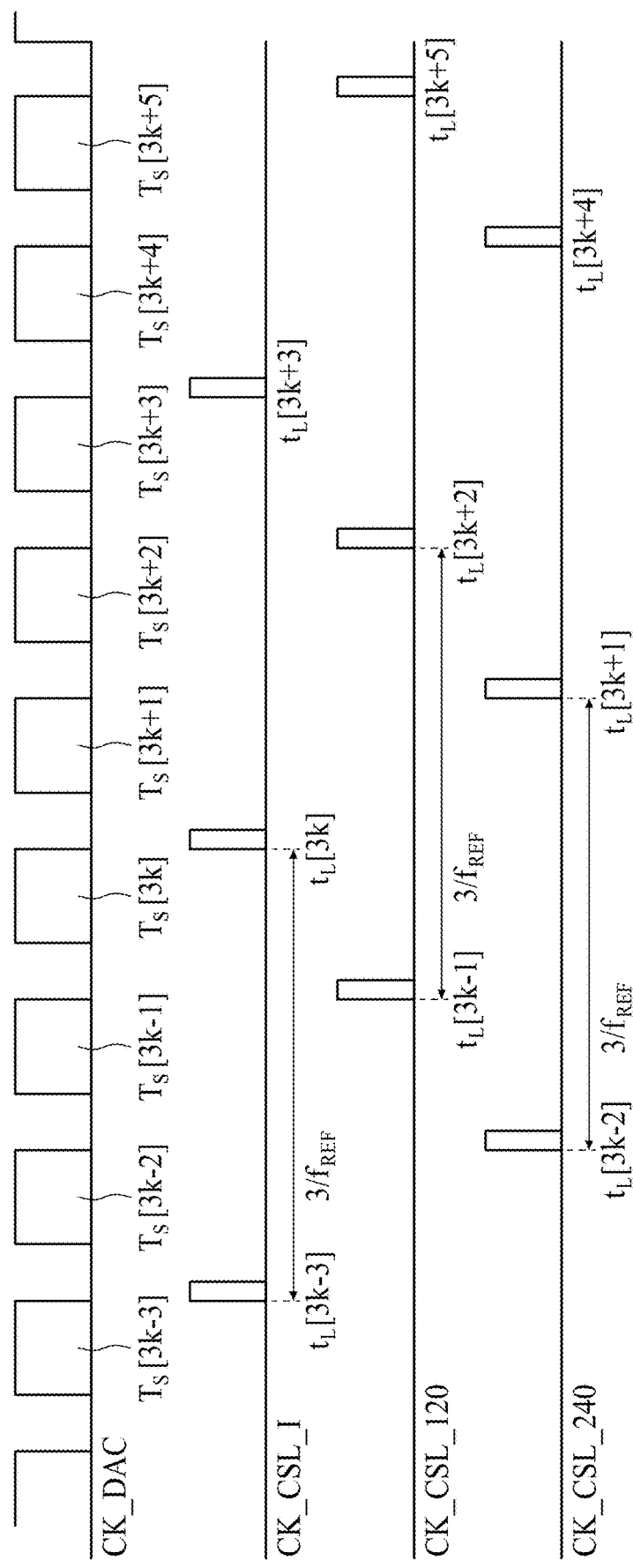
FIG. 16A are waveforms of various control signals applied to the charge-sharing circuits in FIGS. 15A-15B, in accordance with some embodiments.

FIG. 16A are waveforms of various control signals applied to the charge-sharing circuit 180 in FIG. 15A or applied to the charge-sharing circuit 1580 in FIG. 15B, in accordance with some embodiments. The various control signals include the DAC control signal CK_DAC, the CSL control signal CK_CSL_I, the CSL control signal CK_CSL_120, and the CSL control signal CK_CSL_240. The DAC control signal CK_DAC stays at the logic HIGH during each of the pre-charge time periods, such as $T_s[n]$, where the integer n ranges from 3k−3 to 3k+5 for the pre-charge time periods as shown in FIG. 16A. Here, k is a positive integer. During the time periods that are not within the pre-charge time periods, the DAC control signal CK_DAC stays at the logic LOW. The DAC control signal CK_DAC is a periodical signal that has a time period equal to the time period $1/f_{REF}$ of the CSL clock signal FIN_CSL.

In FIG. 16A, as shown in the waveforms of the CSL control signals CK_CSL_I, CK_CSL_120, and CK_CSL_240, each of the logic HIGH pulses of the CSL control signals starts at a CSL time $t_L[n]$ and stays at the logic HIGH for a time duration $\Delta t_L$ after the CSL time $t_L[n]$. The integer n for the CSL time $t_L[n]$ as shown in FIG. 16A ranges from 3k−3 to 3k+5, where k is a positive integer. The CSL control signal CK_CSL_I has logic HIGH pulses at the CSL time $t_L[3k-3]$, $t_L[3k]$, and $t_L[3k+3]$. The CSL control signal CK_CSL_120 has logic HIGH pulses at the CSL time $t_L[3k-1]$, $t_L[3k+2]$, and $t_L[3k+5]$. The CSL control signal CK_CSL_240 has logic HIGH pulses at the CSL time $t_L[3k-2]$, $t_L[3k+1]$, and $t_L[3k+5]$ Two adjacent logic HIGH pulses in a CSL control signal (such as, CK_CSL_I, CK_CSL_120, or CK_CSL_240) is separated by $3/f_{REF}$, which is three times the time period of the CSL clock signal FIN_CSL.

Figure 16B:
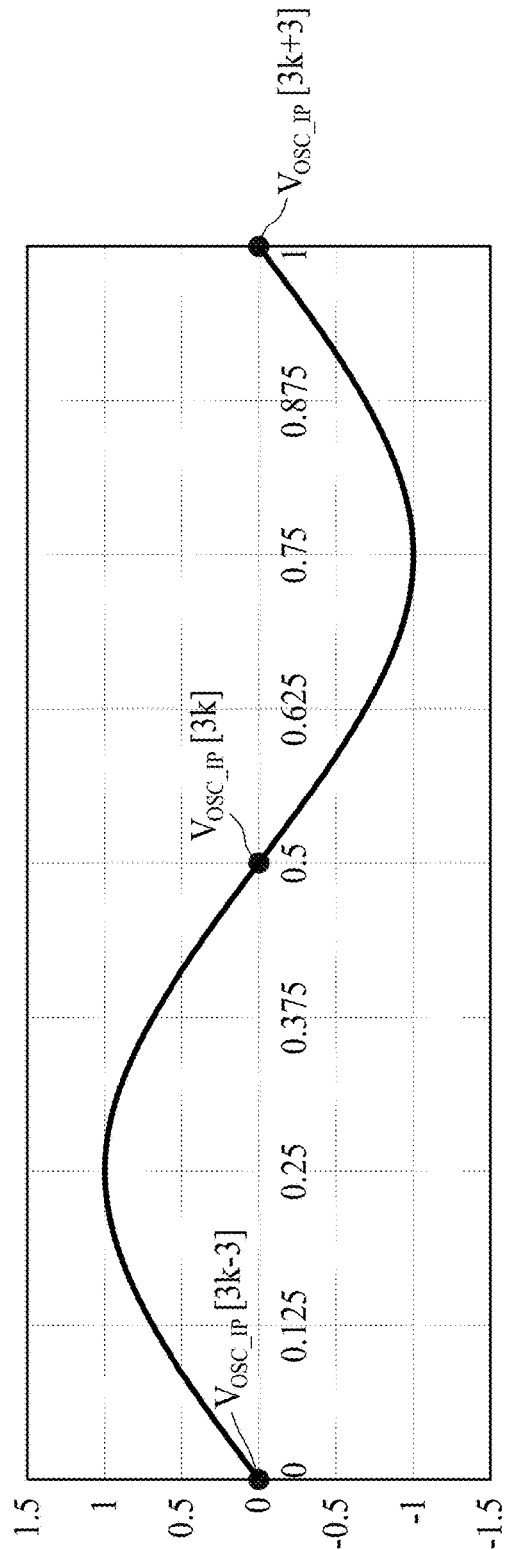
FIGS. 16B-16D are waveforms of the voltage signals at various connection nodes of the ring based DCO in FIG. 15A or FIG. 15B, in accordance with some embodiments.
Figure 16C:
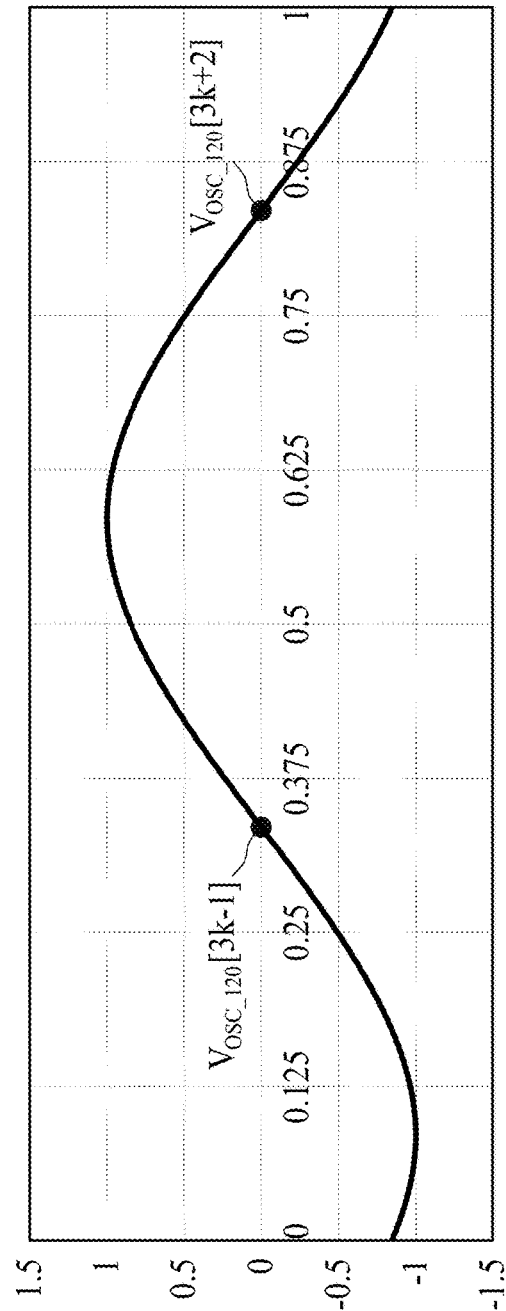
Figure 16D:
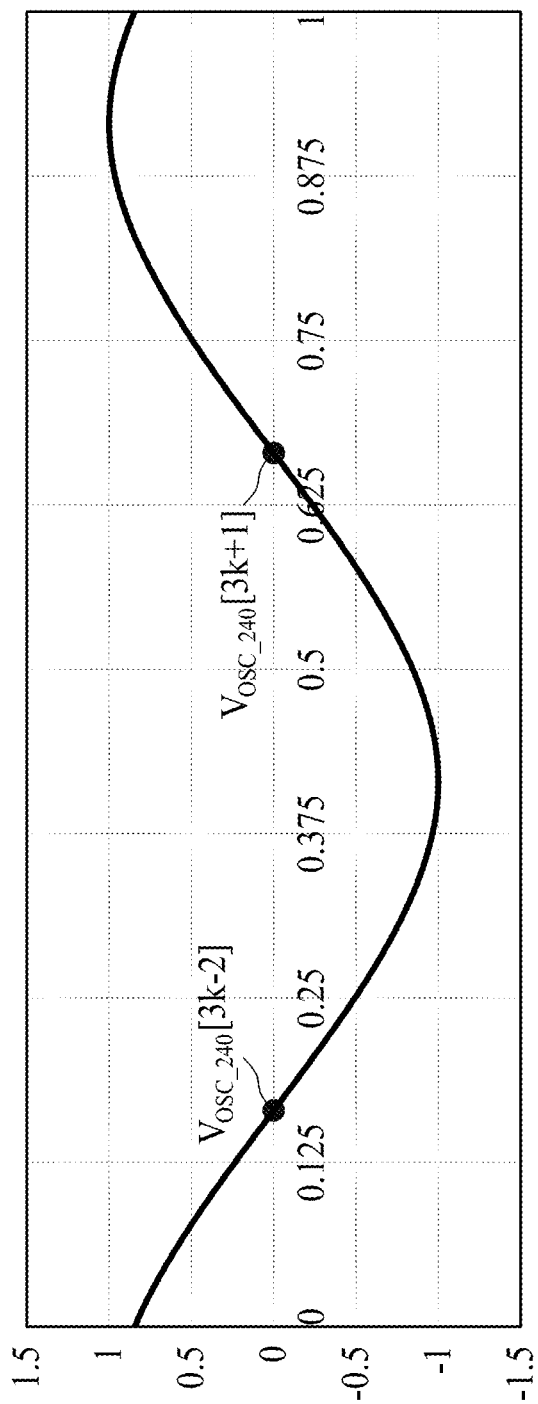

FIGS. 16B-16D are waveforms of the voltage signals at various connection nodes of the ring based DCO 1500, in accordance with some embodiments. The CS locking points on the waveform of the voltage signal $V_{osc\_IP}$ at the connection node 1511 corresponding to the CSL time $t_L[3k-3]$, $t_L[3k]$, and $t_L[3k+3]$ are identified in FIG. 16B. The CS locking points on the waveform of the voltage signal $V_{osc\_120}$ at the connection node 1513 corresponding to the CSL time the CSL time $t_L[3k-1]$, $t_L[3k+2]$, and $t_L[3k+5]$ are identified in FIG. 16C. The CS locking points on the waveform of the voltage signal $V_{osc\_240}$ at the connection node 1515 corresponding to the CSL time $t_L[3k-2]$, $t_L[3k+1]$, and $t_E[3k+5]$ are identified in FIG. 16D.

Figure 17:
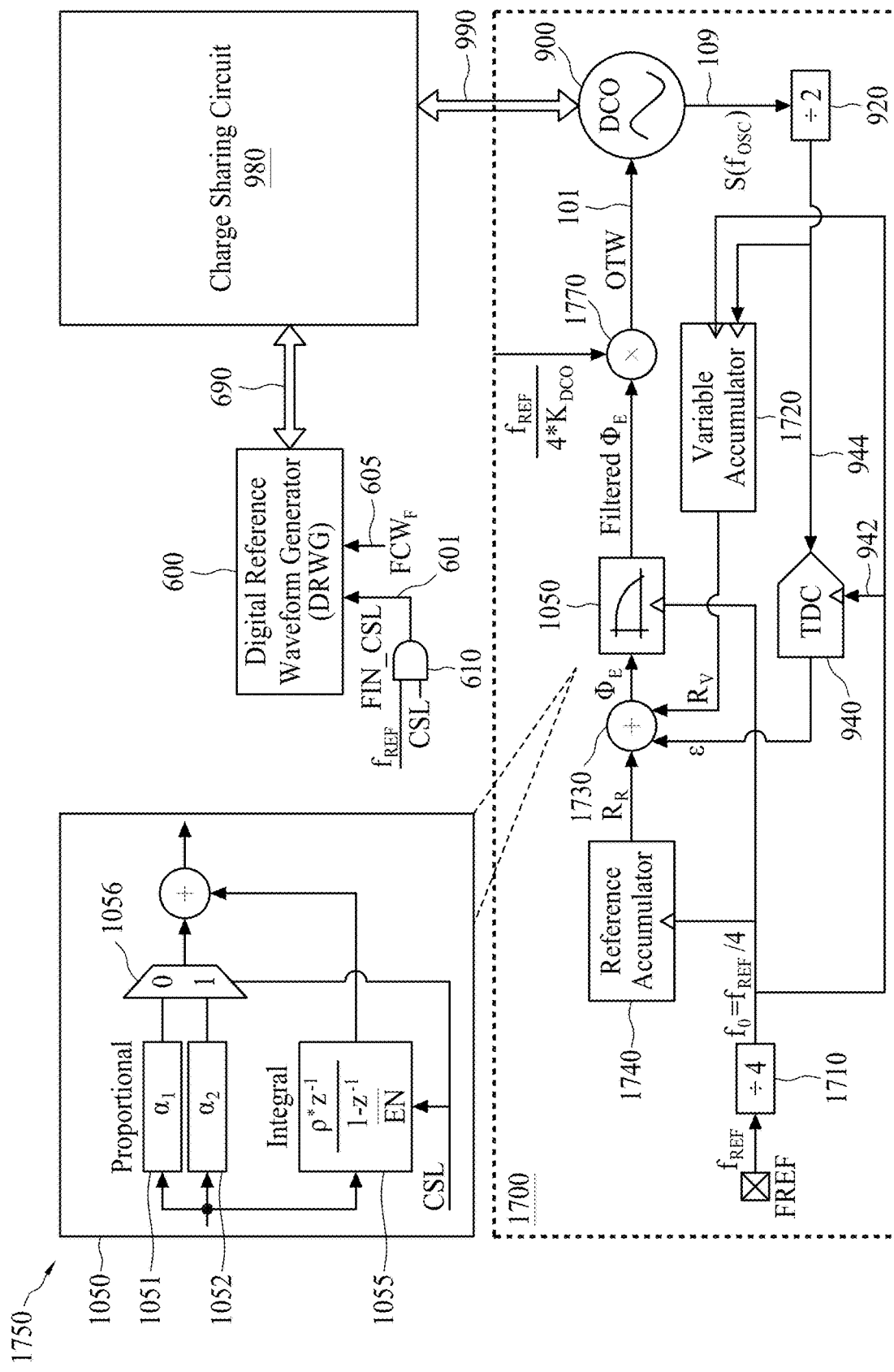
FIG. 17 is a schematic diagram of a PLL having an adjustable digital filter and a ring based DCO coupled to a charge-sharing circuit, in accordance with some embodiments.

In this disclosure, the phase locked loop having a ring based DCO that is coupled to a charge-sharing circuit is not limited to the phase locked loop as described with respect to FIGS. 9A-9G and FIG. 10. Other implementations of the phase locked loop having a ring based DCO are within the contemplated scope of the present disclosure. Another example implementation of the phase locked loop is shown in FIG. 17. In addition, when the phase locked loop has a ring based DCO that is coupled to a charge-sharing circuit, the charge-sharing coupling between the ring based DCO and the charge-sharing circuit is not limited to the charge-sharing coupling as described with respect to FIGS. 9A-9G. For example, in some embodiments, the charge-sharing coupling between the ring based DCO 100 and the charge-sharing circuit 180 in FIG. 1A is modified by removing the coupling (such as the charge-sharing switch 140B) between the connection node 104 and the charge-sharing node 155B, whereby the charge-sharing coupling as modified is implemented to correct only the oscillation waveform at the connection node 102 in FIG. 1A.

FIG. 17 is a schematic diagram of a PLL having an adjustable digital filter and a ring based DCO coupled to a charge-sharing circuit, in accordance with some embodiments. Similar to the ring based DCO 900 in FIG. 10, the ring based DCO 900 in FIG. 17 is coupled to the charge-sharing circuit 980 with the charge-sharing coupling 990. The ring based DCO 900 in FIG. 17, however, is implemented in a phase lock phase loop 1700 that is different from the PLL in FIG. 10. In FIG. 17, the DRWG 600 is connected to the charge-sharing circuit 980 with the DRWG coupling 690. An example implementation of the DRWG 600 and the DRWG coupling 690 is disclosed with respect to FIG. 6. Similar to the DRWG 600 in FIG. 6, the DRWG 600 in FIG. 17 also receives the CSL clock signal FIN_CSL at the input 601 and the frequency control words $FCW_F$ at the input 605. The CSL clock signal FIN_CSL is generated at the output of the AND gate 610 by gating the reference oscillation signal $f_{REF}$ with the charge-sharing signal CSL.

Similar to the PLL in FIG. 10, the phase lock phase loop 1700 in FIG. 17 also includes a ring based DCO 900, a frequency divider 920, a TDC 940, and an adjustable digital filter 1050. The adjustable digital filter 1050 is controlled by the charge-sharing signal CSL. One example implementation of the adjustable digital filter 1050 is shown in the inset 1750. The operations of the adjustable digital filter 1050 in the phase lock phase loop 1700 of FIG. 17 and in the PLL of FIG. 10 are similar. The operations of the ring based DCO 900, the frequency divider 920, and the TDC 940 in the phase lock phase loop 1700 of FIG. 17 and in the PLL of FIG. 10 are also similar.

The phase lock phase loop 1700 of FIG. 17 further includes a variable accumulator 1720, a reference accumulator 1740, an adder 1730, and a multiplier 1770. Each of the variable accumulator 1720, the reference accumulator 1740, and the TDC 940 receives the loop reference frequency $f_0$ from the frequency divider 1710. In FIG. 17, the phase error £ from the TDC 940, the accumulated variable error $R_v$ from the variable accumulator 1720, and the accumulated reference error $R_R$ from the reference accumulator 1740 are all added in the adder 1730. The total phase error $\Phi_E$ from the adder 1730 is coupled to the input of the adjustable digital filter 1050, and the filtered phase error $\Phi_E$ from the output of the adjustable digital filter 1050 is coupled to the multiplier 1770. After the filtered phase error (DE is multiplied by a normalization factor in the multiplier 1770, an oscillator tuning word OTW is generated and coupled to the input 101 of the DCO 900. In the specific embodiments of FIG. 17, the normalization factor multiplied by the multiplier 1770 is $f_{REF}/(4*K_{DCO})$, where $K_{DCO}$ is a proportional constant for characterizing the specific DCO 900 and the number 4 is the ratio between the reference oscillation signal $f_{REF}$ and the loop reference frequency $f_0$.

In FIG. 17, because the loop reference frequency $f_0$ is generated by the frequency divider 1710 that receives the reference oscillation signal $f_{REF}$ as a frequency input, the loop reference frequency $f_0$ maintains some phase relationship with the reference oscillation signal $f_{REF}$. When the DCO 900 is operating in a closed phase locked loop, the output oscillating signal $S(f_{osc})$ generated by the DCO 900 is phase locked to a target frequency that is multiple times the loop reference frequency $f_0$. The phase jitters of the output oscillating signal $S(f_{osc})$ are reduced by the charge-sharing circuit 980, as the charge-sharing circuit 980 is clocked by the CSL clock signal FIN_CSL which is synchronized with the reference oscillation signal $f_{REF}$.

Figure 18:
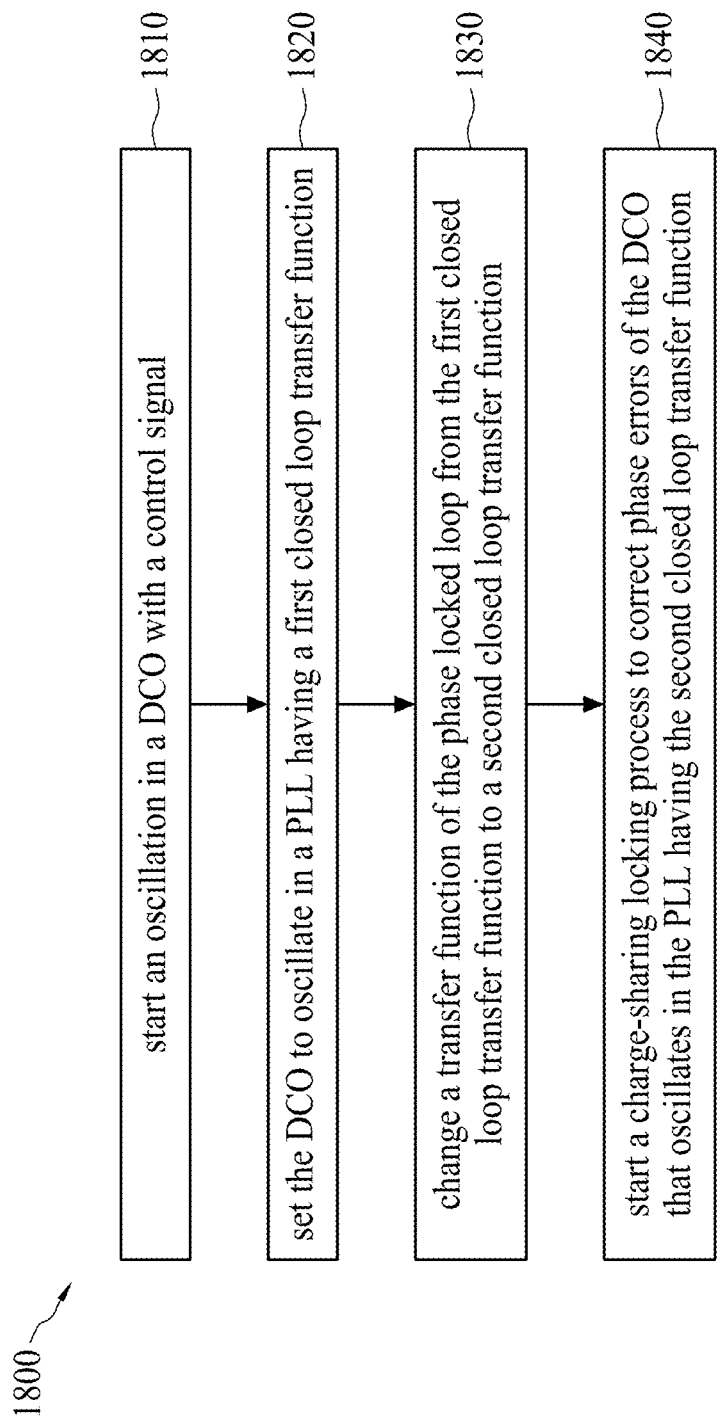
FIG. 18 is a flowchart of a method of operating a ring based DCO in a PLL, in accordance with some embodiments.

FIG. 18 is a flowchart of a method of operating a ring based DCO in a phase locked loop, in accordance with some embodiments. The sequence in which the operations of method 1800 are depicted in FIG. 18 is for illustration only; the operations of method 1800 are capable of being executed in sequences that differ from that depicted in FIG. 18. It is understood that additional operations may be performed before, during, and/or after the method 1800 depicted in FIG. 18, and that other processes may only be briefly described herein.

In operation 1810 of method 1800, a DCO is set to start the oscillation with a control signal. As shown in the example timing diagram of FIG. 11, a change of the logic level of the DCO resetting signal RSTN_DCO at time T1 causes the ring based DCO 900 of FIG. 10 to start oscillation in an open-loop mode. In the example embodiments as shown in FIGS. 12A-12B, the DCO resetting signal RSTN_DCO is applied to each of the switches 1212, 1214, 1222, and 1224 through an inverter to change the state of a DCO from a steady state to an oscillating state.

In operation 1820 of method 1800, the DCO is set to oscillate in a PLL having a first closed loop transfer function. As shown in the example timing diagram of FIG. 11, a change of the logic level of the PLL resetting signal RSTN_DIG at time T2 causes the ring based DCO 900 of FIG. 10 to start oscillation in a PLL with a type-II closed loop transfer function. The PLL has a type-II closed loop transfer function, because the adjustable digital filter 1050 of FIG. 10 is set as a proportional integration digital filter by the logic LOW of the charge-sharing signal CSL.

In operation 1830 of method 1800, the closed loop transfer function of the PLL is changed from the first closed loop transfer function to a second closed loop transfer function. As shown in the example timing diagram of FIG. 11, a change of the logic level of the charge-sharing signal CSL at time T3 causes the ring based DCO 900 of FIG. 10 to oscillate in a PLL having a type-I closed loop transfer function. The transfer function of the PLL in FIG. 10 is changed from a type-II closed loop transfer function to a type-I closed loop transfer function, because the adjustable digital filter 1050 of FIG. 10 is changed from a proportional integration digital filter to a proportional digital filter, as the logic level of the charge-sharing signal CSL is changed from the logic LOW to the logic HIGH.

In operation 1840 of method 1800, a charge-sharing locking process is started to correct phase errors of the DCO that oscillates in the PLL having the second closed loop transfer function. As shown in the example timing diagram of FIG. 11, the change of the logic level of the charge-sharing signal CSL at time T3 also starts the charge-sharing locking processes to correct phase errors of the DCO 900 in FIG. 10 by the charge-sharing circuit 980. In FIG. 11, when the charge-sharing signal CSL is changed from the logic LOW to the logic HIGH at time T3, the CSL clock signal FIN_CSL is generated (e.g., by gating the reference oscillation signal $f_{REF}$ with the charge-sharing signal CSL). The charge-sharing locking process by the charge-sharing circuit 980 is started by the CSL clock signal FIN_CSL, because the control signals (e.g., CK_DAC, CK_CSL_I, and CK_CSL_Q) for driving the charge-sharing circuit 980 are created from the CSL clock signal FIN_CSL, as shown in the example embodiments of FIG. 5A.

An aspect of the present disclosure relates to an integrated circuit device. The integrated circuit device includes a ring based digitally controlled oscillator (DCO), a first charge-sharing switch, a first charge-sharing capacitor, a first pre-charge switch, and a first digital to analog converter (DAC). The DCO has a first inverter and a second inverter. The first charge-sharing capacitor has a first terminal coupled to an input terminal of the first inverter through the first charge-sharing switch. The first DAC has an output terminal coupled to the first terminal of the first charge-sharing capacitor through the first pre-charge switch. The integrated circuit device also includes a second charge-sharing switch, a second charge-sharing capacitor, a second pre-charge switch, and a second DAC. The second charge-sharing capacitor has a first terminal coupled to an input terminal or an output terminal of the second inverter through the second charge-sharing switch. The second DAC has an output terminal coupled to the first terminal of the second charge-sharing capacitor through the second pre-charge switch.

Another aspect of the present disclosure relates to an integrated circuit device. The integrated circuit device includes a ring based digitally controlled oscillator (DCO), a first branch-one charge-sharing switch, a second branch-one charge-sharing switch, a branch-one charge-sharing capacitor, and a branch-one digital to analog converter (DAC). The DCO has a first inverter and a second inverter. The branch-one charge-sharing capacitor has a first terminal coupled to an input terminal of the first inverter through the first branch-one charge-sharing switch and coupled to an input terminal or an output terminal of the second inverter through the second branch-one charge-sharing switch. The branch-one DAC has an output terminal coupled to the first terminal of the branch-one charge-sharing capacitor through the branch-one pre-charge switch.

Another aspect of the present disclosure relates to a method. The method includes causing a digital controlled oscillator to oscillate in a phase locked loop having a first closed loop transfer function, changing the phase locked loop having the first closed loop transfer function to a phase locked loop having a second closed loop transfer function, and starting a charge-sharing locking process to correct phase errors in the digital controlled oscillator that oscillates in the phase locked loop having the second closed loop transfer function.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) device comprising:
   a ring based digitally controlled oscillator (DCO) having a first inverter and a second inverter;
   a first branch-one charge-sharing switch and a second branch-one charge-sharing switch;
   a branch-one charge-sharing capacitor having a first terminal coupled to an input terminal of the first inverter through the first branch-one charge-sharing switch and coupled to an input terminal or an output terminal of the second inverter through the second branch-one charge-sharing switch;
   a branch-one pre-charge switch; and
   a branch-one digital to analog converter (DAC) having an output terminal coupled to the first terminal of the branch-one charge-sharing capacitor through the branch-one pre-charge switch.

2. The IC device of claim 1, wherein the first terminal of the branch-one charge-sharing capacitor is coupled to the input terminal of the second inverter through the second branch-one charge-sharing switch.

3. The IC device of claim 2, wherein the first inverter has an output terminal that forms a circuit node with the input terminal of the second inverter.

4. The IC device of claim 2, wherein the ring based DCO further comprises a third inverter, and wherein the first inverter has an output terminal that is coupled to the input terminal of the second inverter through the third inverter.

5. The IC device of claim 1, wherein the first terminal of the branch-one charge-sharing capacitor is coupled to the output terminal of the second inverter through the second branch-one charge-sharing switch.

6. The IC device of claim 5, wherein:
   the first terminal of the branch-one charge-sharing capacitor is coupled to a first input terminal of the first inverter through the first branch-one charge-sharing switch; and
   the output terminal of the second inverter is coupled to a second input terminal of the first inverter and forms a circuit node with the second input terminal of the first inverter.

7. The IC device of claim 1, wherein the first inverter and the second inverter are non-differential inverters.

8. The IC device of claim 1, wherein the first inverter and the second inverter are differential inverters.

9. The IC device of claim 1, wherein the first inverter and the second inverter are pseudo differential inverters.

10. The IC device of claim 9, wherein the ring based DCO further comprises a third inverter, and wherein the first inverter has an output terminal that is coupled to the input terminal of the second inverter through the third inverter.

11. An integrated circuit (IC) device comprising:
    a ring based digitally controlled oscillator (DCO) having a first inverter and a second inverter;
    a first branch-one charge-sharing switch and a second branch-one charge-sharing switch; and
    a branch-one charge-sharing capacitor having a first terminal coupled to a first input terminal of the first inverter through the first branch-one charge-sharing switch and coupled to an output terminal of the first inverter through the second branch-one charge-sharing switch, and wherein the branch-one charge-sharing capacitor has a second terminal connected to a ground.

12. The IC device of claim 11, wherein an output terminal of the second inverter is coupled to a second input terminal of the first inverter and forms a circuit node with the second input terminal of the first inverter.

13. The IC device of claim 11, further comprising:
    a branch-one pre-charge switch; and
    a branch-one digital to analog converter (DAC) having an output terminal coupled to the first terminal of the branch-one charge-sharing capacitor through the branch-one pre-charge switch.

14. The IC device of claim 11, wherein the first inverter and the second inverter are non-differential inverters.

15. The IC device of claim 11, wherein the first inverter and the second inverter are differential inverters.

16. The IC device of claim 11, wherein the first inverter and the second inverter are pseudo differential inverters.

17. The IC device of claim 11, wherein the ring based DCO further comprises a third inverter, and wherein the output terminal of the first inverter is coupled to an input terminal of the second inverter through the third inverter.

18. An integrated circuit (IC) device comprising:
   a ring based digitally controlled oscillator (DCO) having a first inverter and a second inverter;
   a first branch-one charge-sharing switch and a second branch-one charge-sharing switch; and
   a branch-one charge-sharing capacitor having a first terminal coupled to a first input terminal of the first inverter through the first branch-one charge-sharing switch and coupled to an input terminal of the second inverter through the second branch-one charge-sharing switch, and wherein the branch-one charge-sharing capacitor has a second terminal connected to a ground.

19. The IC device of claim 18, wherein an output terminal of the second inverter is coupled to a second input terminal of the first inverter and forms a circuit node with the second input terminal of the first inverter.

20. The IC device of claim 18, further comprising:
   a branch-one pre-charge switch; and
   a branch-one digital to analog converter (DAC) having an output terminal coupled to the first terminal of the branch-one charge-sharing capacitor through the branch-one pre-charge switch.

* * * * *